United States Patent
Hodo et al.

(10) Patent No.: US 10,665,613 B2
(45) Date of Patent: May 26, 2020

(54) SEMICONDUCTOR DEVICE AND METHOD FOR MANUFACTURING THE SEMICONDUCTOR DEVICE

(71) Applicant: Semiconductor Energy Laboratory Co., Ltd., Atsugi-shi, Kanagawa-ken (JP)

(72) Inventors: Ryota Hodo, Kanagawa (JP); Motomu Kurata, Kanagawa (JP); Shinya Sasagawa, Kanagawa (JP); Satoru Okamoto, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/280,792

(22) Filed: Feb. 20, 2019

(65) Prior Publication Data

US 2019/0189643 A1    Jun. 20, 2019

Related U.S. Application Data

(62) Division of application No. 15/870,182, filed on Jan. 12, 2018, now abandoned, which is a division of
(Continued)

(30) Foreign Application Priority Data

Oct. 29, 2015  (JP) .................................. 2015-213152

(51) Int. Cl.
*H01L 23/532* (2006.01)
*H01L 27/12* (2006.01)
(Continued)

(52) U.S. Cl.
CPC .... *H01L 27/1225* (2013.01); *H01L 21/02565* (2013.01); *H01L 21/463* (2013.01);
(Continued)

(58) Field of Classification Search
CPC ..................... H01L 29/7869; H01L 23/53295
See application file for complete search history.

(56) References Cited

U.S. PATENT DOCUMENTS 5,528,032 A   6/1996  Uchiyama
5,731,856 A   3/1998  Kim et al.
(Continued)

FOREIGN PATENT DOCUMENTS

EP    1737044 A   12/2006
EP    2226847 A   9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
(Continued)

*Primary Examiner* — Thomas L Dickey
(74) *Attorney, Agent, or Firm* — Fish & Richardson P.C.

(57) ABSTRACT

First to third insulators are successively formed in this order over a first conductor over a semiconductor substrate; a hard mask with a first opening is formed thereover; a resist mask with a second opening is formed thereover; a third opening is formed in the third insulator; a fourth opening is formed in the second insulator; the resist mask is removed; a fifth opening is formed in the first to third insulators; a second conductor is formed to cover an inner wall and a bottom surface of the fifth opening; a third conductor is formed thereover; polishing treatment is performed so that the hard
(Continued)

mask is removed, and that levels of top surfaces of the second and third conductors and the third insulator are substantially equal to each other; and an oxide semiconductor is formed thereover. The second insulator is less permeable to hydrogen than the first and third insulators, the second conductor is less permeable to hydrogen than the third conductor.

8 Claims, 64 Drawing Sheets

Related U.S. Application Data application No. 15/332,006, filed on Oct. 24, 2016, now Pat. No. 9,922,994.

(51) Int. Cl.

| | |
|---|---|
| H01L 29/786 | (2006.01) |
| H01L 29/66 | (2006.01) |
| H01L 21/467 | (2006.01) |
| H01L 21/463 | (2006.01) |
| H01L 21/768 | (2006.01) |
| H01L 21/02 | (2006.01) |
| H01L 23/522 | (2006.01) |
| H01L 29/778 | (2006.01) |

(52) U.S. Cl.
CPC ...... *H01L 21/467* (2013.01); *H01L 21/76895* (2013.01); *H01L 23/5226* (2013.01); *H01L 23/53295* (2013.01); *H01L 27/1288* (2013.01); *H01L 29/66969* (2013.01); *H01L 29/7869* (2013.01); *H01L 29/78603* (2013.01); *H01L 29/78648* (2013.01); *H01L 29/78696* (2013.01); *H01L 23/53238* (2013.01); *H01L 29/7781* (2013.01); *H01L 29/7782* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,440,281 | B1 | 8/2002 | Sturmer et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,524,752 | B2 | 4/2009 | Tsutsue |
| 7,674,650 | B2 | 3/2010 | Akimoto et al. |
| 7,732,819 | B2 | 6/2010 | Akimoto et al. |
| 7,989,334 | B2 | 8/2011 | Tsutsue |
| 8,237,166 | B2 | 8/2012 | Kumomi et al. |
| 8,501,564 | B2 | 8/2013 | Suzawa et al. |
| 8,547,771 | B2 | 10/2013 | Koyama |
| 8,823,074 | B2 | 9/2014 | Suzawa et al. |
| 8,860,108 | B2 | 10/2014 | Yamazaki et al. |
| 8,995,174 | B2 | 3/2015 | Koyama |
| 9,048,265 | B2 | 6/2015 | Hondo et al. |
| 9,048,323 | B2 | 6/2015 | Yamazaki et al. |
| 9,059,219 | B2 | 6/2015 | Sasagawa et al. |
| 9,064,967 | B2 | 6/2015 | Suzawa et al. |
| 9,219,077 | B2 | 12/2015 | Yokoyama |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0206981 | A1 | 8/2008 | Tamura |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0025569 | A1* | 2/2010 | Matsumoto ....... H01L 27/14609 250/208.1 |
| 2010/0065844 | A1 | 3/2010 | Tokunaga |
| 2010/0092800 | A1 | 4/2010 | Itagaki et al. |

(56) References Cited

U.S. PATENT DOCUMENTS

| | | |
|---|---|---|
| 2010/0109002 A1 | 5/2010 | Itagaki et al. |
| 2011/0133177 A1 | 6/2011 | Suzawa et al. |
| 2011/0240990 A1 | 10/2011 | Yamazaki |
| 2012/0025191 A1 | 2/2012 | Yamazaki |
| 2012/0032163 A1 | 2/2012 | Yamazaki |
| 2012/0248544 A1 | 10/2012 | Yokoyama |
| 2013/0270563 A1* | 10/2013 | Yamazaki ......... H01L 29/78609 257/57 |
| 2013/0277676 A1 | 10/2013 | Yamazaki |
| 2013/0285050 A1 | 10/2013 | Yamazaki et al. |
| 2013/0320332 A1 | 12/2013 | Hondo et al. |
| 2014/0004656 A1 | 1/2014 | Sasagawa et al. |
| 2014/0326992 A1 | 11/2014 | Hondo et al. |
| 2015/0221754 A1 | 8/2015 | Hondo et al. |
| 2015/0270402 A1 | 9/2015 | Endo et al. |
| 2015/0280003 A1 | 10/2015 | Yamazaki et al. |
| 2015/0280013 A1 | 10/2015 | Yamazaki et al. |
| 2015/0348909 A1 | 12/2015 | Yamazaki et al. |
| 2015/0349127 A1 | 12/2015 | Kurata et al. |
| 2015/0372009 A1 | 12/2015 | Yamazaki |
| 2016/0111327 A1 | 4/2016 | Lee et al. |
| 2016/0218219 A1 | 7/2016 | Asami et al. |
| 2016/0233339 A1 | 8/2016 | Okazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-119674 A | 6/2011 |
| WO | WO-2004/114391 | 12/2004 |

OTHER PUBLICATIONS

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 13, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '03 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUs on Flexible and Glass Substrates for Secure RFID Systems", Journal of Solid-State Circuits, 2008, vol. 43, No. 1, pp. 292-299.

(56) References Cited

OTHER PUBLICATIONS

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, September 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID DIGEST '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites Fop Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and SC2O3—A2O3—BO SYSTEMS [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '03 : SID International Symposium Digest of Technical Papers, May 20, 2003, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, Vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW'08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

\* cited by examiner

| 6004 |
|---|
| 6003 |
| 6002 |
| 6001 |

FIG. 61B

| 6003 |
|---|
| 6002 |
| 6001 |

SEMICONDUCTOR DEVICE AND METHOD FOR MANUFACTURING THE SEMICONDUCTOR DEVICE

CROSS-REFERENCE TO RELATED APPLICATIONS

This application is a divisional of U.S. application Ser. No. 15/870,182, filed Jan. 12, 2018, now pending, which is a divisional of U.S. application Ser. No. 15/332,006, filed Oct. 24, 2016, now U.S. Pat. No. 9,922,994, which claims the benefit of a foreign priority application filed in Japan as Serial No. 2015-213152 on Oct. 29, 2015, all of which are incorporated by reference.

BACKGROUND OF THE INVENTION

1. Field of the Invention

The present invention relates to, for example, a transistor and a semiconductor device. The present invention relates to, for example, a method for manufacturing a transistor and a semiconductor device. The present invention relates to a display device, a light-emitting device, a lighting device, a power storage device, a memory device, a processor, or an electronic device, for example. The present invention relates to a method for manufacturing a display device, a liquid crystal display device, a light-emitting device, a memory device, or an electronic device. The present invention relates to a method for driving a display device, a liquid crystal display device, a light-emitting device, a storage device, or an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

In recent years, transistors using oxide semiconductors (typically, In—Ga—Zn oxide) have been actively developed and are used in integrate circuits, and the like. Oxide semiconductors have been researched since early times. In 1988, there was a disclosure of a crystal In—Ga—Zn oxide that can be used for a semiconductor element (see Patent Document 1). In 1995, a transistor including an oxide semiconductor was invented, and its electrical characteristics were disclosed (see Patent Document 2).

Much attention has been focused on a semiconductor device which uses a combination of a transistor in which silicon (Si) is used for a semiconductor layer and a transistor in which an oxide semiconductor is used for a semiconductor layer (see Patent Document 3).

REFERENCE

Patent Documents

[Patent Document 1] Japanese Published Patent Application No. S63-239117

[Patent Document 2] Japanese translation of PCT international application No. H11-505377

[Patent Document 3] Japanese Published Patent Application No. 2011-119674

SUMMARY OF THE INVENTION

An object is to provide a semiconductor device including a transistor with stable electrical characteristics. Another object is to provide a semiconductor device including a transistor with a low leakage current in an off state. Another object is to provide a semiconductor device including a transistor with normally-off electrical characteristics. Another object is to provide a semiconductor device including a highly reliable transistor.

Another object is to provide a module including any of the above semiconductor devices. Another object is to provide an electronic device including any of the above semiconductor devices or the module. Another object is to provide a novel semiconductor device. Another object is to provide a novel module. Another object is to provide a novel electronic device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a method for manufacturing a semiconductor device, including the steps of forming a first conductor over a semiconductor substrate; forming a first insulator over the first conductor; forming a second insulator that is less permeable to hydrogen than the first insulator, over the first insulator; forming a third insulator over the second insulator; forming a hard mask with a first opening over the third insulator; forming a resist mask with a second opening over the hard mask; etching the third insulator using the resist mask to form a third opening in the third insulator; etching the second insulator using the resist mask to form a fourth opening in the second insulator; removing the resist mask; etching the first to third insulators using the hard mask to form a fifth opening in the first to third insulators; forming a second conductor to cover an inner wall and a bottom surface of the fifth opening; forming a third conductor over the second conductor to fill the fifth opening; performing polishing treatment on the hard mask, the second conductor, and the third conductor so that the hard mask is removed, and that levels of top surfaces of the second conductor, the third conductor, and the third insulator are substantially equal to each other; and forming an oxide semiconductor over the second conductor and the third conductor. In the embodiment, the second insulator is in contact with the second conductor at an edge of the fifth opening, and the second conductor is less permeable to hydrogen than the third conductor.

(2) Another embodiment of the present invention is the method for manufacturing a semiconductor device described in (1) in which a maximum value of the width of the second opening is smaller than a minimum value of the width of the first opening.

(3) Another embodiment of the present invention is the method for manufacturing a semiconductor device described in (1) or (2) in which the second conductor includes tantalum and nitrogen.

(4) Another embodiment of the present invention is the method for manufacturing a semiconductor device described in any one of (1) to (3) in which the second insulator includes aluminum and oxygen.

(5) Another embodiment of the present invention is a semiconductor device including a semiconductor substrate, a first insulator over the semiconductor substrate, a second insulator over the first insulator, a third insulator over the second insulator, a plug embedded in the first to third insulators, and an oxide semiconductor over the third insulator. In the embodiment, a first transistor is formed in the semiconductor substrate, the first transistor is electrically connected to the plug, the plug includes a first conductor and a second conductor, the first conductor is in contact with the first to third insulators, the second conductor is in contact with the first conductor, a second transistor is provided to include the oxide semiconductor, the second insulator is less permeable to hydrogen than the first insulator, and the first conductor is less permeable to hydrogen than the second conductor.

(6) Another embodiment of the present invention is the semiconductor device described in (5) in which the first conductor includes tantalum and nitrogen.

(7) Another embodiment of the present invention is the semiconductor device described in (5) or (6) in which the second insulator includes aluminum and oxygen.

(8) Another embodiment of the present invention is the semiconductor device described in any one of (5) to (7) in which the oxide semiconductor includes indium, an element M, zinc, and oxygen; and the element M is Ti, Ga, Y, Zr, La, Ce, Nd, Sn, or Hf.

(9) Another embodiment of the present invention is the semiconductor device described in any one of (5) to (8) in which the semiconductor substrate includes silicon.

A semiconductor device including a transistor with stable electrical characteristics can be provided. A semiconductor device including a transistor with a low leakage current in an off state can be provided. A semiconductor device including a transistor with normally-off electrical characteristics can be provided. A semiconductor device including a highly reliable transistor can be provided.

A module including any of the above semiconductor devices can be provided. An electronic device including any of the above semiconductor devices or the module can be provided. A novel semiconductor device can be provided. A novel module can be provided. A novel electronic device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIGS. 61A and 61B are cross-sectional views illustrating sample structures in Example 2.

DETAILED DESCRIPTION OF THE INVENTION

Figure 1A:
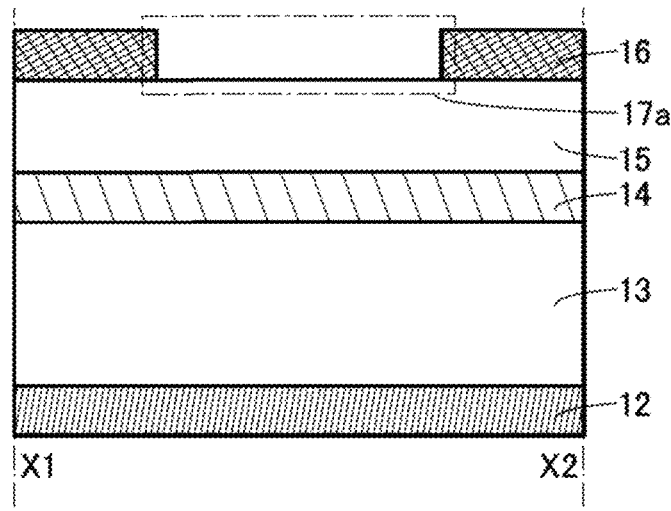
FIGS. 1A to 1D are cross-sectional views and top views illustrating a method for manufacturing a semiconductor device of one embodiment of the present invention.

Embodiments according to the present invention will be described in detail with reference to the accompanying drawings. Note that the present invention is not limited to the description below, and it is easily understood by those skilled in the art that modes and details of the present invention can be modified in various ways. In addition, the present invention should not be construed as being limited to the description in the embodiments given below. In describing structures of the invention with reference to the drawings, the same reference numerals are used in common for the same portions in different drawings. Note that the same hatch pattern is applied to similar parts, and the similar parts are not especially denoted by reference numerals in some cases.

A structure in one of the following embodiments can be appropriately applied to, combined with, or replaced with another structure in another embodiment, for example, and the resulting structure is also one embodiment of the present invention.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). Thus, a voltage can be referred to as a potential and vice versa. Note that in general, a potential (a voltage) is relative and is determined depending on the amount relative to a certain potential. Therefore, a potential which is represented as a "ground potential" or the like is not always 0 V. For example, the lowest potential in a circuit may be represented as a "ground potential". Alternatively, a substantially intermediate potential in a circuit may be represented as a "ground potential". In these cases, a positive potential and a negative potential are set using the potential as a reference.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor layer is silicon, examples of an impurity which changes the characteristics of the semiconductor include oxygen, Group 1 elements except hydrogen, Group 2 elements, Group 13 elements, and Group 15 elements.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of the transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a plan view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

Note that in this specification and the like, silicon oxynitride refers to a substance in which the proportion of oxygen is higher than that of nitrogen. The silicon oxynitride preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. Silicon nitride oxide refers to a substance in which the proportion of nitrogen is higher than that of oxygen. The silicon nitride oxide preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification, the term "parallel" indicates that the angle formed between two straight lines is greater than or equal to −10° and less than or equal to 100, and accordingly also includes the case where the angle is greater than or equal to −50 and less than or equal to 50. In addition, the term "substantially parallel" indicates that the angle formed between two straight lines is greater than or equal to −300 and less than or equal to 300. In addition, the term "perpendicular" indicates that an angle formed between two straight lines is 80° to 100°, and accordingly includes the case where the angle is 85° to 95°. In addition, the term "substantially perpendicular" indicates that the angle formed between two straight lines is greater than or equal to 600 and less than or equal to 1200.

In this specification, trigonal and rhombohedral crystal systems are included in a hexagonal crystal system.

Embodiment 1

In this embodiment, a semiconductor device and a method for manufacturing the semiconductor device of one embodiment of the present invention are described with reference to FIGS. 1A to 1D, FIGS. 2A to 2D, FIGS. 3A to 3D, FIGS. 4A to 4D, FIGS. 5A to 5C, FIGS. 6A to 6C, FIGS. 7A to 7C, FIGS. 8A and 8B, FIGS. 9A to 9D, FIGS. 10A to 10D, FIGS. 11A and 11B, FIGS. 12A and 12B, FIGS. 13A to 13D, FIGS. 14A to 14C, FIGS. 15A to 15D, FIG. 16, FIG. 17, FIG. 18, FIGS. 19A and 19B, FIGS. 20A and 20B, FIGS. 21A and 21B, FIGS. 22A and 22B, FIGS. 23A and 23B, FIGS. 24A to 24F, and 25A to 25F.

<Method for Forming Wiring and Plug>

A method for forming a wiring and a plug as components of a semiconductor device of one embodiment of the present invention is described below with reference to cross-sectional views and top views illustrated in FIGS. 1A to 1D, FIGS. 2A to 2D, FIGS. 3A to 3D, and FIGS. 4A to 4D. FIGS. 1A to 1D, FIGS. 2A to 2D, FIGS. 3A to 3D, and FIGS. 4A to 4D are cross-sectional views each taken along dashed dotted line X1-X2 and top views.

FIGS. 1A to 1D, FIGS. 2A to 2D, FIGS. 3A to 3D, and FIGS. 4A to 4D show a process for connecting a conductor 12 (also referred to as a conductive film or a wiring in some cases) and conductors 20a and 21a which are embedded in an opening 17f formed in insulators 13a, 14b, and 15c. Here, an upper part and a lower part of the opening 17f have different shapes: the lower part of the opening 17f (also referred to as an opening 17fa) functions as a via hole or a contact hole, and the upper part of the opening 17f (also referred to as an opening 17fb) functions as a groove in which a wiring pattern or the like is embedded. Thus, part of the conductor 20a and part of the conductor 21a which are embedded in the opening 17fa function as a plug, and part of the conductor 20a and part of the conductor 21a which are embedded in the opening 17fb function as a wiring or the like.

First, the conductor 12 is formed over a substrate. The conductor 12 may have either a single-layer structure or a stacked-layer structure. Note that the substrate is not illustrated in FIGS. 1A to 1D, FIGS. 2A to 2D, FIGS. 3A to 3D, and FIGS. 4A to 4D. Another conductor, insulator, semiconductor, or the like may be provided between the substrate and the conductor 12.

The conductor 12 can be formed by a method similar to those for forming a hard mask 16, a conductor 20, a conductor 21, and the like which are described later.

Next, an insulator 13 is formed over the conductor 12. The insulator 13 may have either a single-layer structure or a stacked structure. The insulator 13 can be formed by a sputtering method, a chemical vapor deposition (CVD) method, a molecular beam epitaxy (MBE) method, a pulsed laser deposition (PLD) method, an atomic layer deposition (ALD) method, or the like.

A CVD method can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

Then, an insulator 14 is formed over the insulator 13. The insulator 14 may have either a single-layer structure or a stacked structure. The insulator 14 can be formed by a sputtering method, a CVD method, an MBE method, a PLD method, an ALD method, or the like.

It is preferable that the insulator 14 be formed using a material which is less permeable to hydrogen and water than the insulator 13. The insulator 14 can be formed using, for example, aluminum oxide, aluminum oxynitride, gallium oxide, gallium oxynitride, yttrium oxide, yttrium oxynitride, hafnium oxide, or hafnium oxynitride. The use of such a material enables the insulator 14 to function as an insulating film that exhibits an effect of blocking diffusion of hydrogen and water.

Then, an insulator 15 is formed over the insulator 14. The insulator 15 may have either a single-layer structure or a stacked structure. The insulator 15 can be deposited by a sputtering method, a CVD method, an MBE method, a PLD method, an ALD method, or the like.

Next, a material of the hard mask 16 is deposited over the insulator 15. Here, the material of the hard mask 16 may be a conductor such as a metal material, or an insulator. In addition, the material of the hard mask 16 may be either a single layer or a stack of an insulator and a conductor. Note that in this specification and the like, a hard mask refers to a mask formed using a material (a metal material or an insulating material) other than a resist. The material of the hard mask 16 can be deposited by a sputtering method, a CVD method, an MBE method, a PLD method, an ALD method, or the like.

Figure 1B:
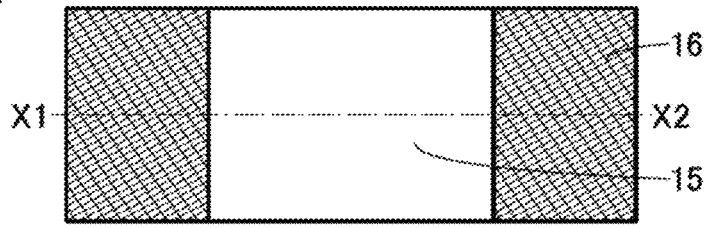

Next, the material of the hard mask 16 is etched using a resist mask formed by lithography or the like, whereby the hard mask 16 with an opening 17a is formed (see FIGS. 1A and 1B). Here, FIG. 1A corresponds to a cross section taken along dashed dotted line X1-X2 shown in FIG. 1B. In the same manner, each cross-sectional view shown in the following description corresponds to a cross section taken along dashed dotted line X1-X2 shown in the corresponding top view.

The opening 17a corresponds to the opening 17fb to be formed in a later step, i.e., a groove in which a wiring pattern is embedded. Therefore, the top-view shape of the opening 17a corresponds to the wiring pattern.

For details of lithography, description of a resist mask 18a to be shown later can be referred to. In addition, dry etching is preferably employed for the etching for forming the hard mask 16. For the dry etching process, description of the insulator 15 or the like can be referred to.

Figure 1C:
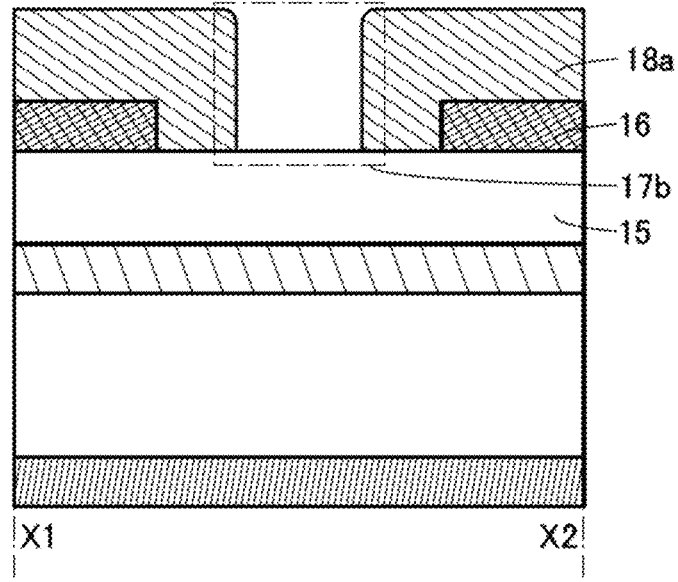
Figure 1D:
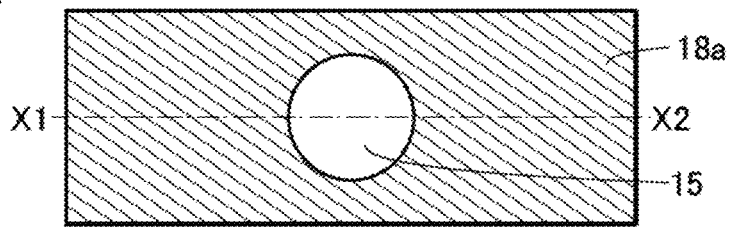

Next, the resist mask 18a with an opening 17b is formed over the insulator 15 and the hard mask 16 (see FIGS. 1C and 1D). Here, it is preferable that the resist mask 18a cover the hard mask 16. Note that the case where a resist is simply formed also includes the case where an organic coating film or the like is formed below the resist.

Here, the opening 17b corresponds to the opening 17fa to be formed in a later step, i.e., a via hole or a contact hole. Therefore, the top-view shape of the opening 17b corresponds to that of the via hole or the contact hole. In addition, it is preferable that the opening 17b corresponding to the via hole or the contact hole be formed in the opening 17a that correspond to the groove in which the wiring pattern is embedded. In that case, a maximum value of the width of the opening 17b is less than or equal to a minimum value of the width of the opening 17a. For example, the width of the opening 17b in the direction of X1-X2 shown in FIGS. 1C and 1D is less than or equal to the width of the opening 17a in the direction of X1-X2 shown in FIGS. 1A and 1B. In that case, the via hole or the contact hole can be formed with a margin with respect to the groove for the wiring pattern.

Note that the top-view shape of the opening 17b is, but not limited to, circular; the top-view shape can alternatively be, for example, elliptic or polygonal, e.g., a triangle or a quadrangle. In the case where a polygonal shape is employed, corners thereof may be rounded.

Note that in lithography, first, a resist is exposed to light through a photomask. Next, a region exposed to light is removed or left using a developing solution, so that a resist mask is formed. Then, etching through the resist mask is conducted. As a result, the conductor, the semiconductor, the insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. Note that dry etching treatment such as ashing or wet etching treatment can be used for removal of the resist mask. Alternatively, wet etching treatment is performed in addition to dry etching treatment. Further alternatively, dry etching treatment is performed in addition to wet etching treatment.

Figure 2A:
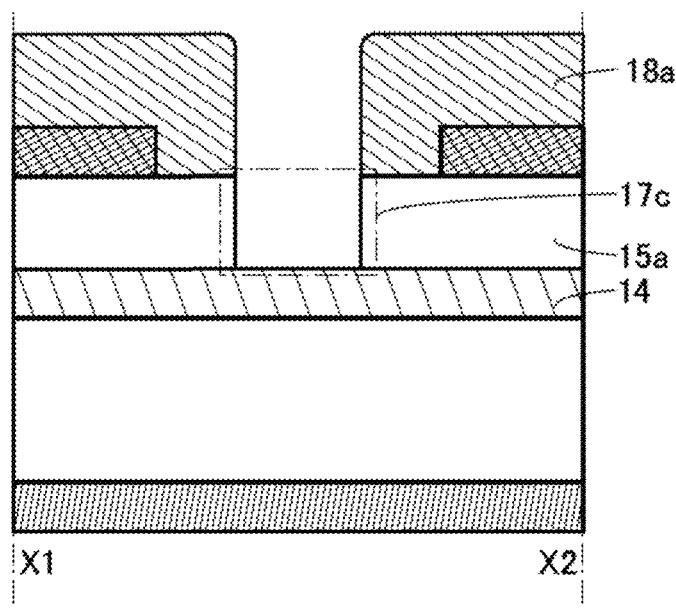
FIGS. 2A to 2D are cross-sectional views and top views illustrating the method for manufacturing a semiconductor device of one embodiment of the present invention.
Figure 2B:
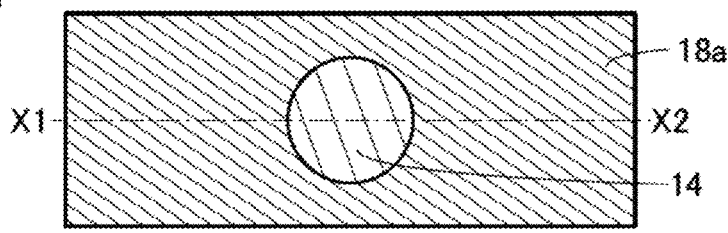

Next, the insulator 15 is etched using the resist mask 18a to form an insulator 15a with an opening 17c (see FIGS. 2A and 2B). Here, the etching is performed until a top surface of the insulator 14 is exposed in the opening 17c. Note that dry etching is preferably employed for the etching.

As a dry etching apparatus, a capacitively coupled plasma (CCP) etching apparatus including parallel-plate electrodes can be used. The capacitively coupled plasma etching apparatus including the parallel-plate electrodes may have a structure in which a high-frequency power source is applied to one of the parallel-plate electrodes. Alternatively, the capacitively coupled plasma etching apparatus may have a structure in which different high-frequency power sources are applied to one of the parallel-plate electrodes. Alternatively, the capacitively coupled plasma etching apparatus may have a structure in which high-frequency power sources with the same frequency are applied to the parallel-plate electrodes. Alternatively, the capacitively coupled plasma etching apparatus may have a structure in which high-frequency power sources with different frequencies are applied to the parallel-plate electrodes. Alternatively, a dry etching apparatus including a high-density plasma source can be used. As the dry etching apparatus including a high-density plasma source, an inductively coupled plasma (ICP) etching apparatus can be used, for example.

Figure 2C:
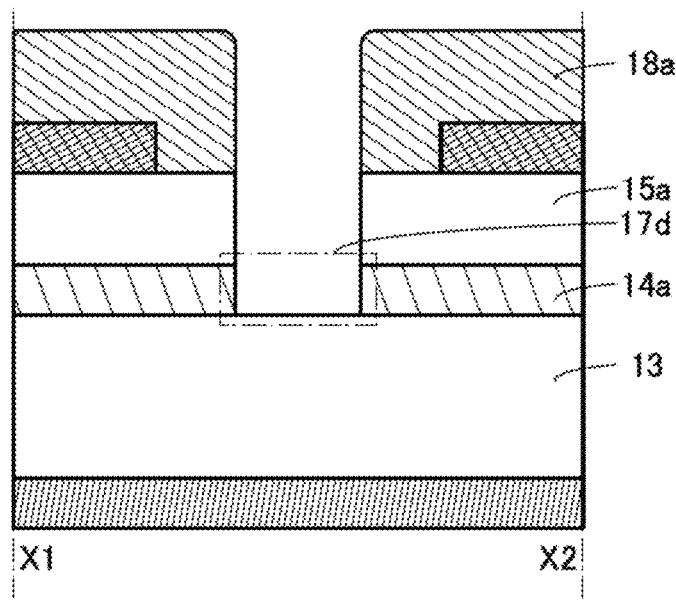
Figure 2D:
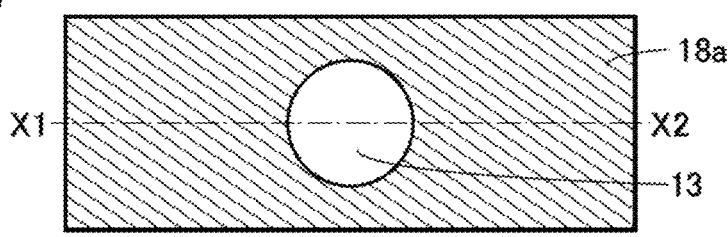

Next, the insulator 14 is etched using the resist mask 18a to form an insulator 14a with an opening 17d (see FIGS. 2C and 2D). Here, the etching is performed until the surface of the insulator 13 is exposed in the opening 17d. Note that dry etching is preferably employed for the etching. As a dry etching apparatus, an apparatus similar to that described above can be used.

Figure 5A:
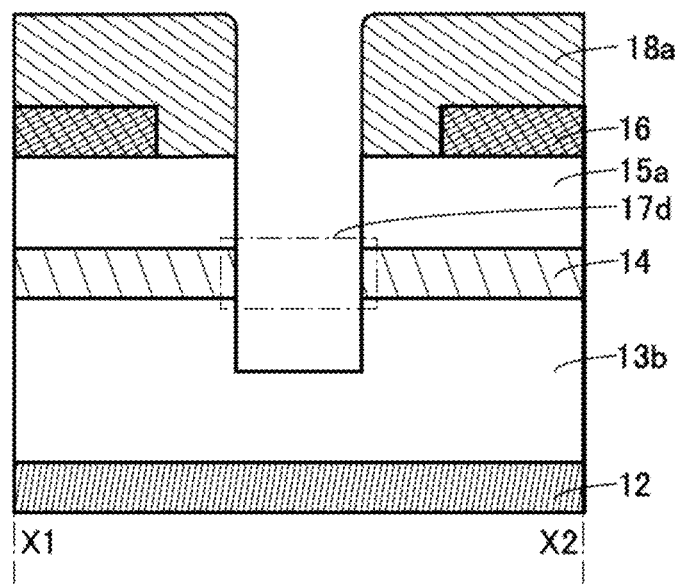
FIGS. 5A to 5C are cross-sectional views and a top view illustrating the method for manufacturing a semiconductor device of one embodiment of the present invention.

It is not necessary to stop the etching at the top surface of the insulator 13 when the opening 17d is formed. For example, after the opening 17d is formed, part of the insulator 13 may be etched to form an insulator 13b in which a recessed portion is formed in a region under the opening 17d, as illustrated in FIG. 5A.

Figure 3A:
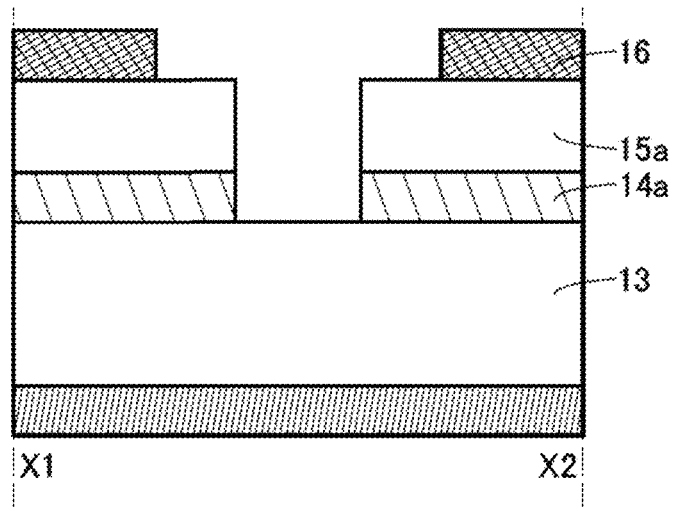
FIGS. 3A to 3D are cross-sectional views and top views illustrating the method for manufacturing a semiconductor device of one embodiment of the present invention.
Figure 3B:
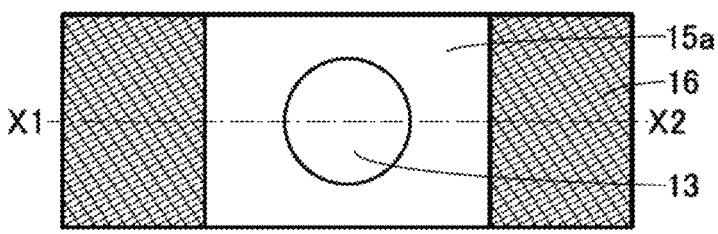

Next, the resist mask 18a is removed (see FIGS. 3A and 3B). In the case where an organic coating film is formed under the resist mask 18a, it is preferably removed together with the resist mask 18a. Dry etching treatment such as ashing or wet etching treatment can be used for removal of the resist mask 18a. Alternatively, wet etching treatment is performed in addition to dry etching treatment. Further alternatively, dry etching treatment can be performed in addition to wet etching treatment.

Figure 5B:
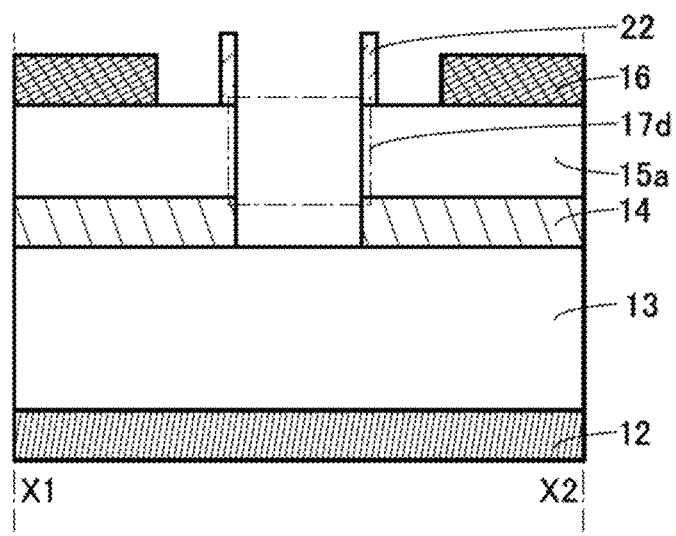
Figure 5C:
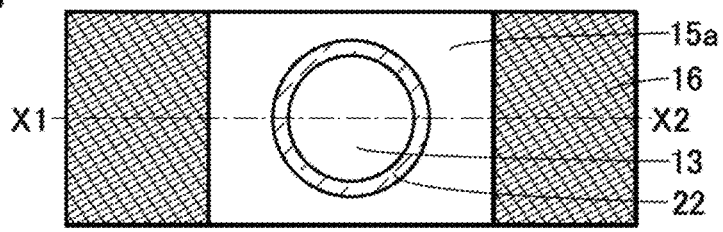

After the resist mask 18a is removed, a by-product 22 might be formed so as to surround the edge of a top portion of the opening 17c (see FIGS. 5B and 5C). The by-product 22 contains a component which is contained in the insulator 14, the insulator 15, or the resist mask 18a; or a component which is contained in an etching gas for the insulator 14 or the insulator 15. The by-product 22 can be removed in the next step for forming an opening 17e.

Figure 3C:
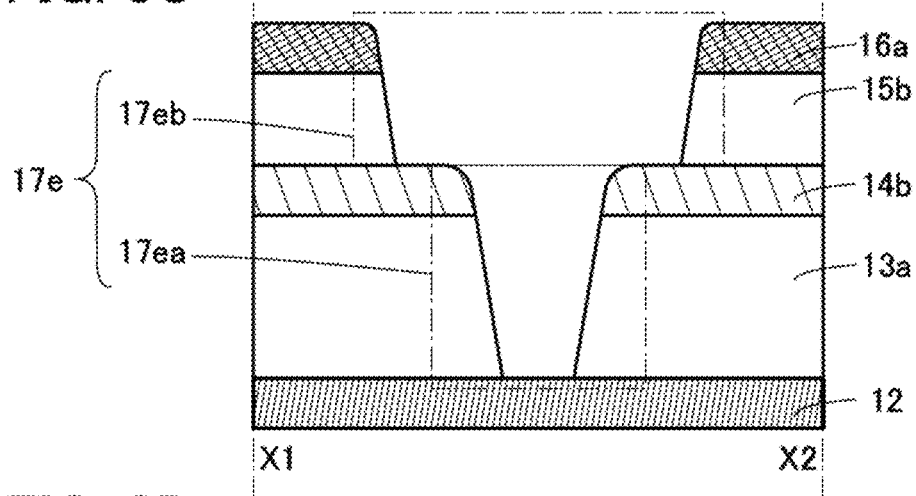
Figure 3D:
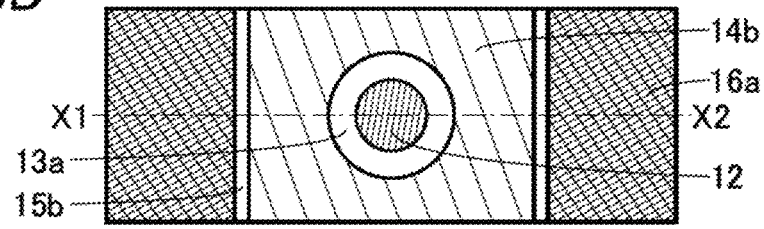

Next, the insulator 13, the insulator 14a, and the insulator 15a are etched using the hard mask 16 to form the insulator 13a, the insulator 14b, and an insulator 15b, in which the opening 17e is formed (see FIGS. 3C and 3D). Here, the etching is performed until the top surface of the conductor 12 is exposed in the opening 17e. The edge of the opening 17a of the hard mask 16 is also etched in some cases, whereby a hard mask 16a may be formed. The edge of the opening 17a of the hard mask 16a has a tapered shape, and an upper part of the edge of the opening 17a is rounded. Note that dry etching is preferably employed for the etching. As a dry etching apparatus, an apparatus similar to that described above can be used.

Here, the opening 17e can be regarded as being composed of an opening 17ea which is located in a lower part and formed using the insulator 14a as a mask, and an opening 17eb which is located in an upper part and formed using the hard mask 16 as a mask. The opening 17ea functions as a via hole or a contact hole in a later step, and the opening 17eb functions as a groove in which a wiring pattern or the like is embedded in a later step.

The edge (also referred to as the inner wall) of the opening 17eb in the insulator 15b preferably has a tapered shape. Note that the tapered portion of the insulator 15b may be seen from above, as illustrated in FIG. 3D.

The edge (also referred to as the inner wall) of the opening 17ea in the insulators 13a and 14b preferably has a tapered shape. Note that the upper part of the edge of the opening 17ea, which is provided in the insulator 14b, is preferably rounded. Owing to such a shape of the opening 17ea, the conductor 20 having a high blocking property against hydrogen can be formed with good coverage in a later step. Note that the tapered portion of the insulator 13a may be seen from above, as illustrated in FIG. 3D.

To perform the dry etching so that the opening 17ea has such a shape, it is preferable that the etching rate of the insulator 13 not be extremely higher than the etching rate of the insulator 14a. For example, the etching rate of the insulator 13 is set to less than or equal to eight times, preferably less than or equal to six times, further preferably less than or equal to four times the etching rate of the insulator 14a.

Dry etching under the above-described conditions can shape the edge of the opening 17ea into a tapered shape. In addition, even in the case where the by-product 22 is formed as illustrated in FIGS. 5B and 5C, the by-product 22 can be removed, and the upper part of the edge of the opening 17ea of the insulator 14b can be rounded.

Note that the shape of the opening 17e is not limited to the above-described shape. For example, the inner walls of the openings 17ea and 17eb can be substantially perpendicular to the conductor 12 and the insulator 14b. Alternatively, the opening 17eb may be formed in the insulators 15b and 14b; further alternatively, the opening 17eb may be formed in the insulators 15b, 14b, and 13a.

Figure 4A:
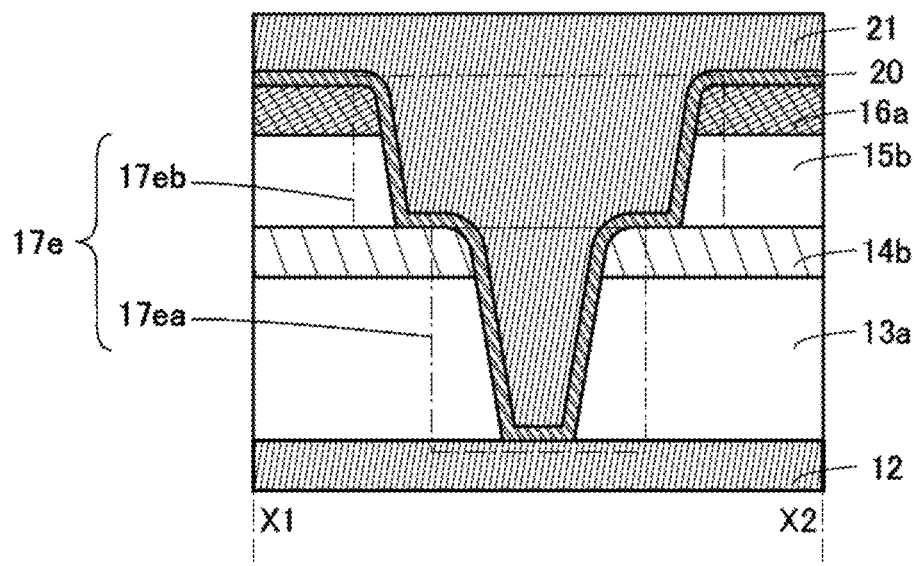
FIGS. 4A to 4D are cross-sectional views and top views illustrating the method for manufacturing a semiconductor device of one embodiment of the present invention.
Figure 4B:
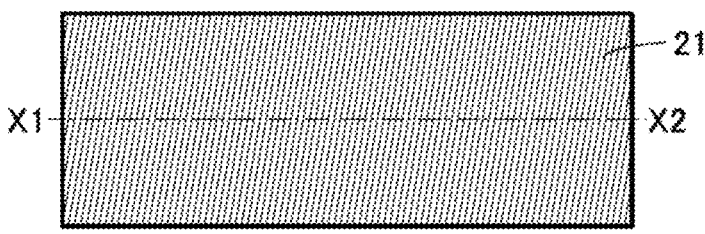

Next, the conductor 20 is formed in the opening 17e, and the conductor 21 is formed over the conductor 20 so as to be embedded in the opening 17e (see FIGS. 4A and 4B). Here, it is preferable that the conductor 20 be formed with good coverage so as to cover the inner wall and bottom surface of the opening 17e. In particular, it is preferable that the conductor 20 be in contact with the insulator 14b at the edge of the opening 17e; and it is further preferable that the opening formed in the insulators 13a and 14b be covered with the conductor 20 so that the conductor 20 is provided along the inner wall of the opening. When the edge of the opening 17ea in the insulators 13a and 14b has a tapered shape, and the upper part of the edge of the opening 17ea of the insulator 14b is rounded in the above manner, the coverage with the conductor 20 can be further improved.

The conductor 20 is preferably formed using a conductor which is less permeable to hydrogen than the conductor 21. For the conductor 20, a metal nitride such as tantalum nitride or titanium nitride is used, and tantalum nitride is particularly preferably used. Such a conductor 20 can prevent diffusion of impurities such as hydrogen and water into the conductor 21. In addition, effects, e.g., preventing diffusion of metal components contained in the conductor 21, preventing oxidation of the conductor 21, and improving adhesion of the conductor 21 with the opening 17e, can be obtained. Furthermore, in the case where the conductor 20 is formed using stacked layers, for example, titanium, tantalum, titanium nitride, tantalum nitride, or the like may be used. Moreover, in the case where tantalum nitride is deposited as the conductor 20, heat treatment may be performed using a rapid thermal anneal (RTA) apparatus after the deposition.

The conductor 20 can be formed by a sputtering method, a CVD method, an MBE method, a PLD method, an ALD method, or the like. Here, it is preferable that the formation of the conductor 20 be performed by a method providing good coverage, e.g., a collimated sputtering method, an MCVD method, or an ALD method.

Here, a collimated sputtering method enables highly directive film formation because a collimator is provided between a target and a substrate. Sputtered particles having vertical components for the substrate pass through the collimator to reach the substrate. Therefore, the sputtered particles are likely to reach the bottom surface of the opening 17ea that has a high aspect ratio, whereby a film is sufficiently deposited over the bottom surface of the opening 17ea. In addition, since the inner walls of the openings 17ea and 17eb have a tapered shape in the above manner, the film can also be sufficiently deposited on the inner walls of the openings 17ea and 17eb.

When the conductor 20 is formed by an ALD method, the conductor 20 can have good coverage, and formation of a pin hole and the like in the conductor 20 can be prevented. Forming the conductor 20 in the above manner can further prevent impurities such as hydrogen and water from passing through the conductor 20 and diffusing into the conductor 21. In the case where tantalum nitride is deposited as the conductor 20 by an ALD method, for example, pentakis(dimethylamino)tantalum (structural formula: Ta[N(CH$_3$)$_2$]$_5$) can be used as a precursor.

The conductor 21 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. The conductor 21 can be formed by a sputtering method, a CVD method, an MBE method, a PLD method, an ALD method, or the like. Since the conductor 21 is formed so as to be embedded in the opening 17e, a CVD method (an MCVD method, in particular) is preferably used.

Figure 4C:
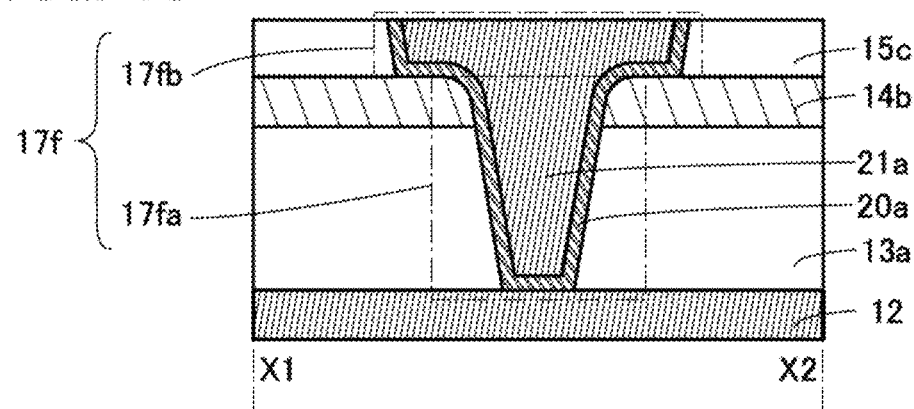
Figure 4D:
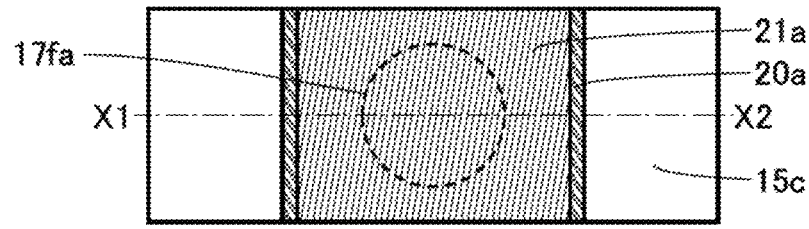

Next, polishing treatment is performed on the conductor 21, the conductor 20, the hard mask 16a, and the insulator 15b to form the conductor 20a and the conductor 21a which are embedded in the opening 17f (see FIGS. 4C and 4D). As the polishing treatment, mechanical polishing, chemical polishing, chemical mechanical polishing (CMP) or the like may be employed. For example, CMP treatment removes the upper part of the insulator 15b, the upper part of the conductor 21, the upper part of the conductor 20, and the hard mask 16a, whereby the insulator 15c, the conductor 21a, and the conductor 20a which have flat top surfaces can be formed.

Here, the opening 17f can be regarded as being composed of the opening 17fa which is located in the lower part and functions as a via hole or a contact hole, and the opening 17fb which is located in the upper part and functions as a groove in which the wiring pattern or the like is embedded. The opening 17fa is formed in the insulator 13a and the insulator 14b, and the opening 17fb is formed in the insulator 15c. Part of the conductor 20a and part of the conductor 21a which are embedded in the opening 17fa function as a plug, and part of the conductor 20a and part of the conductor 21a which are embedded in the opening 17fb function as a wiring and the like.

The conductor 20a is preferably in contact with the insulator 14b at the edge of the opening 17fa. It is further preferable that the conductor 20a be in contact with the insulator 14b at the rounded portion of the upper part of the opening 17fa and be in contact with the insulator 13a and the insulator 14b at the tapered portion of the edge of the opening 17fa. In addition, it is preferable that the conductor 20a be in contact with the inner wall of the opening 17fa of the insulator 13a and the inner wall of the opening 17fb of the insulator 15c.

As described in this embodiment, the conductor 20 is formed after the opening 17e that is composed of the opening 17ea functioning as a via hole or a contact hole and the opening 17eb functioning as a groove in which the wiring patter and the like is embedded, in which case the part of the conductor 20a functioning as a wiring and the part of the conductor 20a functioning as a plug are integrated. In that case, for example, the conductor 20a is continuously formed in the vicinity of the boundary between the opening 17ea and the opening 17eb, which can improve the blocking function against hydrogen and water. In the case where the wiring and the plug are each formed by a single damascene process, formation of a conductor and polishing treatment such as CMP treatment each need to be performed once in order to form each of the plug and the wiring. In contrast, by the method described in this embodiment, formation of a conductor and polishing treatment are each performed once, whereby the wiring and the plug can be formed collectively; as a result, the number of steps can be reduced.

Here, in the semiconductor device described in this embodiment, an oxide semiconductor is provided over a semiconductor substrate, and the above-described stacked insulators and the conductors that are embedded in the opening formed in the insulators and function as a wiring and a plug are provided between the semiconductor substrate and the oxide semiconductor. In the semiconductor device described in this embodiment, a transistor is formed using the oxide semiconductor, and an element layer including the transistor is formed over an element layer including the semiconductor substrate. A transistor may be formed in the element layer including the semiconductor substrate. In addition, an element layer including a capacitor and the like may be provided as appropriate. For example, an element layer including a capacitor may be provided over the element layer including the oxide semiconductor or between the element layer including the semiconductor substrate and the element layer including the oxide semiconductor.

In the semiconductor device with such a structure, the conductor 20a is preferably in contact with the insulator 14b at the edge of the opening 17fa formed in the insulator 14b, as illustrated in FIGS. 4C and 4D. In other words, the opening 17fa formed in the insulator 14b is preferably sealed up with the conductor 20a.

Here, since the insulator 14b has a function of blocking diffusion of hydrogen and water, impurities such as hydrogen and water can be prevented from diffusing from the insulator 13a into the element layer including the oxide semiconductor, through the insulator 14b. The conductor 20a has a function of blocking diffusion of hydrogen and water and is provided so as to fill the opening 17f of the insulator 14b. This can prevent impurities such as hydrogen and water from diffusing into the element layer including the oxide semiconductor through the conductor 21a in the opening 17f in the insulator 14b.

Separating the semiconductor substrate from the oxide semiconductor by the insulator 14b and the conductor 20a in this manner can prevent impurities such as hydrogen and water included in the element layer including the semiconductor substrate and the like from diffusing into the upper layers through the plug (conductor 21) or the via hole (opening 17fa) formed in the insulator 14b. In particular, in the case where a silicon substrate is used as the semiconductor substrate, hydrogen is used to terminate dangling bonds of the silicon substrate; therefore, the amount of hydrogen included in the element layer including the semiconductor substrate is large and the hydrogen might diffuse into the element layer including the oxide semiconductor. However, the structure described in this embodiment can prevent diffusion of hydrogen into the element layer including the oxide semiconductor.

The oxide semiconductor is preferably a highly purified intrinsic or substantially highly purified intrinsic oxide semiconductor whose carrier density has been reduced by reducing impurities such as hydrogen and water in the oxide semiconductor, details of which are described later. Using the oxide semiconductor to form a transistor can stabilize the electrical characteristics of the transistor. In addition, using the highly purified intrinsic or substantially highly purified intrinsic oxide semiconductor can reduce leakage current of the transistor in an off state. Furthermore, using the highly purified intrinsic or substantially highly purified intrinsic oxide semiconductor can improve the reliability of the transistor.

Note that the shapes of the wiring and plug of this embodiment are not limited to those illustrated in FIGS. 4C and 4D. The wiring and plug which have different shapes from those illustrated in FIGS. 4C and 4D are described below.

Figure 6A:
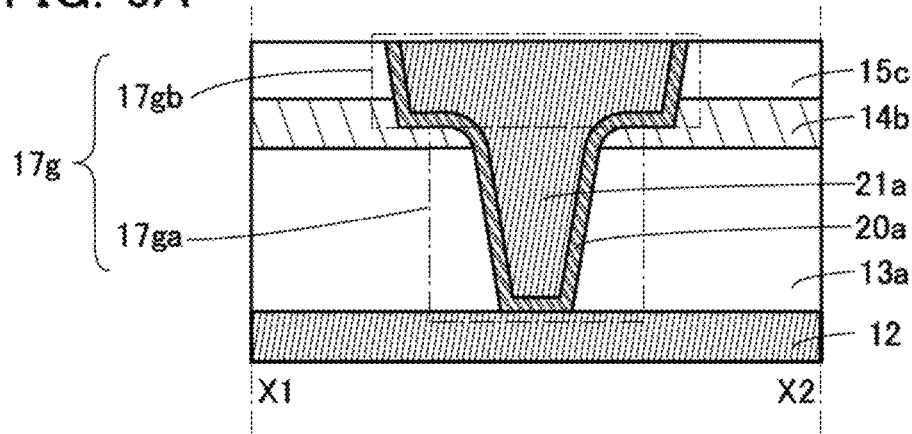
FIGS. 6A to 6C are cross-sectional views illustrating the method for manufacturing a semiconductor device of an embodiment of the present invention.

As for the difference in the shapes of the wiring and plug, an opening 17g illustrated in FIG. 6A has a different shape from the opening 17f illustrated in FIG. 4C. The opening 17g can be regarded as being composed of an opening 17ga which is located in the lower part and functions as a via hole or a contact hole, and an opening 17gb which is located in the upper part and functions as a groove in which a wiring pattern or the like is embedded. The opening 17ga is formed in the insulator 13a and in the lower part of the insulator 14b, and the opening 17gb is formed in the insulator 15c and in the upper part of the insulator 14b. Accordingly, in the structure illustrated in FIG. 6A, part of the conductor 20a and part of the conductor 21a which function as a wiring and the like are provided so as to be embedded in the upper part of the insulator 14b. Here, the inner wall of the opening formed in the insulator 14b has a step-wise shape formed by the inner wall of the opening 17ga and the inner wall of the opening 17gb.

Figure 6B:
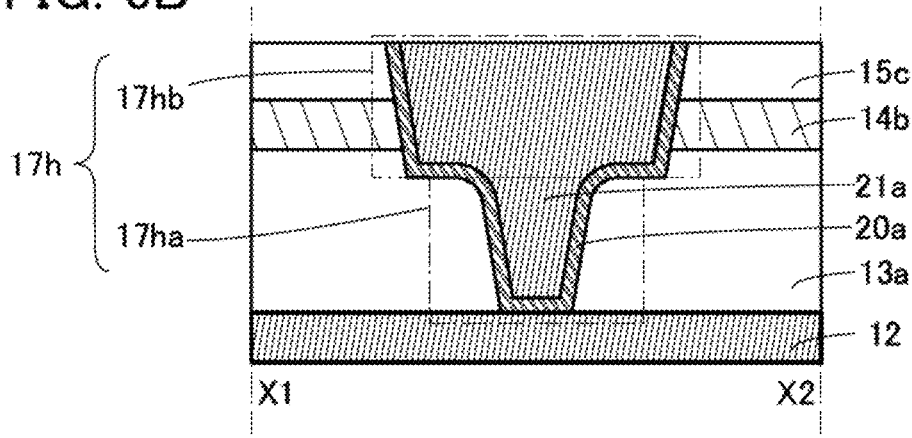

As for the difference in the shapes of the wiring and plug, an opening 17h illustrated in FIG. 6B has a different shape from the opening 17f illustrated in FIG. 4C. The opening 17h can be regarded as being composed of an opening 17ha which is located in the lower part and functions as a via hole or a contact hole, and an opening 17hb which is located in the upper part and functions as a groove in which a wiring pattern or the like is embedded. The opening 17ha is formed in the lower part of the insulator 13a, and the opening 17hb is formed in the insulator 15c and the insulator 14b and in the upper part of the insulator 13a. Accordingly, in the structure illustrated in FIG. 6B, part of the conductor 20a and part of the conductor 21a which function as a wiring and the like are provided so as to be embedded in the upper part of the insulator 13a. Here, the inner wall of the opening formed in the insulator 13a has a step-wise shape formed by the inner wall of the opening 17ha and the inner wall of the opening 17hb.

Figure 6C:
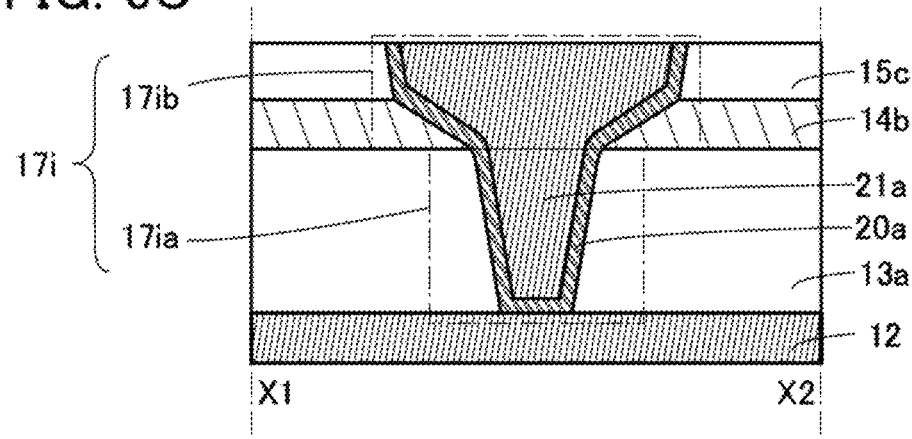

As for the difference in the shapes of the wiring and plug, an opening 17i illustrated in FIG. 6C has a different shape from the opening 17f illustrated in FIG. 4C. The opening 17i can be regarded as being composed of an opening 17ia which is located in the lower part and functions as a via hole or a contact hole, and an opening 17ib which is located in the upper part and functions as a groove in which a wiring pattern or the like is embedded. The opening 17ia is formed in the insulator 13a, and the opening 17ib is formed in the insulator 15c and the insulator 14b. Accordingly, in the structure illustrated in FIG. 6C, part of the conductor 20a and part of the conductor 21a which function as a wiring and the like are provided so as to be embedded in the insulator 14b. Here, the inner wall of the opening of the insulator 14b has a gently tapered shape.

Figure 7A:
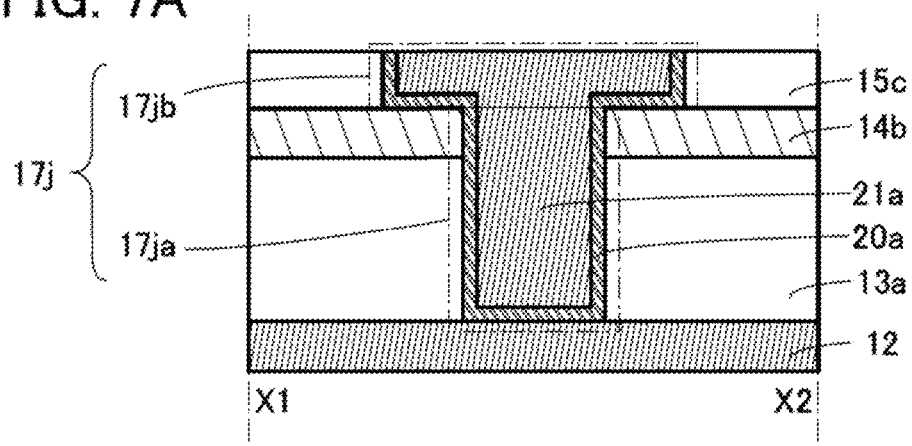
FIGS. 7A to 7C are cross-sectional views and a top view illustrating the method for manufacturing a semiconductor device of one embodiment of the present invention.

As for the difference in the shapes of the wiring and plug, an opening 17j illustrated in FIG. 7A has a different shape from the opening 17f illustrated in FIG. 4C. The opening 17j can be regarded as being composed of an opening 17ja which is located in the lower part and functions as a via hole or a contact hole, and an opening 17jb which is located in the upper part and functions as a groove in which a wiring pattern or the like is embedded. The opening 17ja is formed in the insulator 13a and the insulator 14b, and the opening 17jb is formed in the insulator 15c. Accordingly, in the structure illustrated in FIG. 7A, part of the conductor 20a and part of the conductor 21a which function as a wiring and the like are provided so as to be embedded in the insulator 15c. Here, the inner wall of the opening 17ja provided in the insulator 13a and the insulator 14b is substantially perpendicular to the conductor 12. The inner wall of the opening 17jb provided in the insulator 15c is substantially perpendicular to the insulator 14b. In the case where the inner wall of the opening is substantially perpendicular to the conductor 12 or the insulator 14b in such a manner, the conductor 20a is preferably formed by an ALD method or the like so that the conductor 20a with a sufficiently large thickness is also formed on the inner wall of the opening.

Figure 7B:
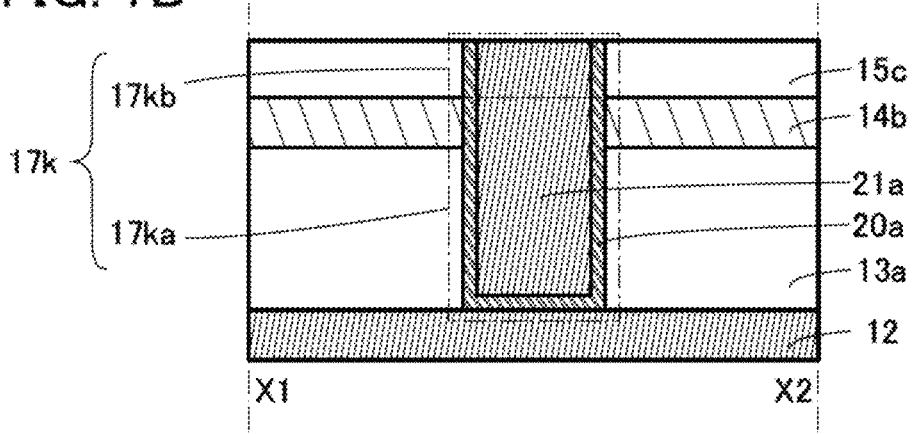
Figure 7C:
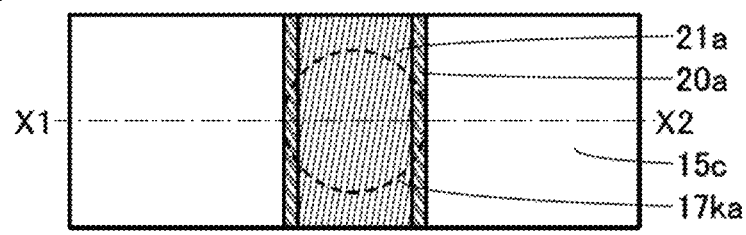

As for the difference in the shapes of the wiring and plug, an opening 17k illustrated in FIGS. 7B and 7C has a different shape from the opening 17j illustrated in FIG. 7A. The opening 17k can be regarded as being composed of an opening 17ka which is located in the lower part and functions as a via hole or a contact hole, and an opening 17*kb* which is located in the upper part and functions as a groove in which a wiring pattern or the like is embedded. As for the shapes of the wiring and the plug illustrated in FIGS. 7B and 7C, a maximum value of the width of the opening 17*ka* substantially corresponds to a minimum value of the width of the opening 17*kb*. For example, the width of the opening 17*ka* in the direction of X1-X2 in FIGS. 7B and 7C substantially corresponds to the width of the opening 17*kb* in the direction of X1-X2. Such a structure can reduce an area occupied by the wiring. In the case of the opening 17*k* having such a shape, for example, the width of the opening 17*a* in the hard mask 16 in the direction of X1-X2 shown in FIGS. 1A and 1B is set to substantially correspond to the width of the opening 17*b* in the resist mask 18*a* in the direction of X1-X2 shown in FIGS. 1C and 1D.

Figure 8A:
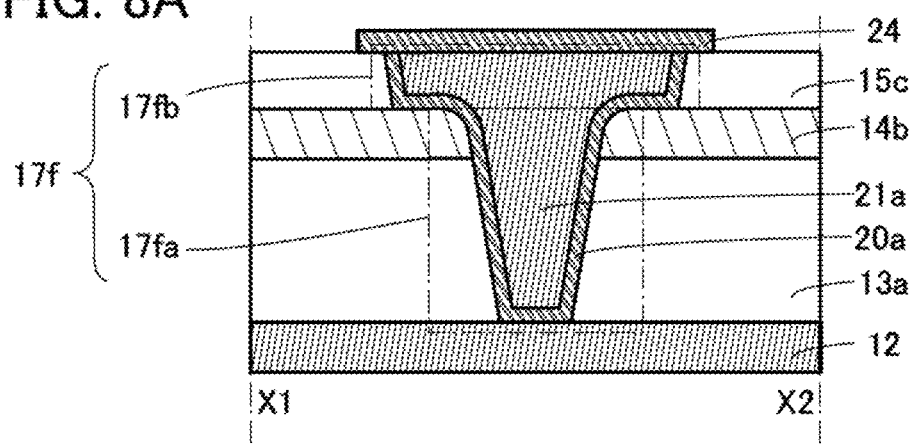
FIGS. 8A and 8B are a cross-sectional view and a top view illustrating the method for manufacturing a semiconductor device of one embodiment of the present invention.
Figure 8B:
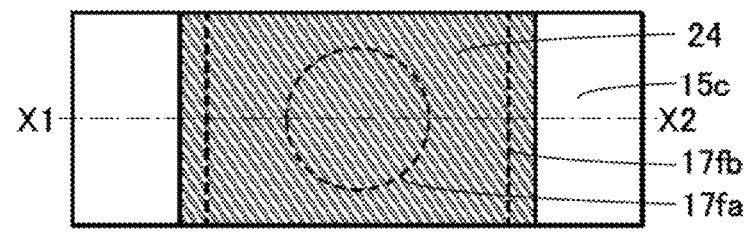

The structure of a wiring and a plug illustrated in FIGS. 8A and 8B is different from that illustrated in FIGS. 4C and 4D in that a conductor 24 is provided over the conductor 21*a* and the conductor 20*a*. Here, a conductor that can be used as the conductor 20*a*, e.g., tantalum nitride, may be used as the conductor 24. With such a structure, the conductor 21*a* can be wrapped with the conductor 20*a* and the conductor 24 which are less permeable to hydrogen. Such a structure makes it possible to effectively block hydrogen diffusing from the conductor 12, the insulator 13*a*, and the like and prevent hydrogen from entering the upper layer through the conductor 21*a*.

Note that to form the conductor 24, a pattern may be formed by lithography or the like; alternatively, an insulator having an opening similar to the insulator 15*c* may be provided and the conductor 24 may be embedded in the opening.

The method for forming a wiring and a plug described in this embodiment is not limited to that described above. A method for forming a wiring and a plug which is different from the above-described method is described below.

The method for forming a wiring and a plug that is different from that described above is described with reference to FIGS. 9A to 9D, FIGS. 10A to 10D, FIGS. 11A and 11B, and FIGS. 12A and 12B. A process after the step shown in FIGS. 12A and 12B follows the step shown in FIGS. 3A and 3B.

First, by a method similar to that described above, the conductor 12 is formed, the insulator 13 is formed over the conductor 12, the insulator 14 is formed over the insulator 13, and the insulator 15 is formed over the insulator 14.

Figure 9A:
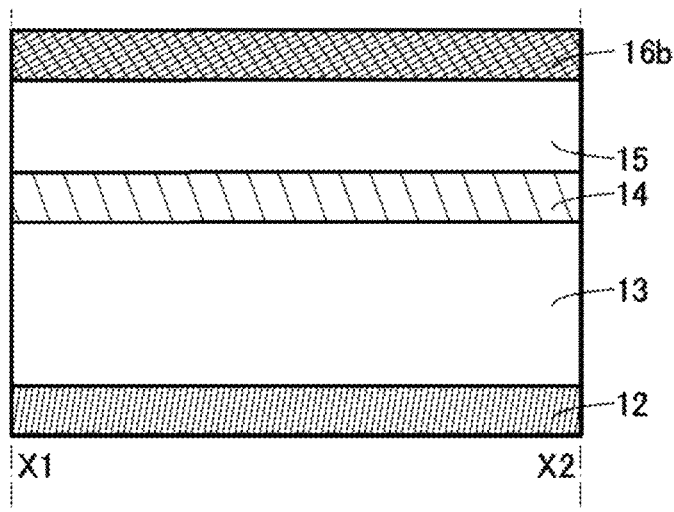
FIGS. 9A to 9D are cross-sectional views and top views illustrating the method for manufacturing a semiconductor device of one embodiment of the present invention.
Figure 9B:
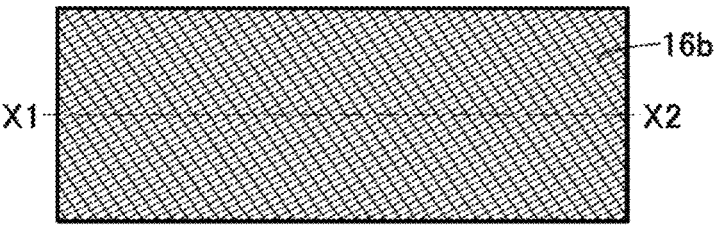

Subsequently, a hard mask material 16*b* is deposited over the insulator 15 by a method similar to the method for depositing the material of the hard mask 16 (see FIGS. 9A and 9B). Here, FIG. 9A corresponds to a cross section taken along dashed dotted line X1-X2 shown in FIG. 9B. In the same manner, each cross-sectional view shown in the following description corresponds to a cross section taken along dashed dotted line X1-X2 shown in the corresponding top view.

After that, a resist mask 18*b* with an opening 17*m* is formed over the hard mask material 16*b*. For the formation of the resist mask 18*b*, the above description of the resist mask 18*a* can be referred to.

Here, the opening 17*m* corresponds to the opening 17*fa* to be formed later, e.g., a via hole or a contact hole. Therefore, the top-view shape of the opening 17*m* corresponds to that of the via hole or the contact hole.

Note that the top-view shape of the opening 17*m* is, but not limited to, circular; the top-view shape can alternatively be, for example, elliptic or polygonal, e.g., a triangle or a quadrangle. In the case where a polygonal shape is employed, corners thereof may be rounded.

Figure 9C:
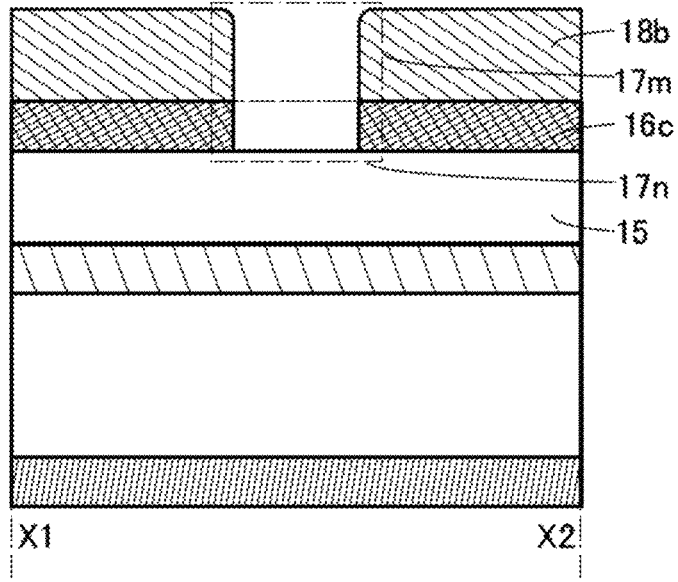
Figure 9D:
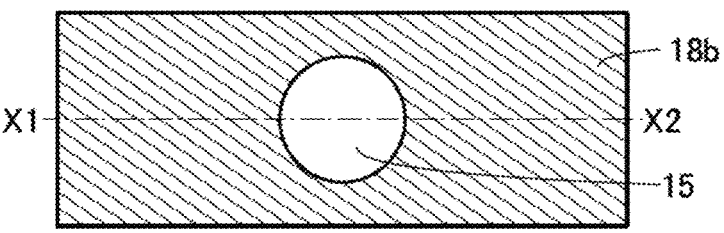

Next, the hard mask material 16*b* is etched using the resist mask 18*b* to form a hard mask 16*c* with an opening 17*n* (see FIGS. 9C and 9D). Here, etching is performed until the top surface of the insulator 15 is exposed in the opening 17*n*. Note that dry etching is preferably employed for the etching. As a dry etching apparatus, an apparatus similar to that described above can be used.

Next, the insulator 15 is etched using the resist mask 18*b* to form the insulator 15*a* with an opening 17*p*. Here, etching is performed until the top surface of the insulator 14 is exposed in the opening 17*p*. Note that dry etching is preferably employed for the etching. As a dry etching apparatus, an apparatus similar to that described above can be used.

Figure 10A:
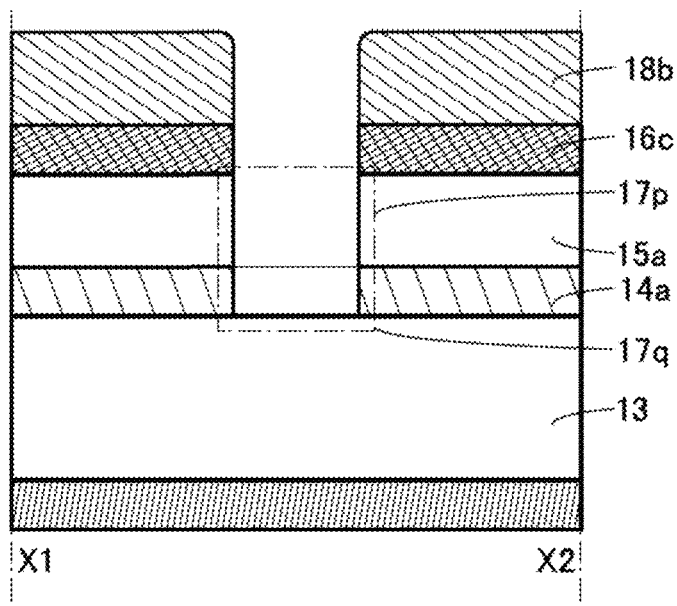
FIGS. 10A to 10D are cross-sectional views and top views illustrating the method for manufacturing a semiconductor device of one embodiment of the present invention.
Figure 10B:
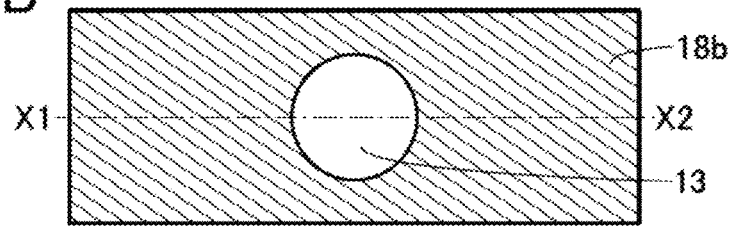

Next, the insulator 14 is etched using the resist mask 18*b* to form the insulator 14*a* with an opening 17*q* (see FIGS. 10A and 10B). Here, etching is performed until the top surface of the insulator 13 is exposed in the opening 17*q*. Note that dry etching is preferably employed for the etching. As a dry etching apparatus, an apparatus similar to that described above can be used.

Figure 10C:
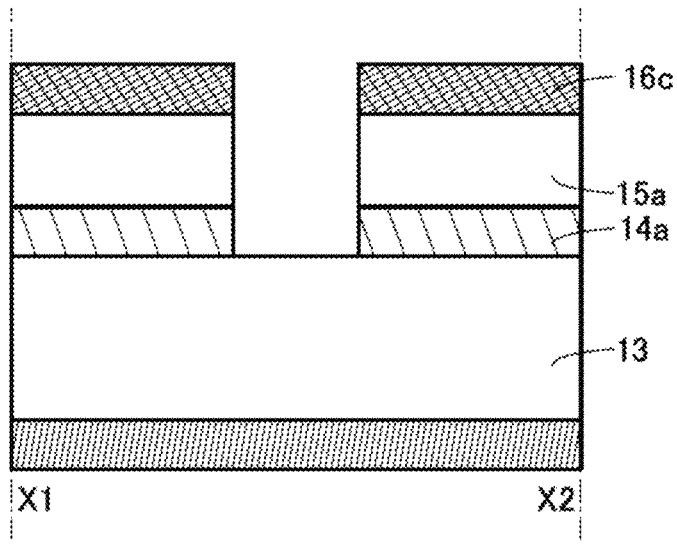
Figure 10D:
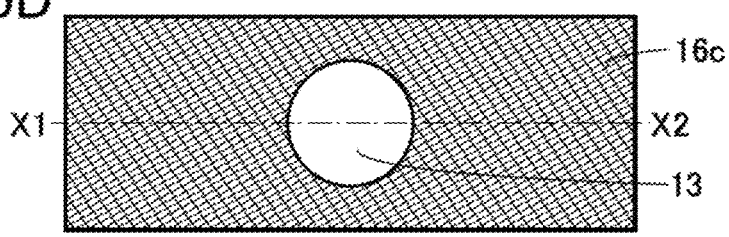

Next, the resist mask 18*b* is removed (see FIGS. 10C and 10D). For the removal of the resist mask 18*b*, the description of the removal of the resist mask 18*a* can be referred to.

Next, a resist mask 26*a* with an opening 17*r* is formed over the hard mask 16*c*. For the formation of the resist mask 26*a*, the above description of the resist mask 18*a* can be referred to. Note that a resist 26*b* might remain in the opening 17*q* and the opening 17*p* after the opening 17*r* is formed.

Figure 11A:
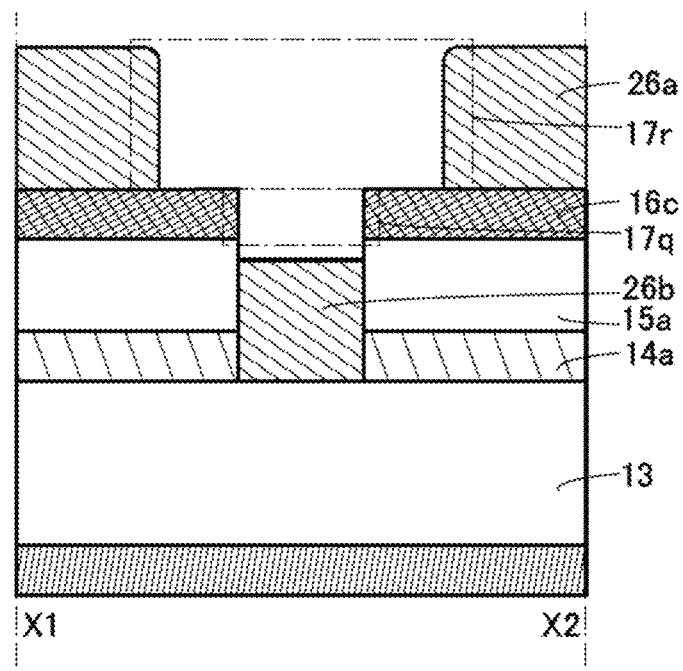
FIGS. 11A and 11B are a cross-sectional view and a top view illustrating the method for manufacturing a semiconductor device of one embodiment of the present invention.
Figure 11B:
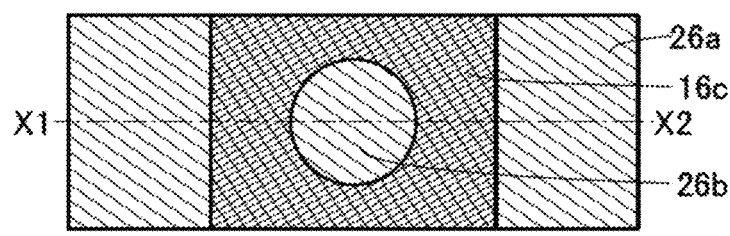

The opening 17*r* corresponds to the opening 17*fb* to be formed in a later step, i.e., a groove in which a wiring pattern is embedded. Therefore, the top-view shape of the opening 17*r* corresponds to that of the groove in which the wiring pattern is embedded. The opening 17*q* corresponding to a via hole or a contact hole is preferably formed in the opening 17*r* that corresponds to the groove in which the wiring pattern is embedded. In that case, a minimum value of the width of the opening 17*r* is greater than or equal to a maximum value of the width of the opening 17*q*. For example, the width of the opening 17*r* in the direction of X1-X2 shown in FIGS. 11A and 11B is greater than or equal to the width of the opening 17*q* in the direction of the X1-X2 shown in FIGS. 11A and 11B. In that case, the via hole or the contact hole can be formed with a margin with respect to the groove for the wiring pattern.

Figure 12A:
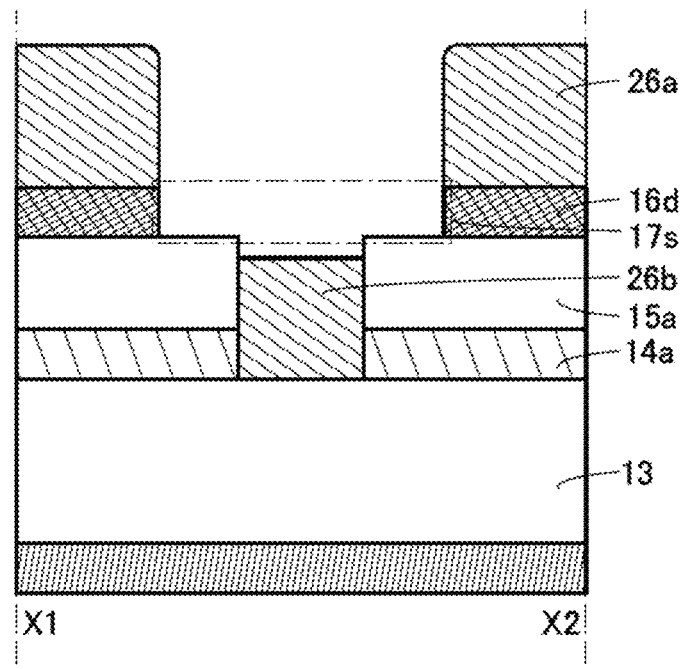
FIGS. 12A and 12B are a cross-sectional view and a top view illustrating the method for manufacturing a semiconductor device of one embodiment of the present invention.
Figure 12B:
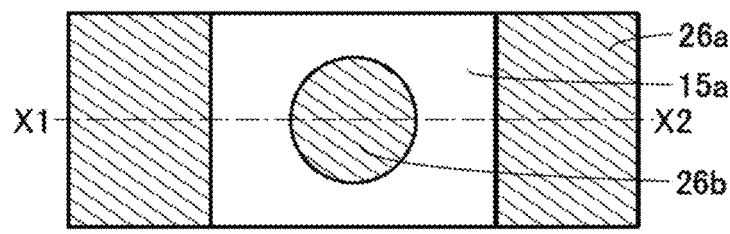

Next, the hard mask 16*c* is etched using the resist mask 26*a* to form a hard mask 16*d* with an opening 17*s* (see FIGS. 12A and 12B). Here, etching is performed until the top surface of the insulator 15*a* is exposed in the opening 17*s*. Note that dry etching is preferably employed for the etching. As a dry etching apparatus, an apparatus similar to that described above can be used.

Then, the resist mask 26*a* is removed. For the removal of the resist mask 26*a*, the description of the removal of the resist mask 18*a* can be referred to. Note that in the case where the resist 26*b* remains in the opening 17*q* and the opening 17*p*, the resist 26*b* is preferably removed at the same time as removal of the resist mask 26*a*.

After the resist mask 18*b* is removed, the opening 17*q* and the opening 17*p* may be filled with a filler. A material which can be removed at the same time as removal of the resist mask 26*a*, e.g., any of materials which can be removed by dry etching treatment such as the above-described ashing, can be used as the filler. As such a filler, an amorphous-carbon-based material may be used, for example.

Removing the resist mask 26a results in the shape illustrated in FIGS. 3A and 3B. Thus, after this step, a wiring and a plug are formed by following the step in FIGS. 3C and 3D and the subsequent steps.

<Structure of Transistor Including Oxide Semiconductor Film>

Figure 13A:
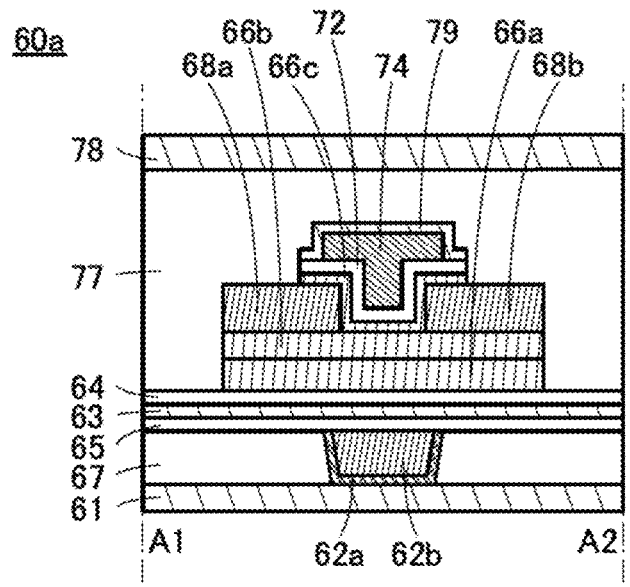
FIGS. 13A to 13D are cross-sectional views illustrating structures of a semiconductor device of one embodiment of the present invention.
Figure 13B:
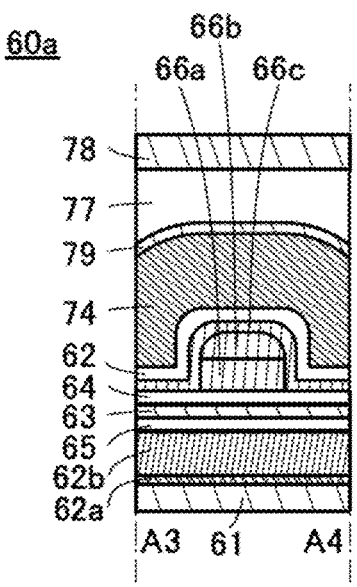

FIGS. 13A and 13B illustrate an example of the structure of a transistor 60a which is formed in the element layer including an oxide semiconductor. FIG. 13A is a cross-sectional view of the transistor 60a in a channel length direction A1-A2, and FIG. 13B is a cross-sectional view of the transistor 60a in a channel width direction A3-A4. Note that in this specification, the channel length direction of a transistor means the direction in which carriers move between a source (source region or source electrode) and a drain (drain region or drain electrode) in a plane parallel to the substrate, and the channel width direction means the direction perpendicular to the channel length direction in the plane parallel to a substrate.

In the cross-sectional views such as FIGS. 13A and 13B, end portions of some of patterned conductors, semiconductors, and insulators have right-angled corners; however, the semiconductor device in this embodiment is not limited thereto and can have rounded end portions.

The transistor 60a includes a conductor 62a, a conductor 62b, an insulator 65, an insulator 63, an insulator 64, an insulator 66a, a semiconductor 66b, a conductor 68a, a conductor 68b, an insulator 66c, an insulator 72, and a conductor 74. Here, the conductor 62a and the conductor 62b serve as a back gate of the transistor 60a, and the insulator 65, the insulator 63, and the insulator 64 serve as gate insulating films for the back gate of the transistor 60a. The conductor 68a and the conductor 68b serve as a source and a drain of the transistor 60a. The insulator 72 serves as a gate insulating film of the transistor 60a, and the conductor 74 serves as a gate of the transistor 60a.

Note that as the details are described later, the insulator 66a and the insulator 66c are each sometimes formed using a substance that can function as a conductor, a semiconductor, or an insulator when they are used alone. However, when the transistor is formed using a stack including the insulator 66a, the semiconductor 66b, and the insulator 66c, electrons flow in the semiconductor 66b, in the vicinity of the interface between the semiconductor 66b and the insulator 66a, and in the vicinity of the interface between the semiconductor 66b and the insulator 66c; thus, the insulator 66a and the insulator 66c have a region not functioning as a channel of the transistor. For that reason, in this specification and the like, the insulator 66a and the insulator 66c are not referred to as conductors or semiconductors but referred to as insulators or oxide insulators.

In this embodiment and the like, the term "insulator" can be replaced with the term "insulating film" or "insulating layer". In addition, the term "conductor" can be replaced with the term "conductive film" or "conductive layer". Moreover, the term "semiconductor" can be replaced with the term "semiconductor film" or "semiconductor layer".

In a portion below the transistor 60a, an insulator 67 with an opening is provided over an insulator 61, the conductor 62a is provided in the opening, and the conductor 62b is provided over the conductor 62a. The insulator 66a, the semiconductor 66b, and the insulator 66c overlap at least part of the conductor 62a and part of the conductor 62b. Here, the conductor 62a and the conductor 62b functioning as the back gate of the transistor 60a can be formed in parallel with formation of the conductor 21a and the conductor 20a functioning as the wiring and the plug. Therefore, the insulator 61, the insulator 67, the conductor 62a, and the conductor 62b correspond to the insulator 14b, the insulator 15c, the conductor 20a, and the conductor 21a, respectively.

The insulator 65 is provided in contact with the conductor 62a and the conductor 62b so as to cover top surfaces of the conductor 62a and the conductor 62b. The insulator 63 is provided over the insulator 65, and the insulator 64 is provided over the insulator 63.

Here, it is preferable that part of the conductor 68a overlap one end of the conductor 62a and one end of the conductor 62b in the channel length direction, and that part of the conductor 68b overlap the other end of the conductor 62a and the other end of the conductor 62b in the channel length direction. The conductor 62a and the conductor 62b provided as described above can sufficiently overlap a region in the semiconductor 66b which is between the conductor 68a and the conductor 68b, that is, a channel formation region in the semiconductor 66b. Accordingly, with the use of the conductor 62a and the conductor 62b, the threshold voltage of the transistor 60a can be controlled more effectively.

The insulator 66a is provided over the insulator 64, and the semiconductor 66b is provided in contact with at least part of the top surface of the insulator 66a. Although end portions of the insulator 66a and the semiconductor 66b are substantially aligned in FIGS. 13A and 13B, the structure of the semiconductor device described in this embodiment is not limited to this example.

The conductor 68a and the conductor 68b are formed in contact with at least part of the top surface of the semiconductor 66b. The conductor 68a and the conductor 68b are spaced and are preferably formed to face each other with the conductor 74 provided therebetween as illustrated in FIG. 13A.

The insulator 66c is provided in contact with at least part of the top surface of the semiconductor 66b. The insulator 66c covers part of the top surface of the conductor 68a, part of the top surface of the conductor 68b, and the like, and is preferably in contact with part of the top surface of the semiconductor 66b between the conductor 68a and the conductor 68b.

The insulator 72 is provided over the insulator 66c. The insulator 72 is preferably in contact with part of the top surface of the insulator 66c between the conductor 68a and the conductor 68b.

The conductor 74 is provided over the insulator 72. The conductor 74 is preferably in contact with part of the top surface of the insulator 72 between the conductor 68a and the conductor 68b.

An insulator 79 is provided to cover the conductor 74. Note that the insulator 79 is not necessarily provided.

The structure of the transistor 60a is not limited to that illustrated in FIGS. 13A and 13B. For example, side surfaces of the insulator 66c, the insulator 72, and the conductor 74 in the direction of A1-A2 may be aligned. In addition, for example, the insulator 66c and/or the insulator 72 may cover the insulator 66a, the semiconductor 66b, the conductor 68a, and the conductor 68b and may be in contact with the top surface of the insulator 64.

Note that the conductor 74 may be connected to the conductor 62b through an opening formed in the insulator 72, the insulator 66c, the insulator 64, the insulator 63, the insulator 65, and the like.

An insulator 77 is provided over the insulator 64, the conductor 68a, the conductor 68b, and the conductor 74. In addition, an insulator 78 is provided over the insulator 77.

<Oxide Semiconductor>

An oxide semiconductor used as the semiconductor 66b is described below.

The oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Next, preferred ranges of atomic ratios of indium to the element M and zinc in the oxide semiconductor according to the present invention will be described with reference to FIGS. 26A to 26C. Note that the proportion of oxygen atoms is not illustrated in FIGS. 26A to 26C. The terms of the atomic ratio of indium to the element M and zinc in the oxide semiconductor are denoted by [In], [M], and [Zn], respectively.

Figure 26A:
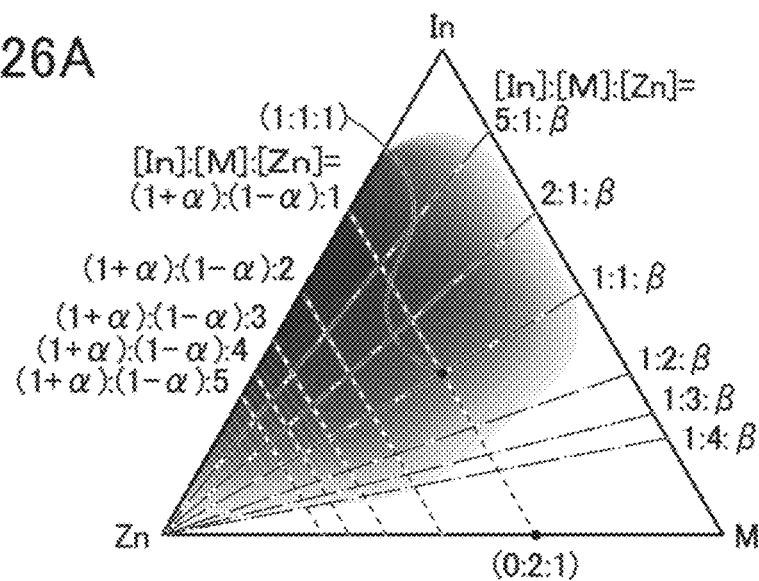
FIGS. 26A to 26C each illustrate an atomic ratio range of an oxide semiconductor of one embodiment of the present invention.
Figure 26B:
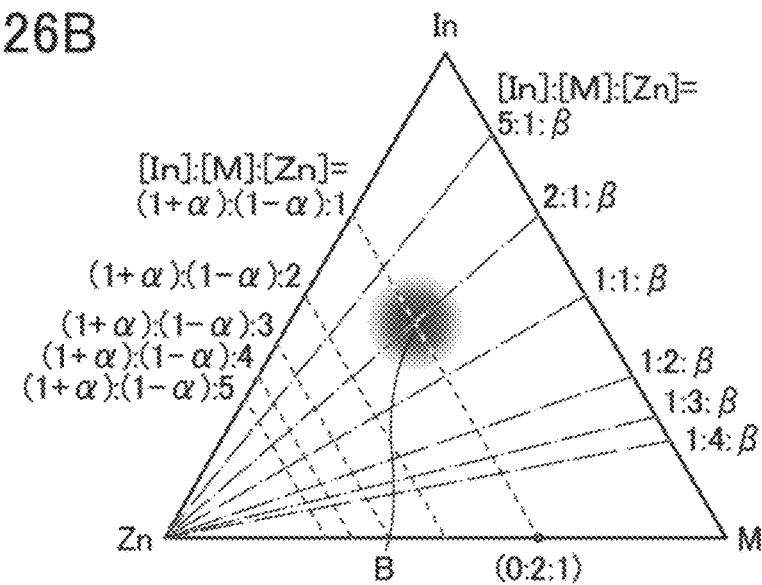
Figure 26C:
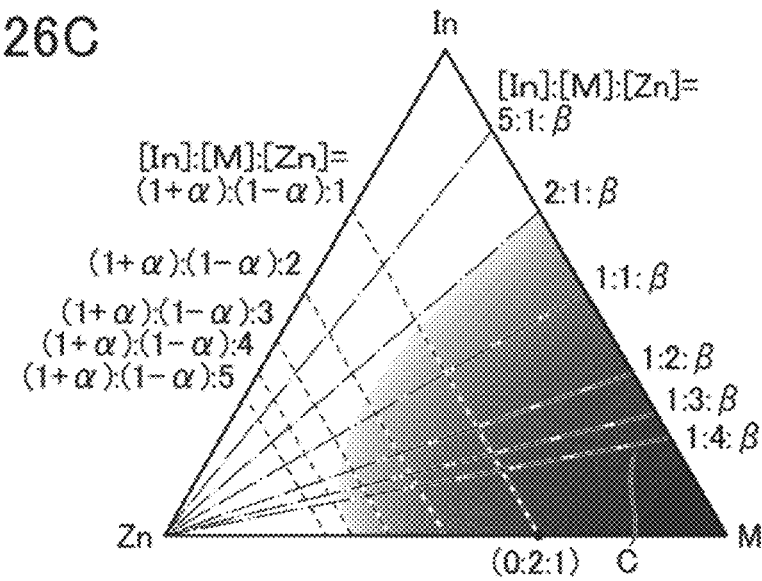

In FIGS. 26A to 26C, dashed lines correspond to a line representing the atomic ratio of $[In]:[M]:[Zn]=(1+\alpha):(1-\alpha):1$ $(-1\leq\alpha\leq1)$, a line representing the atomic ratio of $[In]:[M]:[Zn]=(1+\alpha):(1-\alpha):2$, a line representing the atomic ratio of $[In]:[M]:[Zn]=(1+\alpha):(1-\alpha):3$, a line representing the atomic ratio of $[In]:[M]:[Zn]=(1+\alpha):(1-\alpha):4$, and a line representing the atomic ratio of $[In]:[M]:[Zn]=(1+\alpha):(1-\alpha):5$.

Dashed-dotted lines correspond to a line representing the atomic ratio of $[In]:[M]:[Zn]=1:1:\beta$ $(\beta\geq0)$, a line representing the atomic ratio of $[In]:[M]:[Zn]=1:2:\beta$, a line representing the atomic ratio of $[In]:[M]:[Zn]=1:3:\beta$, a line representing the atomic ratio of $[In]:[M]:[Zn]=1:4:\beta$, a line representing the atomic ratio of $[In]:[M]:[Zn]=2:1:\beta$, and a line representing the atomic ratio of $[In]:[M]:[Zn]=5:1:\beta$.

An oxide semiconductor having the atomic ratio of $[In]:[M]:[Zn]=0:2:1$ or a neighborhood thereof in FIGS. 26A to 26C tends to have a spinel crystal structure.

FIGS. 26A and 26B illustrate examples of the preferred ranges of the atomic ratios of indium to the element M and zinc contained in an oxide semiconductor in one embodiment of the present invention.

Figure 27:
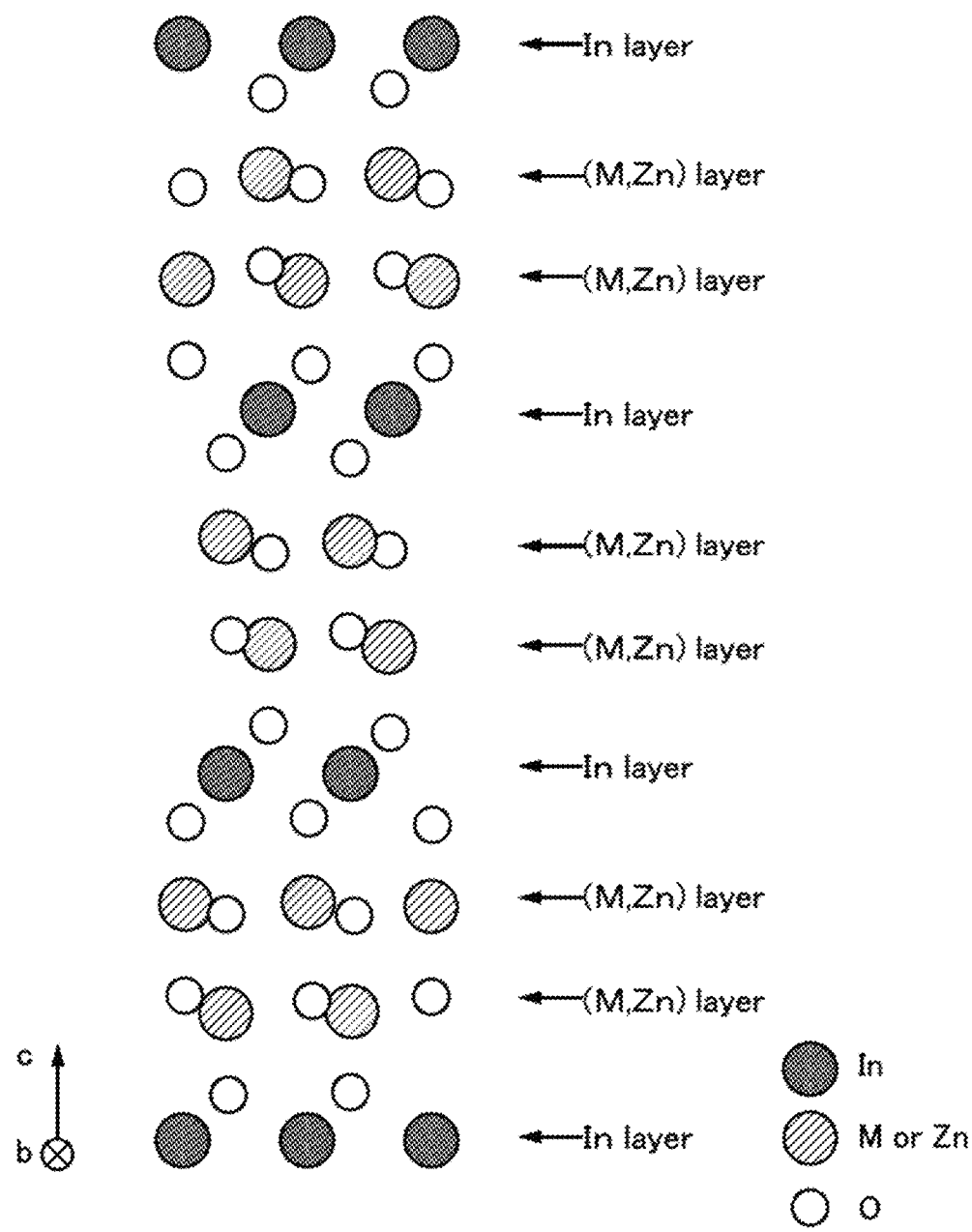
FIG. 27 illustrates an $InMZnO_4$ crystal.

FIG. 27 illustrates an example of the crystal structure of $InMZnO_4$ with an atomic ratio of $[In]:[M]:[Zn]=1:1:1$. The crystal structure illustrated in FIG. 27 is $InMZnO_4$ observed from a direction parallel to a b-axis. Note that a metal element in a layer that contains M, Zn, and oxygen (hereinafter, this layer is referred to as an "(M,Zn) layer") in FIG. 27 represents the element M or zinc. In that case, the proportion of the element M is the same as the proportion of zinc. The element M and zinc can be replaced with each other, and their arrangement is random.

Note that $InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 27.

Indium and the element M can be replaced with each other. Therefore, when the element M in the (M,Zn) layer is replaced by indium, the layer can also be referred to as an (In,M,Zn) layer. In that case, a layered structure that includes one In layer for every two (In,M,Zn) layers is obtained.

An oxide semiconductor with an atomic ratio of $[In]:[M]:[Zn]=1:1:2$ has a layered structure that includes one In layer for every three (M,Zn) layers. In other words, if [Zn] is larger than [In] and [M], the proportion of (M,Zn) layers to In layers becomes higher when the oxide semiconductor is crystallized.

Note that in the case where the number of (M,Zn) layers for every In layer is not an integer in the oxide semiconductor, the oxide semiconductor might have a plurality of kinds of layered structures where the number of (M,Zn) layers for every In layer is an integer. For example, in the case of $[In]:[M]:[Zn]=1:1:1.5$, the oxide semiconductor might have the following layered structures: a layered structure that includes one In layer for every two (M,Zn) layers and a layered structure that includes one In layer for every three (M,Zn) layers.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

In some cases, a plurality of phases (two, three, or more phases) coexist in the oxide semiconductor. For example, in the case of the atomic ratio of $[In]:[M]:[Zn]=0:2:1$ or a neighborhood thereof, two phases, i.e., a spinel crystal structure and a layered crystal structure, tend to coexist. In the case of the atomic ratio of $[In]:[M]:[Zn]=1:0:0$ or a neighborhood thereof, two phases, i.e., a bixbyite crystal structure and a layered crystal structure, tend to coexist. In the case where a plurality of phases coexist in an oxide semiconductor, a grain boundary might be formed between different crystal structures.

In addition, an oxide semiconductor containing indium in a higher proportion can have higher carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of In atoms are increased; therefore, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of $[In]:[M]:[Zn]=0:1:0$ and neighborhoods thereof (e.g., a region C in FIG. 26C), insulation performance becomes better.

Accordingly, an oxide semiconductor in one embodiment of the present invention preferably has an atomic ratio represented by a region A in FIG. 26A. With the atomic ratio, a layered structure with high carrier mobility and a few grain boundaries is easily obtained.

A region B in FIG. 26B represents atomic ratios from $[In]:[M]:[Zn]=4:2:3$ to $[In]:[M]:[Zn]=4:2:4.1$ and neighborhoods thereof. The neighborhoods include an atomic ratio of $[In]:[M]:[Zn]=5:3:4$. An oxide semiconductor with an atomic ratio represented by the region B is an excellent oxide semiconductor that has particularly high crystallinity and high carrier mobility.

Note that conditions where a layered structure of an oxide semiconductor is formed are not uniquely determined by the atomic ratio. The atomic ratio affects difficulty in forming a layered structure. Even oxide semiconductors with the same atomic ratio have a layered structure in some cases, but not in others, depending on formation conditions. Therefore, the illustrated regions show atomic ratios at which a layered structure of an oxide semiconductor can be formed; boundaries of the regions A to C are not clear.

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide semiconductor has few carrier generation sources, and thus can have a low carrier density. A highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, the transistor whose channel region is formed in the oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor will be described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains alkali metal or alkaline earth metal, defect states are formed and carriers are generated, in some cases. Thus, a transistor including an oxide semiconductor which contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor including an oxide semiconductor which contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel formation region in a transistor, the transistor can have stable electrical characteristics. Furthermore, a highly purified intrinsic or substantially highly purified intrinsic oxide semiconductor has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V even when an element has a channel width W of $1\times10^6$ µm and a channel length L of 10 µm The case where the semiconductor 66b that is the oxide semiconductor of the transistor 60a has a two-layer structure or three-layer structure is described below. A band diagram in which insulators are in contact with the stacked-layer structure of the insulator 66a, the semiconductor 66b, and the insulator 66c, and a band diagram in which insulators are in contact with the stacked-layer structure of the semiconductor 66b and the insulator 66c are described using FIGS. 28A and 28B.

Figure 28A:
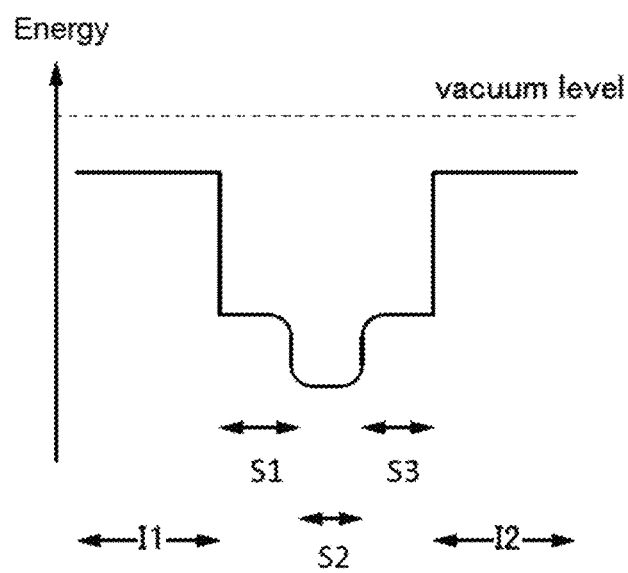
FIGS. 28A and 28B are each a band diagram of a layered structure including an oxide semiconductor.
Figure 28B:
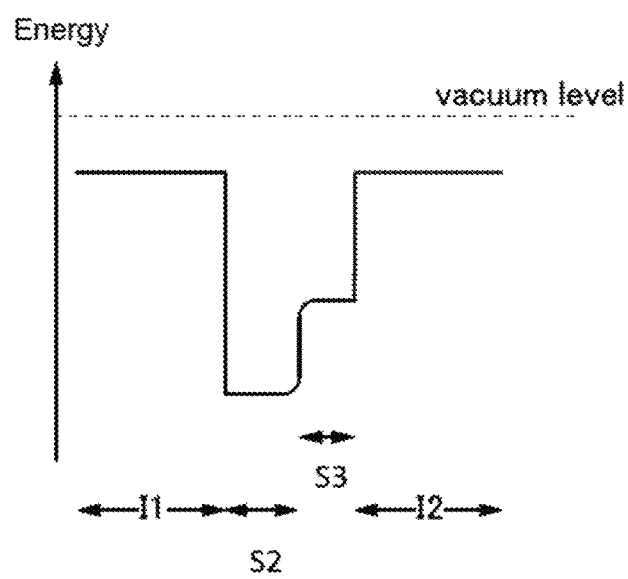

FIG. 28A shows an example of a band diagram along the thickness direction of a stacked-layer structure including an insulator I1, the insulator 66a (S1), the semiconductor 66b (S2), the insulator 66c (S3), and an insulator I2. FIG. 28B is an example of a band diagram along the thickness direction of a stacked-layer structure including the insulator I1, the semiconductor 66b (S2), the insulator 66c (S3), and the insulator I2. For easy understanding, these band diagrams show the energy levels (Ec) of the conduction band minimum of the insulator I1, the insulator 66a, the semiconductor 66b, the insulator 66c, and the insulator I2.

The energy levels of the conduction band minimum of the insulator 66a and the insulator 66c are closer to the vacuum level than that of the semiconductor 66b; typically, a difference in the energy level of the conduction band minimum between the semiconductor 66b and each of the insulators 66a and 66c be preferably greater than or equal to 0.15 eV or greater than or equal to 0.5 eV, and less than or equal to 2 eV or less than or equal to 1 eV. In other words, it is preferable that the electron affinity of the semiconductor 66b be greater than or equal to that of each of the insulator 66a and the insulator 66c, and that the difference in electron affinity between the semiconductor 66*b* and each of the insulator 66*a* and the insulator 66*c* be greater than or equal to 0.15 eV or greater than or equal to 0.5 eV, and less than or equal to 2 eV or less than or equal to 1 eV.

As illustrated in FIGS. 28A and 28B, the energy level of the conduction band minimum gradually changes between the insulator 66*a* and the semiconductor 66*b* and between the semiconductor 66*b* and the insulator 66*c*. In other words, the energy level of the conduction band minimum is continuously varied or continuously connected. To obtain such band diagrams, the density of defect states in a mixed layer formed at an interface between the insulator 66*a* and the semiconductor 66*b* or an interface between the semiconductor 66*b* and the insulator 66*c* is preferably made low.

Specifically, when the insulator 66*a* and the semiconductor 66*b* or the semiconductor 66*b* and the insulator 66*c* contain the same element (as a main component) in addition to oxygen, a mixed layer with a low density of defect states can be formed. For example, in the case where the semiconductor 66*b* is an In—Ga—Zn oxide semiconductor, it is preferable to use an In—Ga—Zn oxide semiconductor, a Ga—Zn oxide semiconductor, gallium oxide, or the like as each of the insulator 66*a* and the insulator 66*c*.

At this time, the semiconductor 66*b* serves as a main carrier path. Since the density of defect states at the interface between the insulator 66*a* and the semiconductor 66*b* and the interface between the semiconductor 66*b* and the insulator 66*c* can be made low, the influence of interface scattering on carrier conduction is small, and a high on-state current can be obtained.

Note that when a high gate voltage is applied, current also flows in the insulator 66*a* near the interface with the semiconductor 66*b* and in the insulator 66*c* near the interface with the semiconductor 66*b* in some cases.

As described above, the insulator 66*a* and the insulator 66*c* are formed using a substance that can function as a conductor, a semiconductor, or an insulator when they are used alone. However, when the transistor is formed using a stack including the insulator 66*a*, the semiconductor 66*b*, and the insulator 66*c*, electrons flow in the semiconductor 66*b*, in the vicinity of the interface between the semiconductor 66*b* and the insulator 66*a*, and in the vicinity of the interface between the semiconductor 66*b* and the insulator 66*c*; thus, the insulator 66*a* and the insulator 66*c* have a region not functioning as a channel of the transistor. For that reason, in this specification and the like, the insulator 66*a* and the insulator 66*c* are not referred to as conductors or semiconductors but referred to as insulators or oxide insulators. Note that the reason why the insulator 66*a* and the insulator 66*c* are referred to as an insulator or an oxide insulator is because they are closer to an insulator than the semiconductor 66*b* is in terms of their functions in the transistor; thus, a substance that can be used for the semiconductor 66*b* is used for the insulator 66*a* and the insulator 66*c* in some cases.

When an electron is trapped in a trap state, the trapped electron behaves like fixed charge; thus, the threshold voltage of the transistor is shifted in a positive direction. The insulator 66*a* and the insulator 66*c* can make the trap state apart from the semiconductor 66*b*. This structure can prevent the positive shift of the threshold voltage of the transistor.

A material whose conductivity is sufficiently lower than that of the semiconductor 66*b* is used for the insulator 66*a* and the insulator 66*c*. In that case, the semiconductor 66*b*, the interface between the semiconductor 66*b* and the insulator 66*a*, and the interface between the semiconductor 66*b* and the insulator 66*c* mainly function as a channel region. For example, an oxide semiconductor with high insulation performance and the atomic ratio represented by the region C in FIG. 26C may be used for the insulator 66*a* and the insulator 66*c*. Note that the region C in FIG. 26C represents the atomic ratio of [In]:[M]:[Zn]=0:1:0 or the vicinity thereof.

In the case where an oxide semiconductor with the atomic ratio represented by the region A is used as the semiconductor 66*b*, it is particularly preferable to use an oxide semiconductor with [M]/[In] of greater than or equal to 1, preferably greater than or equal to 2, as each of the insulator 66*a* and the insulator 66*c*. In addition, it is preferable to use an oxide semiconductor with sufficiently high insulation performance and [M]/([Zn]+[In]) of greater than or equal to 1 as the insulator 66*c*.

The insulator 66*a*, the semiconductor 66*b*, and the insulator 66*c* can be formed by a sputtering method, a CVD method, an MBE method, a PLD method, an ALD method, or the like.

The insulator 66*a*, the semiconductor 66*b*, and the insulator 66*c* are preferably subjected to substrate heating during the deposition or subjected to heat treatment after the deposition. Such heat treatment can reduce water or hydrogen included in the insulator 66*a*, the semiconductor 66*b*, the insulator 66*c*, and the like. Furthermore, excess oxygen can be supplied to the insulator 66*a*, the semiconductor 66*b*, and the insulator 66*c* in some cases. The heat treatment is performed at a temperature higher than or equal to 250° C. and lower than or equal to 650° C., preferably higher than or equal to 300° C. and lower than or equal to 450° C., and further preferably higher than or equal to 350° C. and lower than or equal to 400° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen. For the heat treatment, lamp heating can be performed with use of an RTA apparatus. Heat treatment with an RTA apparatus is effective for an improvement in productivity because it needs short time as compared with the case of using a furnace.

Note that in the case where tantalum nitride is used for the conductor 62*a* serving as the back gate of the transistor, the conductor 20*a* forming the wiring and the plug illustrated in FIGS. 4A to 4D, or the like, the temperature of the above heat treatment may be set to higher than or equal to 350° C. and lower than or equal to 410° C., preferably higher than or equal to 370° C. and lower than or equal to 400° C. The heat treatment within such a temperature range can prevent release of hydrogen from the tantalum nitride film.

In addition, regions of the semiconductor 66*b* or the insulator 66*c* that are in contact with the conductor 68*a* and the conductor 68*b* include low-resistance regions in some cases. The low-resistance regions are mainly formed when oxygen is extracted by the conductor 68*a* and the conductor 68*b* that are in contact with the semiconductor 66*b*, or when a conductive material in the conductor 68*a* or the conductor 68*b* is bonded to an element in the semiconductor 66*b*. The formation of the low-resistance regions leads to a reduction in contact resistance between the conductor 68*a* or 68*b* and the semiconductor 66*b*, whereby the transistor 60*a* can have a large on-state current.

The semiconductor 66b might have a smaller thickness in a region between the conductor 68a and the conductor 68b than in a region overlapping the conductor 68a or the conductor 68b. This is because part of the top surface of the semiconductor 66b is removed at the time of formation of the conductor 68a and the conductor 68b. In formation of the conductor to be the conductor 68a and the conductor 68b, a region with low resistance like the above low-resistance regions is formed on the top surface of the semiconductor 66b in some cases. The removal of the region that is on the top surface of the semiconductor 66b and between the conductor 68a and the conductor 68b can prevent a channel from being formed in the low-resistance region on the top surface of the semiconductor 66b.

Note that the three-layer structure including the insulator 66a, the semiconductor 66b, and the insulator 66c is an example. For example, a two-layer structure not including the insulator 66a or the insulator 66c may be employed. Alternatively, a single-layer structure not including the insulator 66a and the insulator 66c may be employed. Further alternatively, it is possible to employ an n-layer structure (n is an integer of four or more) that includes any of the insulator, semiconductor, and conductor given as examples of the insulator 66a, the semiconductor 66b, and the insulator 66c.

<Insulator and Conductor>

Components other than the semiconductor of the transistor 60a are described in detail below.

As the insulator 61, an insulator having a function of blocking hydrogen or water is used. Hydrogen and water in the insulator that is provided in the vicinity of the insulator 66a, the semiconductor 66b, and the insulator 66c cause carriers to be generated in the insulator 66a, the semiconductor 66b, and the insulator 66c that also function as oxide semiconductors. Because of this, the reliability of the transistor 60a might be decreased. In particular, when silicon or the like is used in a semiconductor substrate 91, hydrogen is used to terminate dangling bonds of the semiconductor substrate; thus, the hydrogen might diffuse into the transistor including the oxide semiconductor. In that case, the insulator 61 that has a function of blocking hydrogen or water can inhibit diffusion of hydrogen or water from layers below the transistor including the oxide semiconductor, increasing the reliability of the transistor including the oxide semiconductor. It is preferable that the insulator 61 be less permeable to hydrogen or water than the insulator 65 and the insulator 64.

The insulator 61 preferably has a function of blocking oxygen. When the insulator 61 blocks oxygen diffused from the insulator 64, oxygen can be effectively supplied from the insulator 64 to the insulator 66a, the semiconductor 66b, and the insulator 66c.

The insulator 61 can be formed using, for example, aluminum oxide, aluminum oxynitride, gallium oxide, gallium oxynitride, yttrium oxide, yttrium oxynitride, hafnium oxide, or hafnium oxynitride. The use of such a material enables the insulator 61 to function as an insulating film having an effect of blocking diffusion of oxygen, hydrogen, or water. The insulator 61 can be formed using, for example, silicon nitride or silicon nitride oxide. The use of such a material enables the insulator 61 to function as an insulating film having an effect of blocking diffusion of hydrogen or water. Note that the insulator 61 can be formed by a sputtering method, a CVD method, an MBE method, a PLD method, an ALD method, or the like.

The insulator 67 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Note that the insulator 67 can be formed by a sputtering method, a CVD method, an MBE method, a PLD method, an ALD method, or the like.

The semiconductor 66b in a region between the conductor 68a and the conductor 68b preferably overlaps at least part of the conductors 62a and 62b. The conductor 62a and the conductor 62b function as a back gate of the transistor 60a. The conductor 62a and the conductor 62b enable control of the threshold voltage of the transistor 60a. Control of the threshold voltage can prevent the transistor 60a from being turned on when a low voltage, e.g., a voltage of 0 V or lower, is applied to the gate (conductor 74) of the transistor 60a. Thus, the electrical characteristics of the transistor 60a can be easily made normally-off characteristics.

Note that the conductors 62a and 62b functioning as a back gate may be connected to a wiring or a terminal to which a predetermined potential is supplied. For example, the conductors 62a and 62b may be connected to a wiring to which a constant potential is supplied. The constant potential can be a high power supply potential or a low power supply potential such as a ground potential.

Any of the conductors that can be used as the conductor 20 can be used as the conductor 62a, and any of the conductors that can be used as the conductor 21 can be used as the conductor 62b.

The insulator 65 is provided to cover the conductors 62a and 62b. An insulator similar to the insulator 64 or the insulator 72 to be described later can be used as the insulator 65.

The insulator 63 is provided to cover the insulator 65. The insulator 63 preferably has a function of blocking oxygen. Such an insulator 63 can prevent extraction of oxygen from the insulator 64 by the conductor 62a and the conductor 62b. Accordingly, oxygen can be effectively supplied from the insulator 64 to the insulator 66a, the semiconductor 66b, and the insulator 66c. By improving the coverage with the insulator 63, extraction of oxygen from the insulator 64 can be further reduced and oxygen can be more effectively supplied from the insulator 64 to the insulator 66a, the semiconductor 66b, and the insulator 66c.

As the insulator 63, an oxide or a nitride containing boron, aluminum, silicon, scandium, titanium, gallium, yttrium, zirconium, indium, lanthanum, cerium, neodymium, hafnium, or thallium is used. It is preferable to use hafnium oxide or aluminum oxide. Note that the insulator 63 can be formed by a sputtering method, a CVD method, an MBE method, a PLD method, an ALD method, or the like.

Of the insulators 65, 63, and 64, the insulator 63 preferably includes an electron trap region. When the insulator 65 and the insulator 64 have a function of inhibiting release of electrons, the electrons trapped in the insulator 63 behave as if they are negative fixed charges. Thus, the insulator 63 has a function of a floating gate.

The amounts of hydrogen and water contained in the insulator 64 are preferably small. For example, the insulator 64 may be formed to have a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 64 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. It is preferable to use silicon oxide or silicon oxynitride. Note that the insulator 64 can be formed by a sputtering method, a CVD method, an MBE method, a PLD method, an ALD method, or the like.

The insulator 64 preferably contains excess oxygen. Such an insulator 64 makes it possible to supply oxygen from the insulator 64 to the insulator 66a, the semiconductor 66b, and the insulator 66c. The oxygen can reduce oxygen vacancies which are to be defects in the insulator 66a, the semiconductor 66b, and the insulator 66c which are oxide semiconductors. As a result, the insulator 66a, the semiconductor 66b, and the insulator 66c, can be oxide semiconductors with a low density of defect states and stable characteristics.

In this specification and the like, excess oxygen refers to oxygen in excess of the stoichiometric composition, for example. Alternatively, excess oxygen refers to oxygen released from a film or layer containing the excess oxygen by heating, for example. Excess oxygen can move inside a film or a layer. Excess oxygen moves between atoms in a film or a layer, or replaces oxygen that is a constituent of a film or a layer and moves like a billiard ball, for example.

The insulator 64 including excess oxygen releases oxygen molecules, the number of which is greater than or equal to $1.0 \times 10^{14}$ molecules/cm$^2$ and less than or equal to $1.0 \times 10^{16}$ molecules/cm$^2$, preferably greater than or equal to $1.0 \times 10^{15}$ molecules/cm$^2$ and less than or equal to $5.0 \times 10^{15}$ molecules/cm$^2$ in thermal desorption spectroscopy (TDS) analysis in the range of surface temperatures of 100° C. to 700° C. or 100° C. to 500° C.

A method for measuring the number of released molecules using TDS analysis is described below by taking the amount of released oxygen as an example.

The total amount of gas released from a measurement sample in TDS analysis is proportional to the integral value of the ion intensity of the released gas. Then, comparison with a reference sample is made, whereby the total amount of released gas can be calculated.

For example, the number of oxygen molecules ($N_{O2}$) released from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha$$

A value $N_{H2}$ is obtained by conversion of the amount of hydrogen molecules released from the standard sample into densities. A value $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the measurement sample is analyzed by TDS. $\alpha$ is a coefficient which influences the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing certain amount of hydrogen atoms as the reference sample.

Further, in the TDS analysis, oxygen is partly detected as an oxygen atom. The ratio of oxygen molecules and oxygen atoms can be calculated from the ionization rate of the oxygen molecules. Note that since the above $\alpha$ includes the ionization rate of the oxygen molecules, the amount of the released oxygen atoms can also be estimated through the measurement of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in ESR.

The insulator 64 or the insulator 63 may have a function of preventing diffusion of impurities from the lower layers.

As described above, the top surface or the bottom surface of the semiconductor 66b preferably has high planarity. Thus, to improve the planarity, the top surface of the insulator 64 may be subjected to planarization treatment performed by CMP process or the like.

The conductor 68a and the conductor 68b function as the source electrode and the drain electrode of the transistor 60a.

The conductor 68a and the conductor 68b may each be formed so as to have a single-layer structure or a stacked-layered structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, the conductor 68a and the conductor 68b each may have a stacked-layered structure in which tungsten is stacked over tantalum nitride. As the conductor 68a and the conductor 68b, for example, an alloy or a compound may be used, and a conductor containing aluminum, a conductor containing copper and titanium, a conductor containing copper and manganese, a conductor containing indium, tin, and oxygen, a conductor containing titanium and nitrogen, or the like may be used. The conductor 68a and the conductor 68b can be formed by a sputtering method, a CVD method, an MBE method, a PLD method, an ALD method, or the like.

The insulator 72 functions as a gate insulating film of the transistor 60a. Like the insulator 64, the insulator 72 may be an insulator containing excess oxygen. Such an insulator 72 makes it possible to supply oxygen from the insulator 72 to the insulator 66a, the semiconductor 66b, and the insulator 66c.

The insulator 72 and the insulator 77 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 72 and the insulator 77 may each be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. The insulator 72 and the insulator 77 can be formed by a sputtering method, a CVD method, an MBE method, a PLD method, an ALD method, or the like.

The insulator 77 preferably contains excess oxygen. Such an insulator 77 makes it possible to supply oxygen from the insulator 77 to the insulator 66a, the semiconductor 66b, and the insulator 66c. The oxygen can reduce oxygen vacancies which are to be defects in the insulator 66a, the semiconductor 66b, and the insulator 66c which are oxide semiconductors. As a result, the insulator 66a, the semiconductor 66b, and the insulator 66c can be oxide semiconductors with a low density of defect states and stable characteristics.

The insulator 77 including excess oxygen releases oxygen molecules, the number of which is greater than or equal to $1.0 \times 10^{14}$ molecules/cm$^2$ and less than or equal to $1.0 \times 10^{16}$ molecules/cm$^2$, preferably greater than or equal to $1.0 \times 10^{15}$ molecules/cm$^2$ and less than or equal to $5.0 \times 10^{15}$ molecules/cm$^2$ in thermal desorption spectroscopy (TDS) analysis in the range of surface temperatures of 100° C. to 700° C. or 100° C. to 500° C.

It is preferable that the amount of impurities such as hydrogen, water, and nitrogen oxide (NO$_x$, e.g., nitrogen monoxide and nitrogen dioxide) contained in the insulator 77 be small. Such an insulator 77 can prevent impurities such as hydrogen, water, and nitrogen oxide from diffusing from the insulator 77 into the insulator 66a, the semiconductor 66b, and the insulator 66c, so that the semiconductor 66b can have a low density of defect states and stable characteristics.

Here, the number of H$_2$O molecules released from the insulator 77 is less than or equal to $3.80 \times 10^{15}$ molecules/cm$^2$, preferably less than or equal to $2.40 \times 10^{15}$ molecules/cm$^2$ in TDS analysis in the range of surface temperatures from 200° C. to 560° C. It is further preferable that the number of H$_2$O molecules released from the insulator 77 be less than or equal to $7.00 \times 10^{14}$ molecules/cm$^2$ in TDS analysis in the range of surface temperatures from 0° C. to 400° C. It is preferable that the number of NO$_2$ molecules released from the insulator 77 be less than or equal to $1.80 \times 10^{13}$ molecules/cm$^2$ in TDS analysis.

The conductor 74 functions as a gate electrode of the transistor 60a. As the conductor 74, any of the conductors that can be used as the conductor 62b can be used.

Here, as illustrated in FIG. 13B, the semiconductor 66b can be electrically surrounded by electric fields of the conductors 62a and 62b and the conductor 74 (a structure in which a semiconductor is electrically surrounded by an electric field of a conductor is referred to as a surrounded channel (s-channel) structure). Therefore, a channel is formed in the entire semiconductor 66b (the top, bottom, and side surfaces). In the s-channel structure, a large amount of current can flow between a source and a drain of a transistor, so that a high on-state current can be obtained.

In the case where the transistor has the s-channel structure, a channel is formed also in the side surface of the semiconductor 66b. Therefore, as the semiconductor 66b has a larger thickness, the channel region becomes larger. In other words, the thicker the semiconductor 66b is, the larger the on-state current of the transistor is. In addition, when the semiconductor 66b is thick, the proportion of the region with a high carrier controllability increases, leading to a smaller subthreshold swing value. For example, the semiconductor 66b has a region with a thickness greater than or equal to 10 nm, preferably greater than or equal to 20 nm, further preferably greater than or equal to 30 nm. Note that to prevent a decrease in the productivity of the semiconductor device, the semiconductor 66b has a region with a thickness of, for example, less than or equal to 150 nm.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, further preferably less than or equal to 30 nm, still further preferably less than or equal to 20 nm and the channel width of the transistor is preferably less than or equal to 40 nm, further preferably less than or equal to 30 nm, still further preferably less than or equal to 20 nm.

Any of the insulators that can be used for the insulator 63 is preferably formed as the insulator 79. For example, gallium oxide or aluminum oxide formed by an ALD method may be used as the insulator 79. Covering the conductor 74 with such an insulator 79 can inhibit the conductor 74 from depriving excess oxygen that has been supplied to the insulator 77, resulting in preventing oxidation of the conductor 74.

Here, the thickness of the insulator 78 can be greater than or equal to 5 nm, or greater than or equal to 20 nm, for example. It is preferable that at least part of the insulator 78 be in contact with the top surface of the insulator 77.

The insulator 78 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 78 preferably has a blocking effect against oxygen, hydrogen, water, alkali metal, alkaline earth metal, and the like. As such an insulator, for example, a nitride insulating film can be used. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given. Any of the above-described oxides that can be used as the insulator 66a or the insulator 66c can also be used as the insulator 78. The insulator 78 can be formed by a sputtering method, a CVD method, an MBE method, a PLD method, an ALD method, or the like.

Here, it is preferable that the insulator 78 be formed by a sputtering method and it is further preferable that the insulator 78 be formed by a sputtering method in an atmosphere containing oxygen. When the insulator 78 is formed by a sputtering method, oxygen is added to the vicinity of a surface of the insulator 77 (after the formation of the insulator 78, the interface between the insulator 77 and the insulator 78) at the same time as the formation. For example, aluminum oxide may be formed by a sputtering method. In addition, aluminum oxide is preferably formed thereover by an ALD method. The use of an ALD method can prevent formation of pin holes and the like, leading to a further improvement in the blocking effect of the insulator 78 against oxygen, hydrogen, water, alkali metals, alkaline earth metals, and the like.

The insulator 78 is preferably subjected to heat treatment during or after the deposition. By the heat treatment, the oxygen added to the insulator 77 can be diffused to be supplied to the insulator 66a, the semiconductor 66b, and the insulator 66c. The oxygen may be supplied from the insulator 77 to the insulator 66a, the semiconductor 66b, and the insulator 66c through the insulator 72 or the insulator 64. The heat treatment is performed at a temperature higher than or equal to 250° C. and lower than or equal to 650° C., preferably higher than or equal to 350° C. and lower than or equal to 450° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with use of an RTA apparatus.

Note that in the case where tantalum nitride is used for the conductor 62a serving as the back gate of the transistor, the conductor 20a forming the wiring and the plug illustrated in FIGS. 4A to 4D, or the like, the temperature of the above heat treatment may be set to higher than or equal to 350° C. and lower than or equal to 410° C., preferably higher than or equal to 370° C. and lower than or equal to 400° C. The heat treatment within such a temperature range can prevent release of hydrogen from the tantalum nitride.

It is preferable that the insulator 78 be less permeable to oxygen than the insulator 77 and have a function of blocking oxygen. Such an insulator 78 can prevent oxygen from being externally released to above the insulator 78 at the time of supply of oxygen from the insulator 77 to the insulator 66a, the semiconductor 66b, and the insulator 66c.

Aluminum oxide is preferably used for the insulator 78 because it is highly effective in preventing passage of both oxygen and impurities such as hydrogen and moisture.

Figure 13C:
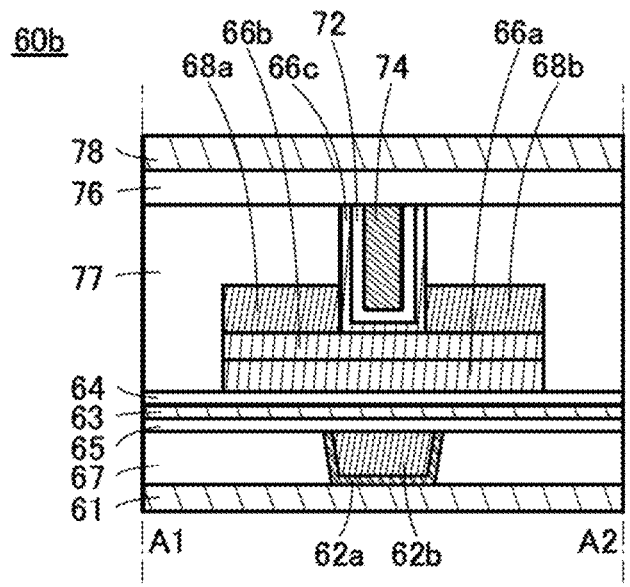
Figure 13D:
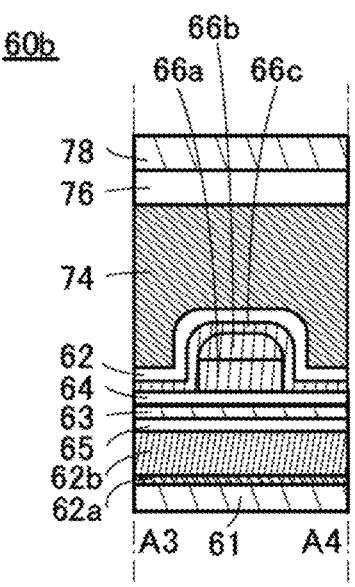

Next, an modification example of the transistor 60a is described with reference to FIGS. 13C and 13D. FIGS. 13C and 13D are a cross-sectional view of the transistor 60a in the channel length direction and that in the channel width direction like FIGS. 13A and 13B.

A transistor 60b illustrated in FIGS. 13C and 13D is different from the transistor 60a in FIGS. 13A and 13B in that the insulator 77 is provided over the insulator 64, the conductor 68a, and the conductor 68b; and that the insulator 66c, the insulator 72, and the conductor 74 are embedded in an opening formed in the insulator 77, the conductor 68a, and the conductor 68b. For the other structures of the transistor 60b in FIGS. 13C and 13D, the structures of the transistor 60a in FIGS. 13A and 13B can be referred to.

Furthermore, in the transistor 60b, an insulator 76 may be provided over the insulator 77, and the insulator 78 may be provided over the insulator 76. Any of the insulators that can be used as the insulator 77 can be used as the insulator 76. The transistor 60b does not include the insulator 79; however, the structure is not limited thereto, and the insulator 79 may be provided.

Note that the structure of the transistor 60b is not limited to that illustrated in FIGS. 13C and 13D. For example, the insulator 66c, the insulator 72, and the conductor 74 may each have a tapered shape in which the side surface is inclined at an angle larger than or equal to 300 and smaller than 90° to the top surface of the semiconductor 66b.

<Structure of Capacitor>

Figure 14A:
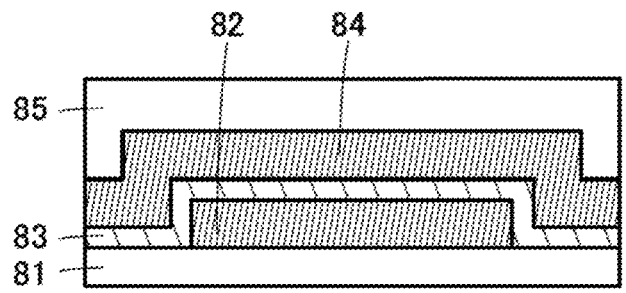
FIGS. 14A to 14C are cross-sectional views each illustrating a structure of a semiconductor device of one embodiment of the present invention.

FIG. 14A illustrates a structure example of a capacitor 80a. The capacitor 80a includes a conductor 82, an insulator 83, and a conductor 84. As illustrated in FIG. 14A, the conductor 82 is provided over an insulator 81, the insulator 83 covers the conductor 82, the conductor 84 covers the insulator 83, and an insulator 85 is provided over the conductor 84.

Here, it is preferable that the insulator 83 be in contact with a side surface of the conductor 82, and that the conductor 84 be in contact with a side surface of a projecting portion of the insulator 83. Accordingly, not only the top surface of the conductor 82 but also the side surface of the conductor 82 can function as a capacitor, resulting in an increased capacitance value.

The conductor 82 and conductor 84 may each be formed to have a single-layer structure or a layered structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used. The conductor 82 and the conductor 84 can be formed by a sputtering method, a CVD method, an MBE method, a PLD method, an ALD method, or the like.

For example, an insulator containing one or more of aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used as the insulator 83. Silicon oxynitride may be stacked over aluminum oxide, for example. Furthermore, a high-k material such as hafnium silicate (HfSi$_x$O$_y$ (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), hafnium oxide, or yttrium oxide is preferably used. In the case where a high-k material is used as the insulator 83, the capacitance can be increased by heat treatment in some cases. The use of such a high-k material enables sufficient capacitance of the capacitor 80a to be ensured even if the insulator 83 has a large thickness. The insulator 83 having a large thickness can prevent leakage current generated between the conductor 82 and the conductor 84. The insulator 83 can be formed by a sputtering method, a CVD method, an MBE method, a PLD method, an ALD method, or the like.

As the insulator 81 and insulator 85, any of the insulators that can be used as the insulator 77 may be used. The insulator 85 may be formed using an organosilane gas (e.g., tetra-ethyl-ortho-silicate (TEOS)).

Next, modification examples of the capacitor 80a are described with reference to FIGS. 14B and 14C.

Figure 14B:
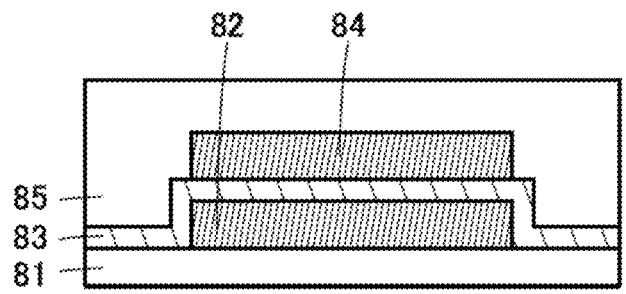

A capacitor 80b illustrated in FIG. 14B is different from the capacitor 80a illustrated in FIG. 14A in that the conductor 84 overlaps the top surface of the conductor 82 without being in contact with the side surface of the projecting portion of the insulator 83. Note that although an edge portion of the side surface of the conductor 84 is aligned with an edge portion of the side surface of the conductor 82 in FIG. 14B, the capacitor 80b is not limited thereto.

Figure 14C:
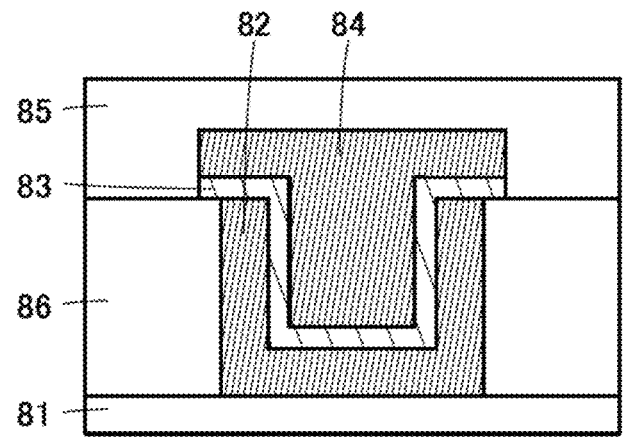

A capacitor 80c illustrated in FIG. 14C is different from the capacitor 80a illustrated in FIG. 14A in that an insulator 86 with an opening is provided over the insulator 81, and that the conductor 82 is provided in the opening. Here, the opening in the insulator 86 and the top surface of the insulator 81 can be regarded as forming a groove portion, and the conductor 82 is preferably provided along the groove portion. Furthermore, as in FIG. 14C, the insulator 86 and the conductor 82 may be formed so that their top surfaces are substantially aligned with each other.

The insulator 83 is provided over the conductor 82, and the conductor 84 is provided over the insulator 83. Here, in the groove portion, the conductor 84 has a region which faces the conductor 82 with the insulator 83 provided therebetween. In addition, the insulator 83 is preferably provided to cover the top surface of the conductor 82. When the insulator 83 is provided as described above, leakage current can be prevented from flowing between the conductor 82 and the conductor 84. In addition, the end portions of the side surfaces of the insulator 83 may be substantially aligned with the end portions of the side surfaces of the conductor 84. In this manner, the capacitor 80c preferably has a concave shape, a cylinder shape, or the like. Note that in the capacitor 80c, the shapes of the top surfaces of the conductor 82, the insulator 83, and the conductor 84 may each be a polygonal shape other than the quadrangular shape or a circular shape including an elliptical shape.

<Structure of Transistor Formed in Semiconductor Substrate>

Figure 15A:
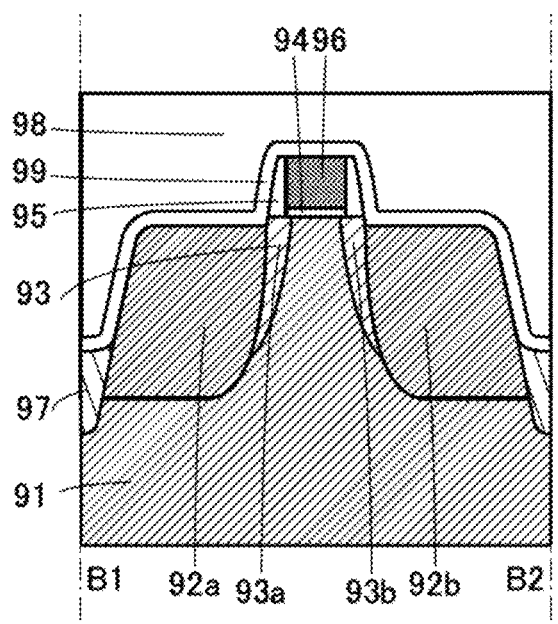
FIGS. 15A to 15D are cross-sectional views illustrating structures of a semiconductor device of an embodiment of the present invention.
Figure 15B:
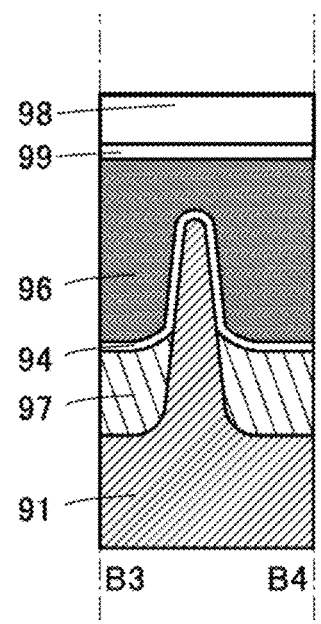

FIGS. 15A and 15B illustrate a structure example of a transistor 90a included in the element layer including the semiconductor substrate. FIG. 15A is a cross-sectional view of the transistor 90a in a channel length direction B1-B2, and FIG. 15B is a cross-sectional view of the transistor 90a in a channel width direction B3-B4.

A plurality of projecting portions are formed on the semiconductor substrate 91, and an element separation region 97 is formed in groove portions (also referred to as trenches) between the plurality of projecting portions. An insulator 94 is formed over the semiconductor substrate 91 and the element separation region 97, and a conductor 96 is formed over the insulator 94. An insulator 95 is formed in contact with a side surface of the insulator 94 and a side surface of the conductor 96. An insulator 99 is provided over the semiconductor substrate 91, the element separation region 97, the insulator 95, and the conductor 96; and an insulator 98 is provided thereover.

As illustrated in FIG. 15A, a low-resistance region 93a and a low-resistance region 93b are formed in the projecting portion of the semiconductor substrate 91 so that at least part of the insulator 95 overlaps the low-resistance region 93a and the low-resistance region 93b; and a low-resistance region 92a and a low-resistance region 92b are formed on the outer side than the low-resistance region 93a and the low-resistance region 93b. Note that it is preferable that the low-resistance region 92a and the low-resistance region 92b have lower resistances than the low-resistance region 93a and the low-resistance region 93b.

Here, the conductor 96 functions as a gate of the transistor 90a, the insulator 94 functions as a gate insulating film of the transistor 90a, the low-resistance region 92a functions as one of a source and a drain of the transistor 90a, and the low-resistance region 92b functions as the other of the source and the drain of the transistor 90a. The insulator 95 functions as a side wall insulating film of the transistor 90a. The low-resistance region 93a and the low-resistance region 93b function as lightly doped drain (LDD) regions of the transistor 90a. In the projecting portion of the semiconductor substrate 91, a region which is positioned under the conductor 96 and between the low-resistance regions 93a and the low-resistance region 93b functions as a channel formation region of the transistor 90a.

As illustrated in FIG. 15B, in the transistor 90a, the conductor 96 overlaps side and top portions of the projecting portion in the channel formation region with the insulator 94 positioned therebetween, so that carriers flow in a wide area including the side and top portions of the channel formation region. Therefore, an area over the substrate occupied by the transistor 90a can be reduced, and the number of transferred carriers in the transistor 90a can be increased. As a result, the on-state current and field-effect mobility of the transistor 90a are increased. Suppose the length of the projecting portion of the channel formation region in the channel width direction (i.e., channel width) is W and the height of the projecting portion of the channel formation region is T. When the aspect ratio that corresponds to the ratio of the height T of the projecting portion to the channel width W (T/W) is high, a region where carrier flows becomes wider. Thus, the on-state current of the transistor 90a is further increased and the field-effect mobility of the transistor 90a is further increased. For example, when the transistor 90a is formed using a bulk semiconductor substrate 91, the aspect ratio is desirably 0.5 or more, further desirably 1 or more.

The transistor 90a illustrated in FIGS. 15A and 15B is subjected to element isolation by a shallow trench isolation (STI) method; however, the semiconductor device in this embodiment is not limited thereto.

As the semiconductor substrate 91, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 91. A semiconductor substrate in which an insulator region is provided in the above semiconductor substrate, e.g., a silicon on insulator (SOI) substrate or the like may be used as the semiconductor substrate 91.

As the semiconductor substrate 91, for example, a semiconductor substrate including impurities imparting p-type conductivity is used. However, a semiconductor substrate including impurities imparting n-type conductivity may be used as the semiconductor substrate 91. Alternatively, the semiconductor substrate 91 may be an i-type semiconductor substrate.

The low-resistance region 92a and the low-resistance region 92b provided in the semiconductor substrate 91 preferably contain an element that imparts n-type conductivity, such as phosphorus or arsenic, or an element that imparts p-type conductivity, such as boron or aluminum. Similarly, the low-resistance region 93a and the low-resistance region 93b also preferably contain an element that imparts n-type conductivity, such as phosphorus or arsenic, or an element that imparts p-type conductivity, such as boron or aluminum. Since the low-resistance region 93a and the low-resistance region 93b preferably serve as LDD regions, the concentrations of the element imparting a conductivity type contained in the low-resistance region 93a and the low-resistance region 93b are preferably lower than those of the element imparting a conductivity type contained in the low-resistance region 92a and the low-resistance region 92b. Note that the low-resistance region 92a and the low-resistance region 92b may be formed using silicide.

For example, an insulator containing one or more of aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used as the insulator 94 and the insulator 95. A high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added (HfAl$_x$O$_y$N$_z$ (x>0, y>0, z>0)), hafnium oxide, or yttrium oxide may be used. The insulator 94 and the insulator 95 can be formed by a sputtering method, a CVD method, an MBE method, a PLD method, an ALD method, or the like.

It is preferable that the conductor 96 be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Still alternatively, a stacked-layer structure including a film of metal nitride and a film of any of the above metals may be used for the conductor 96. As a metal nitride, tungsten nitride, molybdenum nitride, or titanium nitride can be used. When the metal nitride film is provided, adhesiveness of the metal film can be increased; thus, separation can be prevented. The conductor 96 can be formed by a sputtering method, a CVD method, an MBE method, a PLD method, an ALD method, or the like.

The insulator 98 and the insulator 99 may each be formed to have, for example, a single-layer structure or a stacked-layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 98 can be formed by a sputtering method, a CVD method, an MBE method, a PLD method, an ALD method, or the like.

Alternatively, the insulator 98 can be formed using silicon carbonitride, silicon oxycarbide, or the like. Further alternatively, undoped silicate glass (USG), boron phosphorus silicate glass (BPSG), borosilicate glass (BSG), or the like can be used. USG, BPSG, and the like may be formed by an atmospheric pressure CVD method. Alternatively, hydrogen silsesquioxane (HSQ) or the like may be applied by a coating method.

Here, the insulator 99 preferably contains hydrogen in some cases. For example, silicon nitride containing hydrogen can be used as the insulator 99. When the insulator 99 contains hydrogen, defects and the like in the semiconductor substrate 91 are reduced and characteristics of the transistor 90*a* are improved in some cases. For example, in the case where the semiconductor substrate 91 is formed using a material containing silicon, a defect such as a dangling bond in the silicon can be terminated by hydrogen.

Figure 15C:
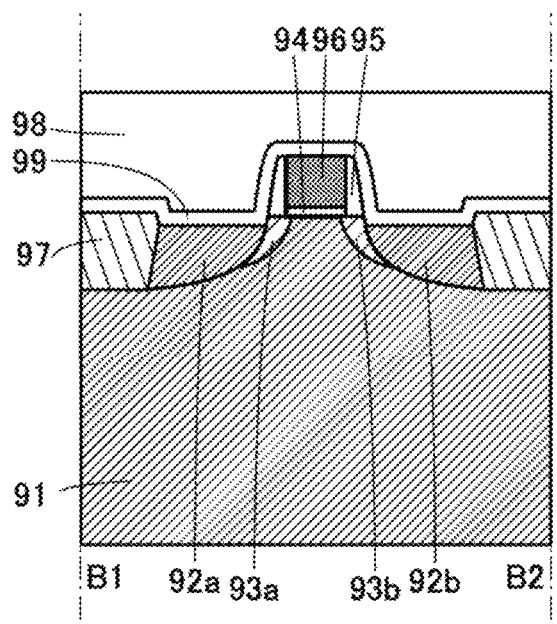
Figure 15D:
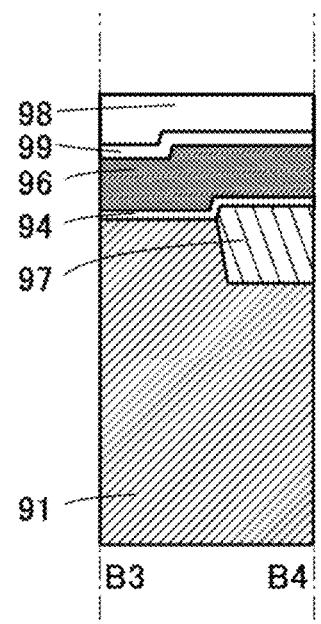

Next, a modification example of the transistor 90*a* is described with reference to FIGS. 15C and 15D. FIGS. 15C and 15D show a cross-sectional view of the transistor 90*a* in the channel length direction and that in the channel width direction, like FIGS. 15A and 15B.

A transistor 90*b* illustrated in FIGS. 15C and 15D is different from the transistor 90*a* illustrated in FIGS. 15A and 15B in that no projecting portion is formed on the semiconductor substrate 91. For the other structures of the transistor 90*b* in FIGS. 15C and 15D, the structures of the transistor 90*a* in FIGS. 15A and 15B can be referred to.

Although the insulator 94 is provided in contact with the bottom surface of the conductor 96 in each of the transistor 90*a* and the transistor 90*b*, the semiconductor device described in this embodiment is not limited thereto. For example, the insulator 94 may be in contact with the bottom and side surfaces of the conductor 96.

<Structure Example of Semiconductor Device>

Figure 16:
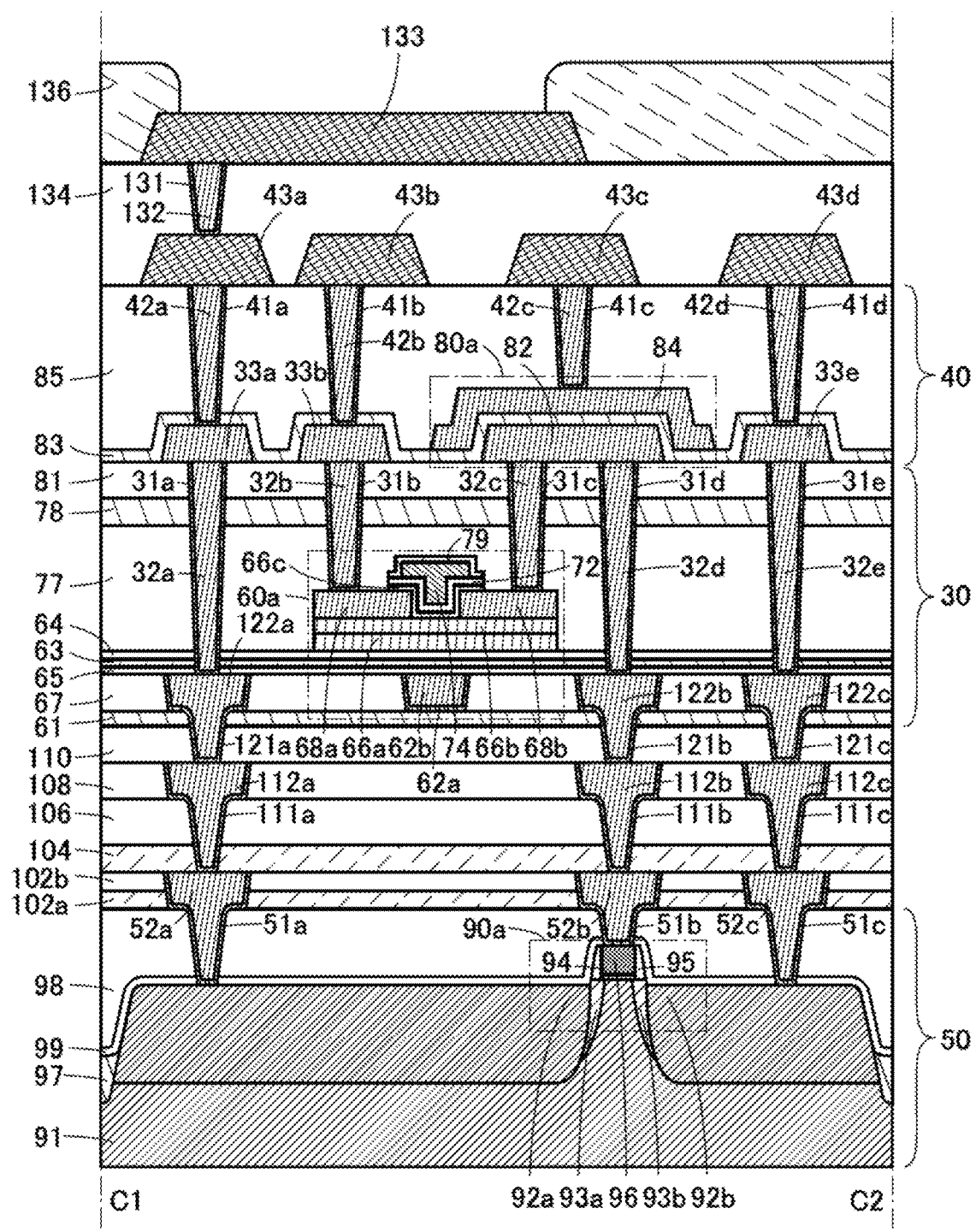
FIG. 16 is a cross-sectional view illustrating a structure of a semiconductor device of one embodiment of the present invention.

FIG. 16 illustrates a structure example of a semiconductor device in which an element layer (also referred to as an element layer 30) which includes an oxide semiconductor is provided over an element layer (also referred to as an element layer 50) which includes a semiconductor substrate, and an element layer (also referred to as an element layer 40) which includes a capacitor is provided over the element layer 30. FIG. 16 is a cross-sectional view taken along a channel length C1-C2 of the transistor 60*a* and the transistor 90*a*. Note that although the channel length direction of the transistor 60*a* is parallel to that of the transistor 90*a* in FIG. 16, the directions are not limited thereto and can be set appropriately.

Since the transistor 90*a* illustrated in FIG. 15A is provided in the element layer 50, the above description can be referred to for the semiconductor substrate 91, the element separation region 97, the insulator 98, the insulator 99, the insulator 94, the insulator 95, the conductor 96, the low-resistance region 93*a*, the low-resistance region 93*b*, the low-resistance region 92*a*, and the low-resistance region 92*b*.

Part of a conductor 51*a*, part of a conductor 52*a*, part of a conductor 51*b*, part of a conductor 52*b*, part of a conductor 51*c*, and part of a conductor 52*c* which function as plugs are provided in the element layer 50. The conductor 51*a* and the conductor 52*a* are formed in an opening formed in the insulator 98 and the insulator 99 so that the bottom surface of the conductor 51*a* is in contact with the low-resistance region 92*a*. The conductor 51*b* and the conductor 52*b* are formed in an opening formed in the insulator 98 so that the bottom surface of the conductor 51*b* is in contact with the conductor 96. The conductor 51*c* and the conductor 52*c* are formed in an opening formed in the insulator 98 and the insulator 99 so that the bottom surface of the conductor 51*c* is in contact with the low-resistance region 92*b*.

Here, the conductors 51*a* to 51*c* each can have a structure similar to that of the conductor 20*a* illustrated in FIGS. 4C and 4D. The conductors 52*a* to 52*c* each can have a structure similar to that of the conductor 21*a* illustrated in FIGS. 4C and 4D. However, the structures are not limited thereto; the plug and the wiring may be formed separately by a single damascene method or the like, for example.

As illustrated in FIG. 16, the conductors 51*a* to 51*c* and the conductors 52*a* to 52*c* preferably have a stacked-layer structure. For the conductors 51*a* to 51*c*, for example, a single layer or a stacked-layer including any of titanium, tantalum, titanium nitride, tantalum nitride, and the like may be used. The use of a metal nitride such as tantalum nitride or titanium nitride, in particular tantalum nitride, for the conductors 51*a* to 51*c* can inhibit impurities such as hydrogen and water which are included in the element layer 50 and the like from diffusing into the conductors 51*a* to 51*c*, which prevents the impurities from entering the upper layer. These apply not only to the conductors 51*a* to 51*c* but also to other conductors which functions as plugs and wirings. Therefore, when conductors 111*a* to 111*c* and conductors 121*a* to 121*c*, which are located below the element layer 30, have a stacked-layer structure, and the bottom layer of the stacked-layer structure is formed using a metal nitride such as tantalum nitride or titanium nitride, in particular tantalum nitride, impurities such as hydrogen and water can be prevented from diffusing into the element layer 30 located over these conductors. Such a structure makes the oxide semiconductor included in the element layer 30 a highly purified intrinsic or substantially highly purified intrinsic oxide semiconductor.

An insulator 102*a* and an insulator 102*b* are provided over the insulator 98. Part of the conductor 51*a*, part of the conductor 52*a*, part of the conductor 51*b*, part of the conductor 52*b*, part of the conductor 51*c*, and part of the conductor 52*c* which function as plugs or the like are provided to be embedded in openings formed in the insulator 102a and the insulator 102b. For example, in the case where a metal which tends to diffuse, e.g., copper, is used for the conductors 52a to 52c, an insulator which is less permeable to copper, such as silicon nitride or silicon nitride carbide, is used, in which case impurities such as copper can be prevented from diffusing into the transistor 90a. In addition, an insulator which has a lower hydrogen concentration than the insulator 98 or the like is preferably used as the insulator 102a. The dielectric constant of the insulator 102b is preferably lower than that of the insulator 102a. Although the insulator 102b and the insulator 102a are stacked in FIG. 16, the structure is not limited thereto, and a single-layer insulator may be provided instead.

An insulator 104 is provided over the insulator 102b, an insulator 106 is provided over the insulator 104, and an insulator 108 is provided over the insulator 106. Any of the insulators that can be used as the insulator 98 may be used for the insulator 102a, the insulator 102b, the insulator 104, the insulator 106, and the insulator 108. Any of the insulator 102a, the insulator 102b, the insulator 104, the insulator 106, and the insulator 108 preferably has a function of blocking oxygen and impurities such as hydrogen. The insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, silicon nitride may be used.

For example, in the case where a metal which tends to diffuse, e.g., copper, is used for the conductors 52a to 52c, an insulator which is less permeable to copper, such as silicon nitride or silicon nitride carbide, is used as the insulator 104, in which case impurities such as copper can be prevented from diffusing into the oxide semiconductor film included in the element layer 30.

Part of the conductor 111a, part of a conductor 112a, part of the conductor 111b, part of a conductor 112b, part of the conductor 111c, and part of a conductor 112c which function as plugs are provided in the insulator 104 and the insulator 106. In addition, part of the conductor 111a, part of the conductor 112a, part of the conductor 111b, part of the conductor 112b, part of the conductor 111c, and part of the conductor 112c which function as wirings are provided in the insulator 108. The conductor 111a and the conductor 112a are formed in an opening formed in the insulator 104, the insulator 106, and the insulator 108 so that the bottom surface of the conductor 111a is in contact with the conductor 52a. The conductor 111b and the conductor 112b are formed in an opening formed in the insulator 104, the insulator 106, and the insulator 108 so that the bottom surface of the conductor 111b is in contact with the conductor 52b. The conductor 111c and the conductor 112c are formed in an opening formed in the insulator 104, the insulator 106, and the insulator 108 so that the bottom surface of the conductor 111c is in contact with the conductor 52c.

Here, the conductors 111a to 111c each can have a structure similar to that of the conductor 20a illustrated in FIGS. 4C and 4D. The conductors 112a to 112c each can have a structure similar to that of the conductor 21a illustrated in FIGS. 4C and 4D. However, the structures are not limited thereto; the plug and the wiring may be formed separately by a single damascene method or the like, for example.

An insulator 110 is provided over the insulator 108. For The insulator 110, any of the insulators that can be used as the insulator 106 may be used.

Since the transistor 60a illustrated in FIG. 13A is provided in the element layer 30 over the insulator 110, the above description can be referred to for the insulator 61, the insulator 67, the conductor 62a, the conductor 62b, the insulator 65, the insulator 63, the insulator 64, the insulator 66a, the semiconductor 66b, the insulator 66c, the conductor 68a, the conductor 68b, the insulator 72, the conductor 74, the insulator 79, the insulator 77, and the insulator 78.

Part of the conductor 121a, part of a conductor 122a, part of the conductor 121b, part of a conductor 122b, part of the conductor 121c, and part of a conductor 122c which function as plugs are provided in the insulator 61 and the insulator 110. In addition, part of the conductor 121a, part of the conductor 122a, part of the conductor 121b, part of the conductor 122b, part of the conductor 121c, and part of the conductor 122c which function as wirings are provided in the insulator 67. The conductor 121a and the conductor 122a are formed in an opening formed in the insulator 67, the insulator 61, and the insulator 110 so that the bottom surface of the conductor 121a is in contact with the conductor 112a. The conductor 121b and the conductor 122b are formed in an opening formed in the insulator 67, the insulator 61, and the insulator 110 so that the bottom surface of the conductor 121b is in contact with the conductor 112b. The conductor 121c and the conductor 122c are formed in an opening formed in the insulator 67, the insulator 61, and the insulator 110 so that the bottom surface of the conductor 121c is in contact with the conductor 112c.

Here, the conductors 121a to 121c each can have a structure similar to that of the conductor 20a illustrated in FIGS. 4C and 4D. The conductors 122a to 122c each can have a structure similar to that of the conductor 21a illustrated in FIGS. 4C and 4D.

The conductor 62a and the conductor 62b are formed in the same layer as the conductor 121a, the conductor 122a, the conductor 121b, the conductor 122b, the conductor 121c, and the conductor 122c. Details of a process for forming the conductor 62a, the conductor 62b, the conductor 121a, and the conductor 122a at the same time are described later.

As illustrated in FIG. 16, the semiconductor substrate 91 and the semiconductor 66b are separated by the insulator 61 and the conductors 121a to 121c. Since the conductors 121a to 121c each have a function of blocking diffusion of hydrogen and water, they can prevent impurities such as hydrogen and water included in the element layer 50 and the like from diffusing into the semiconductor 66b through the via holes formed in the insulator 61 or the conductors 122a to 122c that function as plugs.

Figure 17:
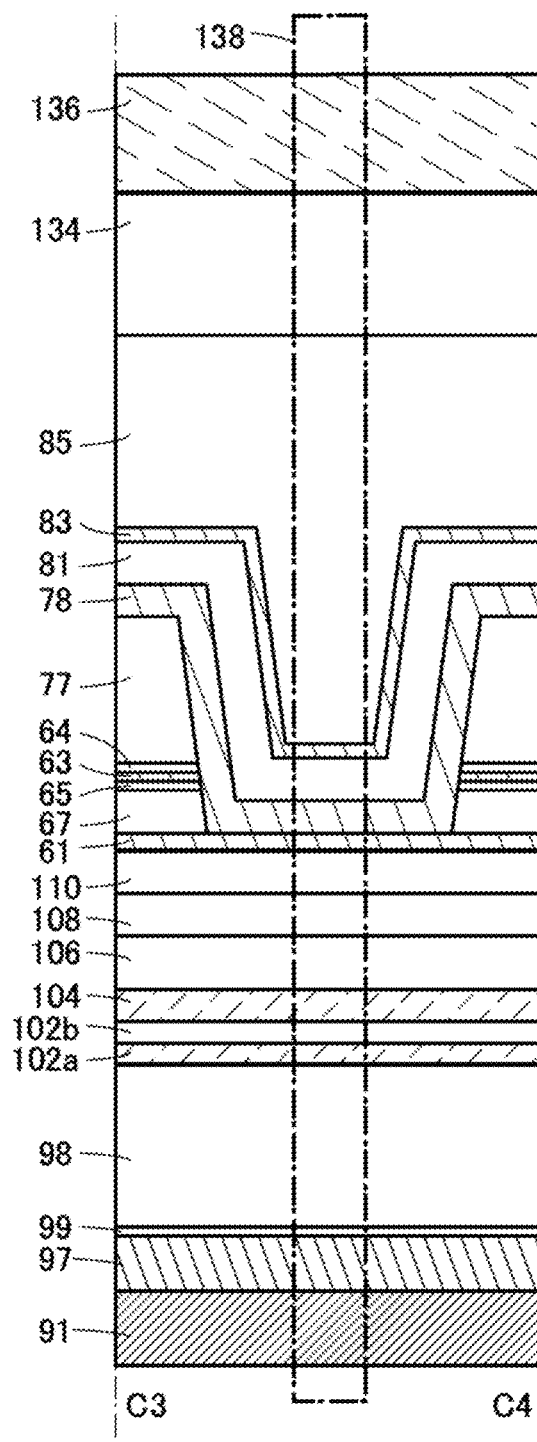
FIG. 17 is a cross-sectional view illustrating a structure of a semiconductor device of one embodiment of the present invention.

Here, FIG. 17 illustrates a cross-sectional view corresponding to a C3-C4 cross section in the vicinity of a scribe line 138. As illustrated in FIG. 17, it is preferable that an opening be formed in the insulator 67, the insulator 65, the insulator 63, the insulator 64, and the insulator 77 in the vicinity of a region overlapping the scribe line 138, and that the insulator 78 be formed to cover side surfaces of the insulators 67, 65, 63, 64, and 77. Furthermore, the insulator 78 is preferably in contact with the insulator 61 in the opening.

Such a shape enables the insulator 78 and the insulator 61 to cover even the side surfaces of the insulators 67, 65, 63, 64, and 77. Since the insulator 78 and the insulator 61 each have a function of blocking hydrogen and water, even when the semiconductor device described in this embodiment is scribed, hydrogen or water can be prevented from entering the insulators 67, 65, 63, 64, 77 from their side surfaces and diffusing into the transistor 60a.

In addition, excess oxygen can be supplied to the insulator 77 at the time of forming the insulator 78, as described above. At that time, the insulator 78 covering the side surface of the insulator 77 inhibits diffusion of oxygen into the outside of the insulator 78, whereby the insulator 77 can be filled with oxygen and oxygen can be supplied from the insulator 77 to the insulator 66a, the semiconductor 66b, and the insulator 66c. The oxygen can reduce oxygen vacancies which are to be defects in the insulator 66a, the semiconductor 66b, and the insulator 66c. As a result, the semiconductor 66b can be an oxide semiconductor with a low density of defect states and stable characteristics.

The insulator 81 is provided over the insulator 78. The insulator 81 can be formed using any of the insulators that can be used as the insulator 77.

Conductors 31a and 32a, conductors 31b and 32b, conductors 31c and 32c, conductors 31d and 32d, and conductors 31e and 32e which function as plugs are provided in the insulators 81, 78, 77, 65, 63, and 64. The conductor 31a and the conductor 32a are formed in an opening formed in the insulator 81, the insulator 78, the insulator 77, the insulator 64, the insulator 63, and the insulator 65 so that the bottom surface of the conductor 31a is in contact with the conductor 122a. The conductor 31b and the conductor 32b are formed in an opening formed in the insulator 81, the insulator 78, and the insulator 77 so that the bottom surface of the conductor 31b is in contact with the conductor 68a. The conductor 31c and the conductor 32c are formed in an opening formed in the insulator 81, the insulator 78, and the insulator 77 so that the bottom surface of the conductor 31c is in contact with the conductor 68b. The conductor 31d and the conductor 32d are formed in an opening formed in the insulator 81, the insulator 78, the insulator 77, the insulator 64, the insulator 63, and the insulator 65 so that the bottom surface of the conductor 31d is in contact with the conductor 122b. The conductor 31e and the conductor 32e are formed in an opening formed in the insulator 81, the insulator 78, the insulator 77, the insulator 64, the insulator 63, and the insulator 65 so that the bottom surface of the conductor 31e is in contact with the conductor 122c.

Here, the conductors 31a to 31e may be formed using any of the conductors that can be used as the conductor 20a illustrated in FIGS. 4C and 4D. The conductors 31a to 31e having such a structure can fill via holes formed in the insulator 78. Since the conductors 31a to 31e each have a function of blocking diffusion of hydrogen and water, they can prevent impurities such as hydrogen and water from diffusing into the transistor 60a through the conductors 32a to 32e and the via holes formed in the insulator 78. Here, the conductors 32a to 32e are formed using a conductor that can be used as the conductor 21a illustrated in FIGS. 4C and 4D.

A conductor 33a, a conductor 33b, the conductor 82, and a conductor 33e are formed over the insulator 81. Here, the conductor 82 serves as one of electrodes of the capacitor 80a of the element layer 40. The conductor 33a is in contact with top surfaces of the conductors 31a and 32a; the conductor 33b is in contact with top surfaces of the conductors 31b and 32b; the conductor 82 is in contact with top surfaces of the conductors 31c, 32c, 31d, and 32d; and the conductor 33e is in contact with top surfaces of the conductors 31e and 32e.

Here, the conductors 31a, 33b, and 31e may be formed using any of the conductors that can be used as the conductor 82.

Although not illustrated in the cross-sectional view of FIG. 16, wirings and plugs that are connected to the conductor 74 and the conductor 62b may be separately provided.

Since the capacitor 80a illustrated in FIG. 14A is provided in the element layer 40, the above description can be referred to for the insulator 81, the conductor 82, the insulator 83, the conductor 84, and the insulator 85.

Conductors 41a and 42a, conductors 41b and 42b, conductors 41c and 42c, and conductors 41d and 42d which function as plugs are provided in the element layer 40. The conductor 41a and the conductor 42a are formed in an opening formed in the insulator 83 and the insulator 85 so that the bottom surface of the conductor 41a is in contact with the conductor 33a. The conductor 41b and the conductor 42b are formed in an opening formed in the insulator 83 and the insulator 85 so that the bottom surface of the conductor 41b is in contact with the conductor 33b. The conductor 41c and the conductor 42c are formed in an opening formed in the insulator 85 so that the bottom surface of the conductor 41c is in contact with the conductor 84. The conductor 41d and the conductor 42d are formed in an opening formed in the insulator 83 and the insulator 85 so that the bottom surface of the conductor 41d is in contact with the conductor 33e.

Here, the conductors 41a to 41d may be formed using any of the conductors that can be used as the conductor 20a illustrated in FIGS. 4C and 4D. The conductors 42a to 42d may be formed using any of the conductors that can be used as the conductor 21a illustrated in FIGS. 4C and 4D.

Conductors 43a to 43d functioning as wirings are formed over the insulator 85. The conductor 43a is in contact with top surfaces of the conductors 41a and 42a; the conductor 43b is in contact with top surfaces of the conductors 41b and 42b; the conductor 43c is in contact with top surfaces of the conductors 41c and 42c; and the conductor 43d is in contact with top surfaces of the conductors 41d and 42d.

Here, the conductors 43a to 43d are formed using any of the conductors that can be used as the conductor 33a, the conductor 33b, and the conductor 33e. Since the conductors 43a to 43d are formed over the element layer 30, high-temperature heat treatment is not necessary after formation of the conductors 43a to 43d, in some cases. Accordingly, the conductors 43a to 43d are formed using a metal material which has low heat resistance and low resistance, such as aluminum or copper, in which case wiring resistance can be reduced.

An insulator 134 is formed over the insulator 85 to cover the conductors 43a to 43d. The insulator 134 can be formed using any of the insulators that can be used as the insulator 85.

A conductor 131 and a conductor 132 which function as a plug is provided in the insulator 134. The conductor 131 and the conductor 132 are formed in an opening of the insulator 134 so that the bottom surface of the conductor 131 is in contact with the conductor 43a.

Here, the conductor 131 may be formed using any of the conductors that can be used as the conductor 20a illustrated in FIGS. 4C and 4D. The conductor 132 may be formed using any of the conductors that can be used as the conductor 21a illustrated in FIGS. 4C and 4D.

A conductor 133 functioning as a wiring is formed over the insulator 134. The conductor 133 is in contact with top surfaces of the conductors 131 and 132. Here, the conductor 133 is formed using any of the conductors that can be used as the conductor 33a, the conductor 33b, and the conductor 33e.

An insulator 136 with an opening is formed over the insulator 134 so that the opening is located over the conductor 133. Any of the insulators that can be used as the insulator 134 may be used as the insulator 136. An organic insulating film such as a polyimide film may be used as the insulator 136.

Although the wirings and the plugs in the layers above the element layer 30 are separately formed in the semiconductor device illustrated in FIG. 16, the semiconductor device of one embodiment of the present invention is not limited thereto. For example, as illustrated in FIG. 18, the wirings and plugs in the layers above the element layer 30 can also be integrally formed by, for example, the method illustrated in FIGS. 1A to 1D, FIGS. 2A to 2D, FIGS. 3A to 3D, and FIGS. 4A to 4D.

Figure 18:
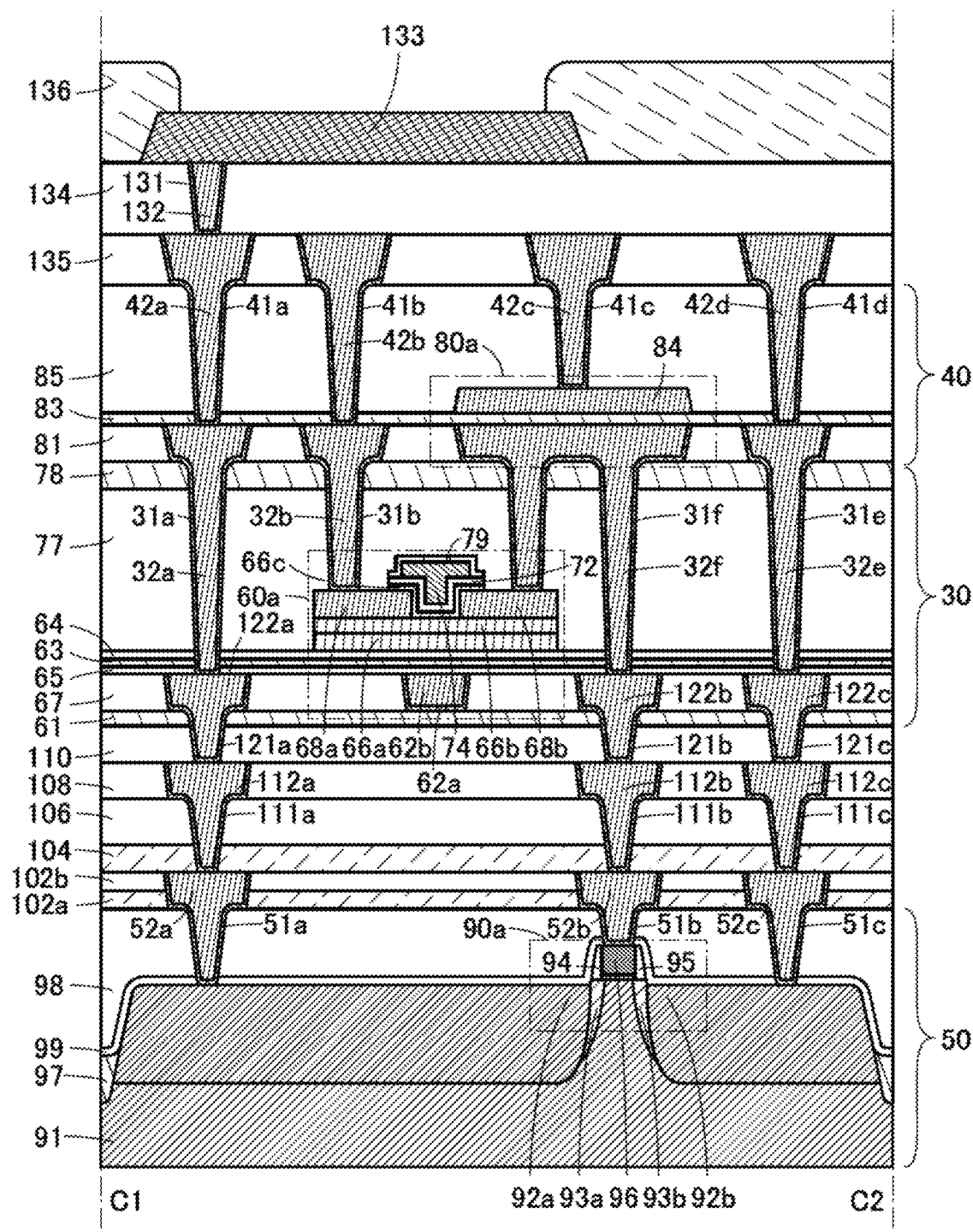
FIG. 18 is a cross-sectional view illustrating a structure of a semiconductor device of one embodiment of the present invention.

The conductor 31a and the conductor 32a illustrated in FIG. 18 correspond to the conductor 31a, the conductor 32a, and the conductor 33a illustrated in FIG. 16. The conductor 31b and the conductor 32b illustrated in FIG. 18 correspond to the conductor 31b, the conductor 32b, and the conductor 33b illustrated in FIG. 16. A conductor 31f and a conductor 32f illustrated in FIG. 18 correspond to the conductor 31c, the conductor 32c, the conductor 31d, the conductor 32d, and the conductor 82 illustrated in FIG. 16. The conductor 31e and the conductor 32e illustrated in FIG. 18 correspond to the conductor 31e, the conductor 32e, and the conductor 33e illustrated in FIG. 16.

Note that part of the conductor 31a, part of the conductor 31b, part of the conductor 31f, part of the conductor 31e, part of the conductor 32a, part of the conductor 32b, part of the conductor 32f, and part of the conductor 32e are embedded in openings provided in the insulator 81 in FIG. 18.

The conductor 41a and the conductor 42a illustrated in FIG. 18 correspond to the conductor 41a, the conductor 42a, and the conductor 43a illustrated in FIG. 16. The conductor 41b and the conductor 42b illustrated in FIG. 18 correspond to the conductor 41b, the conductor 42b, and the conductor 43b illustrated in FIG. 16. The conductor 41c and the conductor 42c illustrated in FIG. 18 correspond to the conductor 41c, the conductor 42c, and the conductor 43c illustrated in FIG. 16. The conductor 41d and the conductor 42d illustrated in FIG. 18 correspond to the conductor 41d, the conductor 42d, and the conductor 43d illustrated in FIG. 16.

An insulator 135 is provided between the insulator 85 and the insulator 134. In FIG. 18, part of the conductor 41a, part of the conductor 41b, part of the conductor 41c, part of the conductor 41d, part of the conductor 42a, part of the conductor 42b, part of the conductor 42c, and part of the conductor 42d are embedded in openings provided in the insulator 135 in FIG. 18. The insulator 135 can be formed using any of the materials that can be used as the insulator 134.

A method for forming the wiring and the plug (the conductor 121a and the conductor 122a) and the back gate (the conductor 62a and the conductor 62b) in parallel is described using the structure in FIG. 16 as an example, with reference to cross-sectional views illustrated in FIGS. 19A and 19B, FIGS. 20A and 20B, FIGS. 21A and 21B, and FIGS. 22A and 22B. FIGS. 19A and 19B, FIGS. 20A and 20B, FIGS. 21A and 21B, and FIGS. 22A and 22B each illustrate a cross-sectional view taken along the direction of C5-C6 that is parallel to the channel length direction C1-C2 of the transistor 60a. Note that FIGS. 19A and 19B, FIGS. 20A and 20B, FIGS. 21A and 21B, and FIGS. 22A and 22B are shown in an exaggerated way by changing the aspect ratio from that of FIG. 16.

The insulator 108 with an opening in which the conductor 112a and the conductor 111a are provided is formed, and an insulator 110a is formed thereover. The insulator 110a is to be the insulator 110 after an opening is formed. Here, the insulator 110a corresponds to the insulator 13 illustrated in FIGS. 1A to 1D.

An insulator 61a is formed over the insulator 110a. Any of the above-described insulators that can be used as the insulator 61 may be used as the insulator 61a. For example, a stack in which aluminum oxide formed by an ALD method is stacked over aluminum oxide formed by a sputtering method is preferably used as the insulator 61a. The use of the aluminum oxide formed by an ALD method can prevent formation of a pin hole, resulting in further improvement in the blocking property of the insulator 61 against hydrogen and water. The insulator 61a is to be the insulator 61 after an opening is formed. Here, the insulator 61a corresponds to the insulator 14 illustrated in FIGS. 1A to 1D.

An insulator 67a is formed over the insulator 61a. Any of the above-described insulators that can be used as the insulator 67 may be used as the insulator 67a. The insulator 67a is to be the insulator 67 after openings are formed. Here, the insulator 67a corresponds to the insulator 15 illustrated in FIGS. 1A to 1D.

Next, a material of a hard mask 146 is deposited over the insulator. Here, the material of the hard mask 146 may be a conductor such as a metal material, or an insulator. For example, titanium, tantalum, tungsten, titanium nitride, tantalum nitride, or the like may be used. In addition, the material of the hard mask 146 may be either a single layer or a stack of an insulator and a conductor. The material of the hard mask 146 can be deposited by a sputtering method, a CVD method, an MBE method, a PLD method, an ALD method, or the like.

Figure 19A:
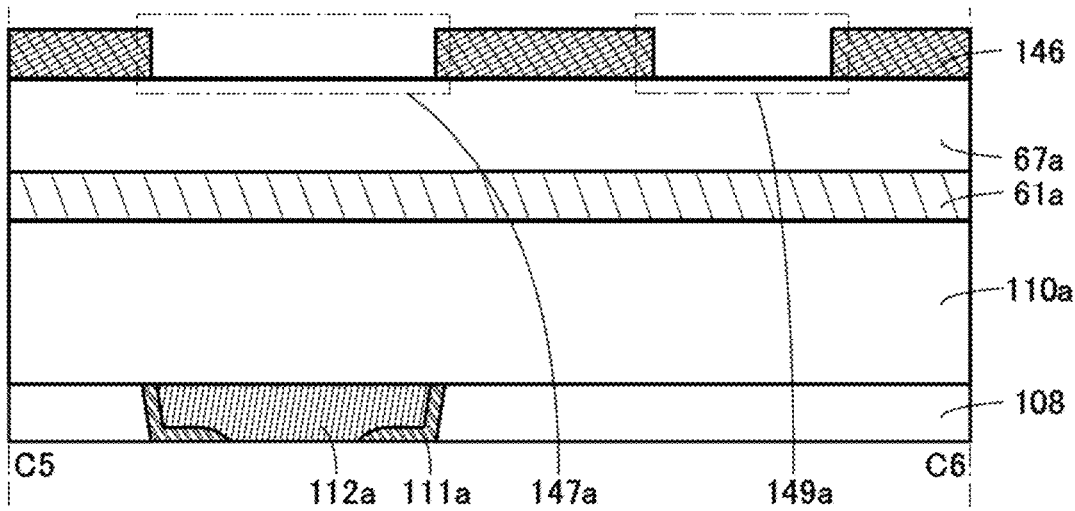
FIGS. 19A and 19B are cross-sectional views illustrating a method for manufacturing a semiconductor device of one embodiment of the present invention.

Next, the material of the hard mask 146 is etched using a resist mask formed by lithography or the like, whereby the hard mask 146 with an opening 147a and an opening 149a is formed (see FIG. 19A). Here, the etching is performed until a top surface of the insulator 67a is exposed in the opening 147a and the opening 149a. Note that the hard mask 146 corresponds to the hard mask 16 in FIGS. 1A to 1D.

The opening 147a corresponds to an opening 147fb to be formed in a later step, i.e., a groove in which a wiring pattern is embedded. Therefore, the top-view shape of the opening 147a corresponds to that of the wiring pattern. It is preferable that at least part of the opening 147a overlaps the conductor 112a.

The opening 149a is to be an opening 149c formed later, i.e., a groove in which a back gate is embedded. Therefore, the top-view shape of the opening 149a corresponds to that of the back gate.

Dry etching is preferably used for the etching for forming the hard mask 146. For the dry etching, for example, a $C_4F_6$ gas, a $C_4F$ gas, a $CF_4$ gas, a $SF_6$ gas, a $CHF_3$ gas, a $Cl_2$ gas, a $BCl_3$ gas, a $SiCl_4$ gas, or the like can be used alone or in combination. Alternatively, an oxygen gas, a helium gas, an argon gas, a hydrogen gas, or the like can be added to any of the above gases as appropriate. As a dry etching apparatus, an apparatus similar to that described above can be used.

Figure 19B:
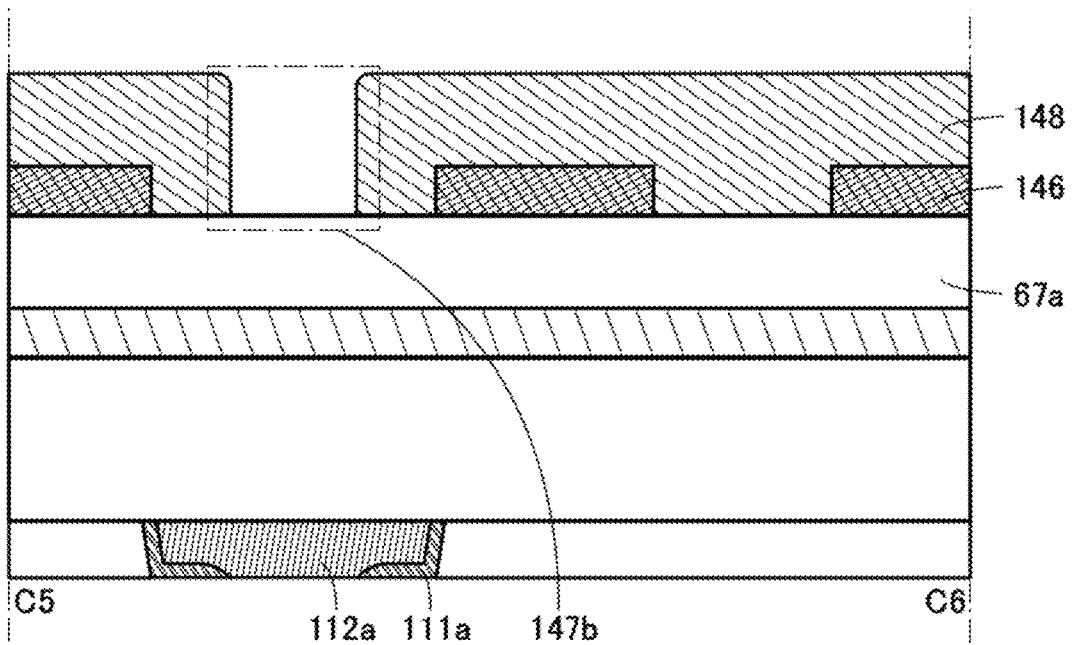

Next, a resist mask 148 with an opening 147b is formed over the insulator 67a and the hard mask 146 (see FIG. 19B). Here, the resist mask 148 preferably covers the hard mask 146. In particular, the resist mask 148 covers the opening 149a formed in the hard mask 146. Note that the resist mask 148 corresponds to the resist mask 18a illustrated in FIGS. 1C and 1D.

When an organic coating film is applied before a resist for the resist mask 148 is applied, the adhesion between the resist mask 148 and an insulator 67b can be improved. In the case where the organic coating film is used, the organic coating film needs to be etched before etching of the insulator 67a.

Here, the opening 147b corresponds to the opening 147fa to be formed in a later step, i.e., a via hole or a contact hole. Therefore, the top-view shape of the opening 147b corresponds to that of the via hole or the contact hole. In addition, it is preferable that the opening 147b corresponding to the via hole or the contact hole be formed in the opening 147a that correspond to the groove in which the wiring pattern is embedded. In that case, a maximum value of the width of the opening 147b is less than or equal to a minimum value of the width of the opening 147a. For example, the width of the opening 147b in the direction of C5-C6 shown in FIG. 19B is less than or equal to the width of the opening 147a in the direction of C5-C6 shown in FIG. 19A. In that case, the via hole or the contact hole can be formed with a margin with respect to the groove for the wiring pattern.

Figure 20A:
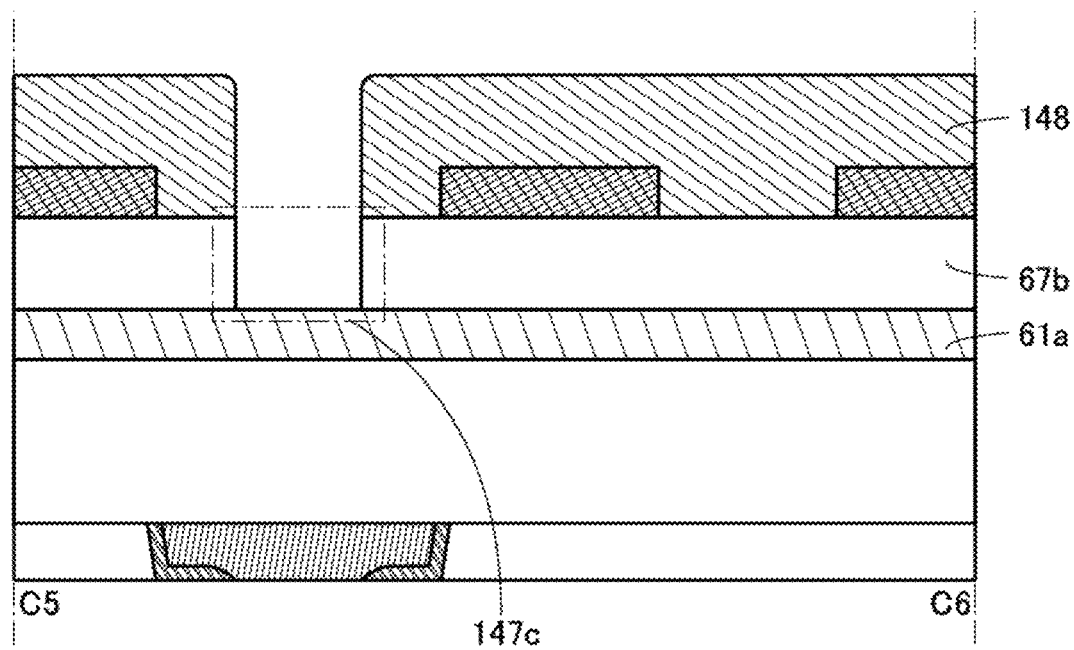
FIGS. 20A and 20B are cross-sectional views illustrating the method for manufacturing a semiconductor device of one embodiment of the present invention.

Next, the insulator 67a is etched using the resist mask 148 to form the insulator 67b with an opening 147c (see FIG. 20A). Here, the etching is performed until a top surface of the insulator 61a is exposed in the opening 147c. Note that dry etching is preferably employed for the etching. For the dry etching, for example, a $C_4F_6$ gas, a $C_4F$ gas, a $CF_4$ gas, a $SF_6$ gas, a $CHF_3$ gas, or the like can be used alone or in combination. Alternatively, an oxygen gas, a nitrogen gas, a helium gas, an argon gas, a hydrogen gas, or the like can be added to any of the above gases as appropriate. As a dry etching apparatus, an apparatus similar to that described above can be used. For example, a dry etching apparatus in which the frequency of a high-frequency power source connected to one of parallel-plate electrodes is different from that of a high-frequency power source connected to the other of the parallel-plate electrodes is preferably used. Dry etching conditions such as selection of an etching gas may be determined as appropriate so as to be suitable for an insulator used as the insulator 67a.

Figure 20B:
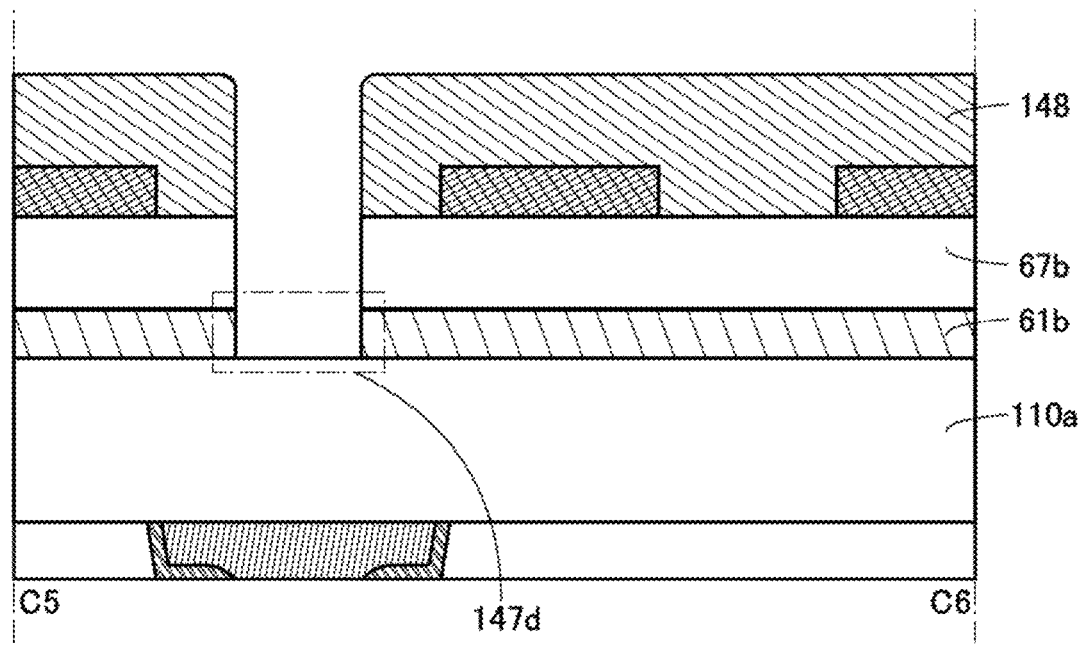

Next, the insulator 61a is etched using the resist mask 148 to form an insulator 61b with an opening 147d (see FIG. 20B). Here, the etching is performed until a top surface of the insulator 110a is exposed in the opening 147d. Note that dry etching is preferably employed for the etching. For the dry etching, for example, a $C_4F_6$ gas, a $C_4F$ gas, a $CF_4$ gas, a $SF_6$ gas, a $CHF_3$ gas, or the like can be used alone or in combination. Alternatively, an oxygen gas, a nitrogen gas, a helium gas, an argon gas, a hydrogen gas, or the like can be added to any of the above gases as appropriate. As a dry etching apparatus, an apparatus similar to that described above can be used. For example, a dry etching apparatus in which the frequency of a high-frequency power source connected to one of parallel-plate electrodes is different from that of a high-frequency power source connected to the other of the parallel-plate electrodes is preferably used. Dry etching conditions such as selection of an etching gas may be determined as appropriate so as to be suitable for an insulator used as the insulator 61a.

It is not necessary to stop the etching at the top surface of the insulator 110a when the opening 147d is formed. For example, after the opening 147d is formed, part of the insulator 110a may be etched to form a recessed portion in a region under the opening 147d.

Figure 21A:
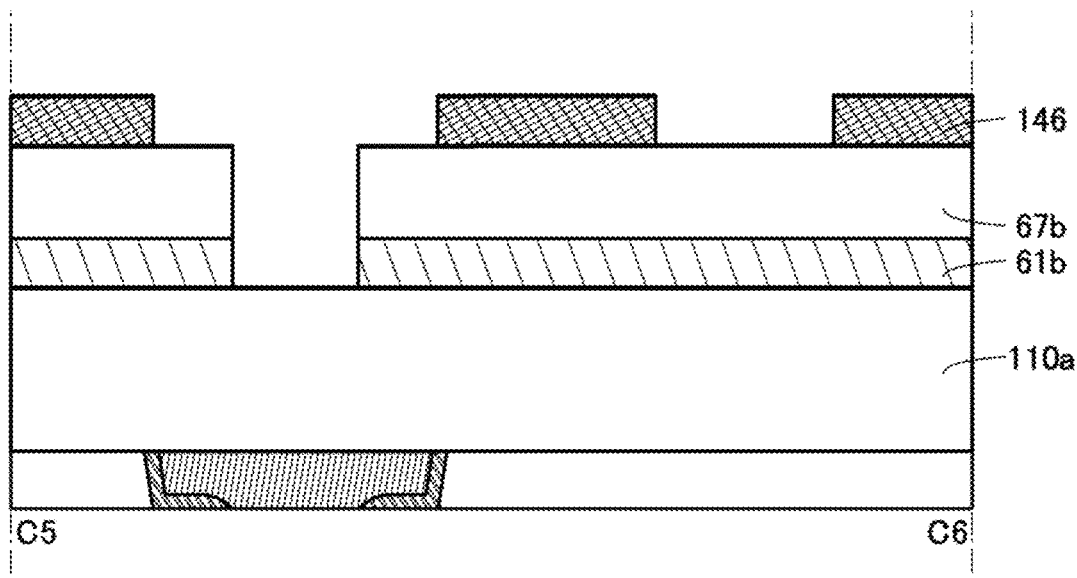
FIGS. 21A and 21B are cross-sectional views illustrating the method for manufacturing a semiconductor device of one embodiment of the present invention.

Next, the resist mask 148 is removed (see FIG. 21A). In the case where an organic coating film is formed under the resist mask 148, it is preferably removed together with the resist mask 148. Dry etching treatment such as ashing or wet etching treatment can be used for removal of the resist mask 148. Alternatively, wet etching treatment is performed in addition to dry etching treatment. Further alternatively, dry etching treatment can be performed in addition to wet etching treatment.

As also illustrated in FIGS. 5B and 5C, after the resist mask 148 is removed, a by-product might be formed so as to surround the edge of a top portion of the opening 147c.

Figure 21B:
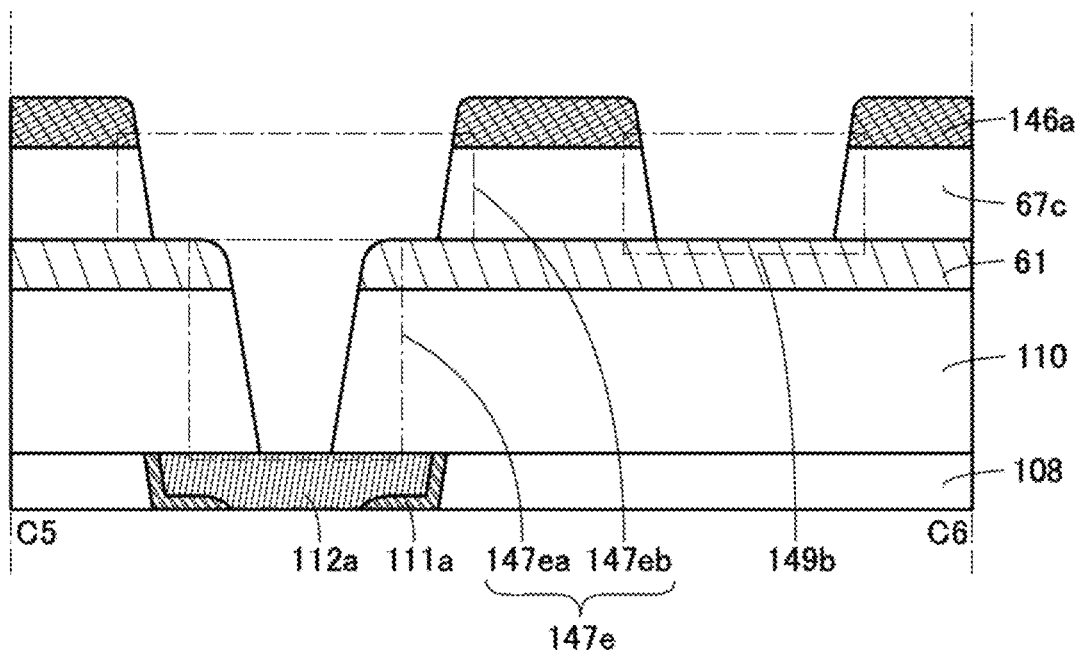

Next, the insulator 110a, the insulator 61b, and the insulator 67b are etched using the hard mask 146 to form the insulator 110, the insulator 61, and an insulator 67c, in which an opening 147e and an opening 149b are formed (see FIG. 21B). Here, the etching is performed until the top surface of the conductor 112a is exposed in the opening 147e. The edges of the openings 147a and the opening 149a of the hard mask 146 are also etched in some cases, whereby a hard mask 146a may be formed. The edge of the opening 147a of the hard mask 146a has a tapered shape, and an upper part of the edge of the opening 147a is rounded.

Note that dry etching is preferably employed for the etching. For the dry etching, for example, a $C_4F_6$ gas, a $C_4F$ gas, a $CF_4$ gas, a $SF_6$ gas, a $CHF_3$ gas, or the like can be used alone or in combination. Alternatively, an oxygen gas, a nitrogen gas, a helium gas, an argon gas, a hydrogen gas, or the like can be added to any of the above gases as appropriate. As a dry etching apparatus, an apparatus similar to that described above can be used. For example, a dry etching apparatus in which the frequency of a high-frequency power source connected to one of parallel-plate electrodes is different from that of a high-frequency power source connected to the other of the parallel-plate electrodes is preferably used. Dry etching conditions such as selection of an etching gas may be determined as appropriate so as to be suitable for insulators used as the insulator 61a and the insulator 110a.

Here, the opening 147e can be regarded as being composed of an opening 147ea which is located in a lower part and formed using the insulator 61b as a mask, and an opening 147eb which is located in an upper part and formed using the hard mask 146 as a mask. The opening 147ea functions as a via hole or a contact hole in a later step, and the opening 147eb functions as a groove in which a wiring pattern or the like is embedded in a later step.

The edge (also referred to as the inner wall) of the opening 147eb and the edge of the opening 149b in the insulator 67c preferably each have a tapered shape The edge (also referred to as the inner wall) of the opening 147ea in the insulators 110 and 61 preferably has a tapered shape. Note that the upper part of the edge of the opening 147ea, which is provided in the insulator 61, is preferably rounded. Owing to such a shape of the opening 147ea, a conductor 121 having a high blocking property against hydrogen can be formed with good coverage in a later step.

To perform the dry etching so that the opening 147ea has such a shape, it is preferable that the etching rate of the insulator 110a not be extremely higher than the etching rate of the insulator 61a. For example, the etching rate of the insulator 110a is set to less than or equal to eight times, preferably less than or equal to six times, further preferably less than or equal to four times the etching rate of the insulator 61a.

Dry etching under the above-described conditions can shape the edge of the opening 147ea into a tapered shape. In addition, even in the case where a by-product is formed as illustrated in FIGS. 5B and 5C, the by-product can be removed, and the upper part of the edge of the opening 147ea of the insulator 61 can be rounded.

Note that the shapes of the openings 147e and 149b are not limited to the above-described shapes. For example, the inner walls of the openings 147ea, 147eb, and 149b can be substantially perpendicular to the conductor 112a and the insulators 61. Alternatively, the openings 147eb and 149b may be formed in the insulators 67c and 61; further alternatively, the openings 147eb and 149b may be formed in the insulators 67c, 61, and 110.

Figure 22A:
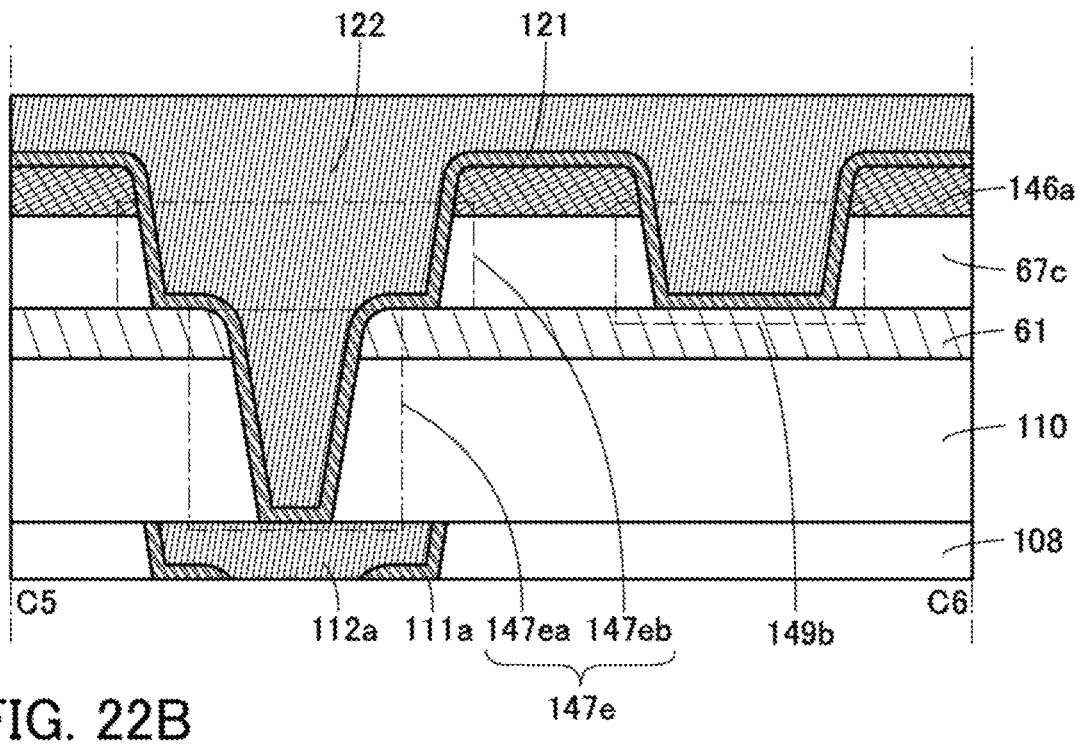
FIGS. 22A and 22B are cross-sectional views illustrating the method for manufacturing a semiconductor device of one embodiment of the present invention.

Next, the conductor 121 is formed in the openings 147e and 149b, and a conductor 122 is formed over the conductor 121 so as to be embedded in the openings 147e and 149b (see FIG. 22A. Here, the conductor 121 and the conductor 122 correspond to the conductor 20 and the conductor 21 illustrated in FIG. 4A.

Here, it is preferable that the conductor 121 be formed with good coverage so as to cover the inner walls and bottom surfaces of the openings 147e and 149b. In particular, it is preferable that the conductor 121 be in contact with the insulator 61 at the edge of the opening 147e; and it is further preferable that the opening formed in the insulators 110 and 61 be covered with the conductor 121 so that the conductor 20 is provided along the inner wall of the opening. When the edge of the opening 147ea in the insulators 110 and 61 has a tapered shape, and the upper part of the edge of the opening 147ea of the insulator 61 is rounded in the above manner, the coverage with the conductor 121 can be further improved.

The conductor 121 is preferably formed using a conductor which is less permeable to hydrogen than the conductor 122. For the conductor 121, a metal nitride such as tantalum nitride or titanium nitride is used, and tantalum nitride is particularly preferably used. Such a conductor 121 can prevent diffusion of impurities such as hydrogen and water into the conductor 122. In addition, effects, e.g., preventing diffusion of metal components contained in the conductor 122, preventing oxidation of the conductor 122, and improving adhesion of the conductor 122 with the opening 147e, can be obtained. Furthermore, in the case where the conductor 121 is formed using stacked layers, for example, titanium, tantalum, titanium nitride, tantalum nitride, or the like may be used; and a stacked-layer structure in which titanium nitride is provided over tantalum nitride is preferably used. Moreover, in the case where tantalum nitride is deposited as the conductor 121, heat treatment may be performed using an RTA apparatus after the deposition.

The conductor 121 can be formed by a sputtering method, a CVD method, an MBE method, a PLD method, an ALD method, or the like. Here, it is preferable that the formation of the conductor 121 be performed by a method providing good coverage, e.g., a collimated sputtering method, an MCVD method, or an ALD method.

By a collimated sputtering method, sputtered particles are likely to reach the bottom surface of the opening 147ea that has a high aspect ratio, whereby a film is sufficiently deposited over the bottom surface of the opening 147ea. In addition, since the inner walls of the openings 147ea, 147eb, and 149b have a tapered shape in the above manner, the film can also be sufficiently deposited on the inner walls of the openings 147ea, 147eb, and 149b.

When the conductor 121 is formed by an ALD method, the conductor 121 can have good coverage, and formation of a pin hole and the like in the conductor 121 can be prevented. Forming the conductor 121 in the above manner can further prevent impurities such as hydrogen and water from passing through the conductor 121 and diffusing into the conductor 122. In the case where tantalum nitride is deposited as the conductor 121 by an ALD method, for example, pentakis(dimethylamino)tantalum (structural formula: $Ta[N(CH_3)_2]_5$) can be used as a precursor.

The conductor 122 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, tungsten can be used.

The conductor 122 can be formed by a sputtering method, a CVD method, an MBE method, a PLD method, an ALD method, or the like. Since the conductor 122 is formed so as to be embedded in the opening 147e, a CVD method (an MCVD method, in particular) is preferably used.

In the case where a conductor which inhibits diffusion of copper is used as the conductor 121, the conductor 122 can be formed using copper with low wiring resistance. For example, tantalum nitride formed by an ALD method is used as the conductor 121, and copper is used as the conductor 122. In that case, tantalum nitride is preferably formed to cover the top surface of the conductor 122a to be formed later. With such a structure, copper can be used as the conductor 62b functioning as a back gate of the transistor 60a, and tantalum nitride can be used as the conductor 62a.

Figure 22B:
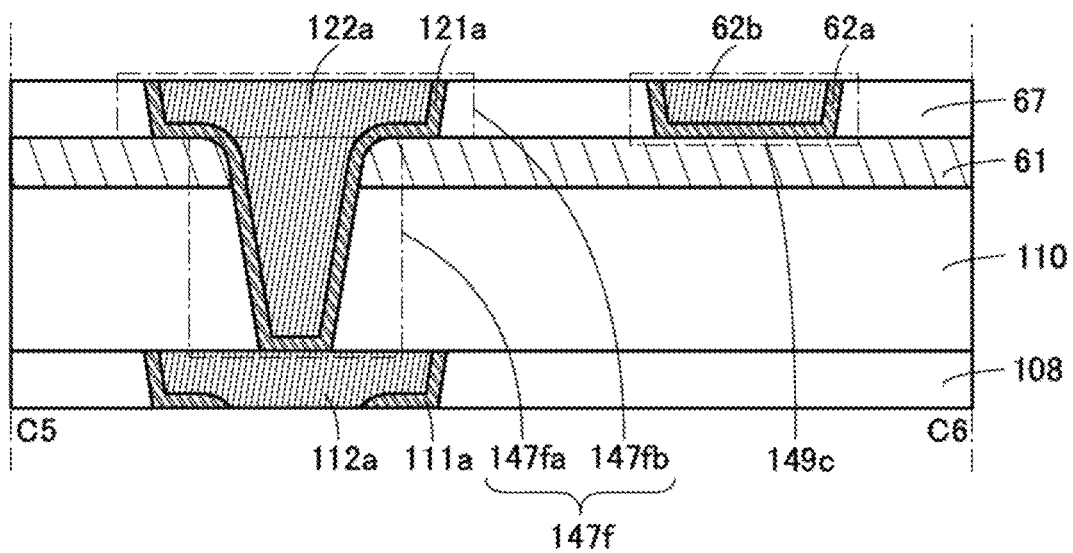

Next, polishing treatment is performed on the conductor 122, the conductor 121, the hard mask 146a, and the insulator 67c to form the conductors 121a and 122a which are embedded in an opening 147f, and the conductors 62a and 62b which are embedded in the opening 149c (see FIG. 22B). As the polishing treatment, mechanical polishing, chemical polishing, chemical mechanical polishing (CMP) or the like may be employed. For example, CMP treatment removes the upper part of the insulator 67c, the upper part of the conductor 122, the upper part of the conductor 121, and the hard mask 146a, whereby the insulator 67, the conductor 122a, the conductor 121a, the conductor 62a, and the conductor 62b which have flat top surfaces can be formed.

Here, the opening 147f can be regarded as being composed of the opening 147fa which is located in the lower part and functions as a via hole or a contact hole, and the opening 147fb which is located in the upper part and functions as a groove in which the wiring pattern or the like is embedded. The opening 147fa is formed in the insulator 110 and the insulator 61, and the opening 147fb is formed in the insulator 67. Part of the conductor 121a and part of the conductor 122a which are embedded in the opening 147fa function as a plug, and part of the conductor 121a and part of the conductor 122a which are embedded in the opening 147fb function as a wiring and the like.

In this manner, the conductors 62a and 62b functioning as the back gate of the transistor 60a can be formed in parallel with formation of the conductors 122a and 121a functioning as a plug and a wiring, by the method described in FIGS. 1A to 1D, FIGS. 2A to 2D, FIGS. 3A to 3D, and FIGS. 4A to 4D. Thus, the back gate of the transistor 60a and the wiring and the plug which are provided in the same layer as the back gate can be formed without an increase in the number of steps. The conductors 62a and 62b functioning as a back gate make it possible to control the threshold voltage of the transistor 60a. Control of the threshold voltage can prevent the transistor 60a from being turned on when a low voltage, e.g., a voltage of 0 V or lower, is applied to the gate (conductor 74) of the transistor 60a. That is, the transistor 60a can have a normally-off electrical characteristics.

Note that the shapes of the wiring and plug of this embodiment are not limited to those illustrated in FIG. 22B. A typical example of the wiring and plug which have different shapes from those illustrated in FIG. 22B are described below.

Figure 23A:
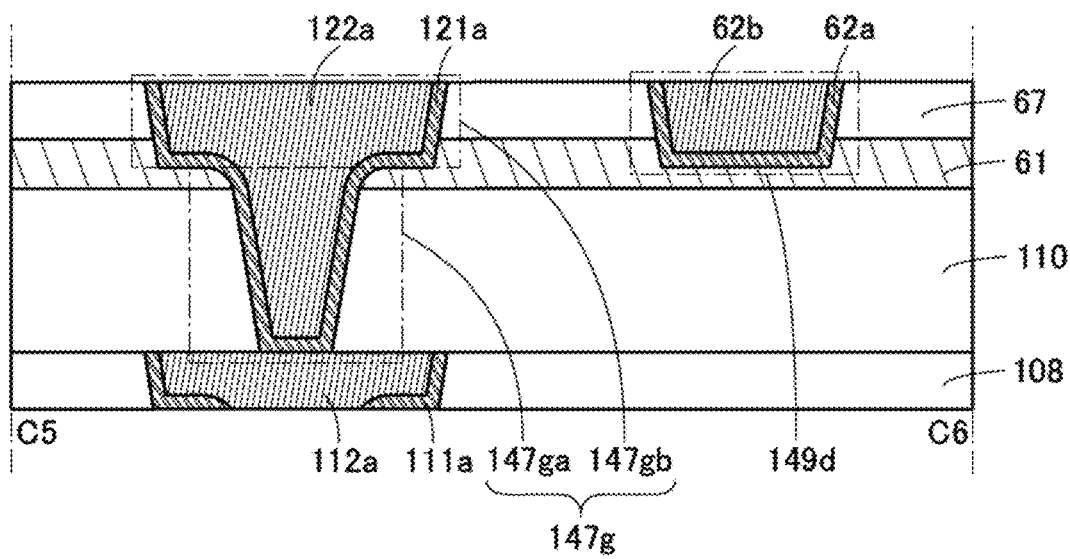
FIGS. 23A and 23B are cross-sectional views illustrating the method for manufacturing a semiconductor device of one embodiment of the present invention.

As for the shapes of the wiring and the plug, an opening 147g and an opening 149d in FIG. 23A have different shapes from the opening 147f and the opening 149c in FIG. 22B, respectively. Here, since the opening 147g composed of an opening 147ga and an opening 147gb has the same shape as the opening 17g illustrated in FIG. 6A; thus, the description of the opening 17g can be referred to. The opening 149d is formed in the insulator 67 and the upper part of the insulator 61. Accordingly, the conductors 62a and 62b functioning a back gate are provided so as to be embedded in the insulator 67 and the upper part of the insulator 61 in the structure illustrated in FIG. 23A.

Figure 23B:
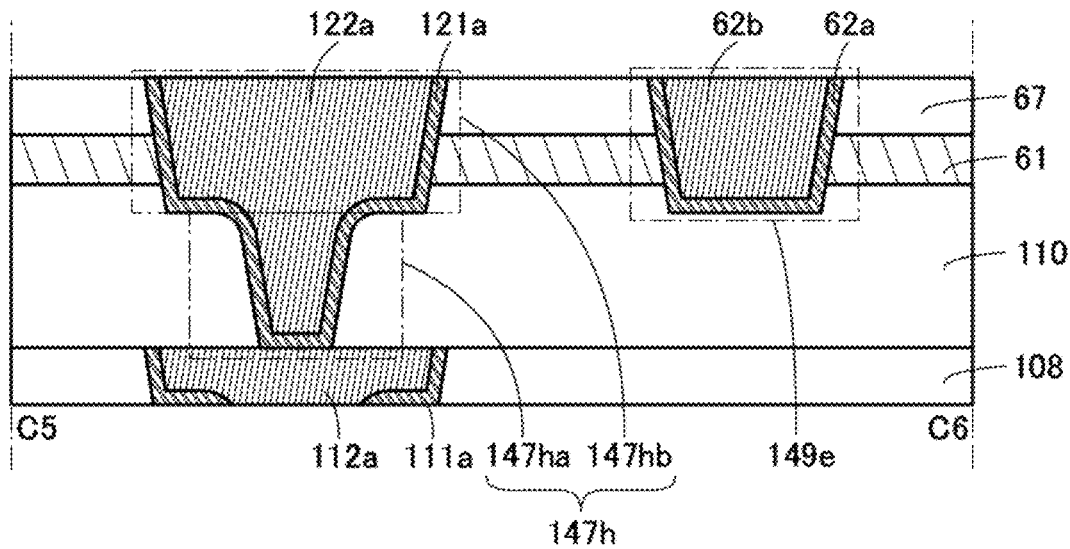

As for the shapes of the wiring and the plug, an opening 147h and an opening 149e in FIG. 23B have different shapes from the opening 147f and the opening 149c in FIG. 22B, respectively. Here, since the opening 147h composed of an opening 147ha and an opening 147hb has the same shape as the opening 17h illustrated in FIG. 6B; thus, the description of the opening 17h can be referred to. The opening 149e is formed in the insulator 67, the insulator 61, and an upper part of the insulator 110. Accordingly, the conductors 62a and 62b functioning a back gate are provided so as to be embedded in the insulator 67, the insulator 61, and the upper part of the insulator 110 in the structure illustrated in FIG. 23B.

Next, a method for forming the transistor 60a over the conductors 62a and 62b which function as a back gate of the transistor 60a and are illustrated in FIGS. 22A and 22B is described with reference to cross-sectional views illustrated in FIGS. 24A to 24F and FIGS. 25A to 25F. FIGS. 24A, 24C, and 24E and FIGS. 25A, 25C, and 25E are cross-sectional views of the transistor 60a in the channel length direction A1-A2, and FIGS. 24B, 24D, and 24F and FIGS. 25B, 25D, and 25F are cross-sectional views of the transistor 60a in the channel width direction A3-A4.

First, the insulator 65 is formed over the insulator 67, the conductor 62a, and the conductor 62b. Any of the above-described insulators can be used for the insulator 65. The insulator 65 can be formed by a sputtering method, a CVD method, an MBE method, a PLD method, an ALD method, or the like. For example, silicon oxide, silicon oxynitride, or the like may be formed as the insulator 65 by a PECVD method.

Then, the insulator 63 is formed over the insulator 65. Any of the above-described insulators can be used as the insulator 63. The insulator 63 can be formed by a sputtering method, a CVD method, an MBE method, a PLD method, an ALD method, or the like. For example, hafnium oxide or aluminum oxide formed by an ALD method may be used as the insulator 63.

Figure 24A:
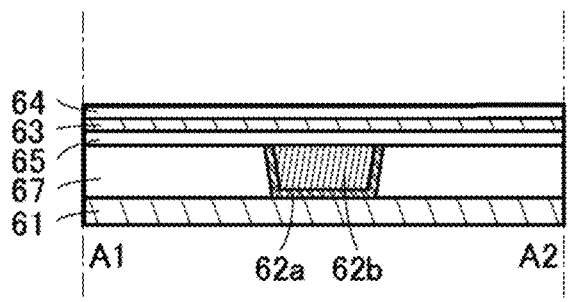
FIGS. 24A to 24F are cross-sectional views illustrating a method for manufacturing a semiconductor device of one embodiment of the present invention.
Figure 24B:
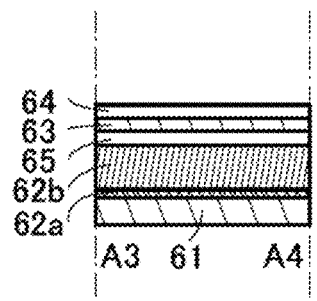

Next, the insulator 64 is formed over the insulator 63 (see FIGS. 24A and 24B). Any of the above-described insulators can be used as the insulator 64. The insulator 64 can be formed by a sputtering method, a CVD method, an MBE method, a PLD method, an ALD method, or the like. For example, silicon oxide, silicon oxynitride, or the like may be formed as the insulator 64 by a PECVD method. Alternatively, the insulator 65, the insulator 63, and the insulator 64 may be successively formed by an ALD method without being exposed to the air.

Next, heat treatment is preferably performed. The heat treatment can further reduce water or hydrogen in the insulator 65, the insulator 63, and the insulator 64. In addition, the insulator 64 can contain excess oxygen in some cases. The heat treatment is performed at a temperature higher than or equal to 250° C. and lower than or equal to 650° C., preferably higher than or equal to 350° C. and lower than or equal to 450° C. Note that in the case where tantalum nitride is used for the conductor 62a serving as the back gate of the transistor, or the like, the temperature of the above heat treatment may be set to higher than or equal to 350° C. and lower than or equal to 410° C., preferably higher than or equal to 370° C. and lower than or equal to 400° C. The heat treatment within such a temperature range can prevent release of hydrogen from the tantalum nitride. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen. By the heat treatment, impurities such as hydrogen and water can be removed, for example. For the heat treatment, lamp heating can be performed with use of an RTA apparatus. Heat treatment with an RTA apparatus is effective for an improvement in productivity because it needs short time as compared with the case of using a furnace.

Next, an insulator 69a to be the insulator 66a is formed. Any of the above-described insulators and semiconductors that can be used for the insulator 66a can be used for the insulator 69a. The insulator 69a can be deposited by a sputtering method, a CVD method, an MBE method, a PLD method, an ALD method, or the like. The insulator 69a is preferably formed while the substrate is being heated. The temperature of the substrate heating and the like may be similar to those of heat treatment described layer, for example.

Next, a semiconductor 69b to be the semiconductor 66b is formed. Any of the above-described semiconductors that can be used for the semiconductor 66b can be used for the semiconductor 66b. The semiconductor 66b can be formed by a sputtering method, a CVD method, an MBE method, a PLD method, an ALD method, or the like. The semiconductor 66b is preferably formed while the substrate is being heated. The temperature of the substrate heating and the like may be similar to those of heat treatment described layer, for example. Note that successive film formation of the insulator 69a and the semiconductor to be semiconductor 66b without exposure to the air can reduce entry of impurities into the films and their interface.

Next, heat treatment is preferably performed on the insulator 69a and the semiconductor 69b. The heat treatment can reduce the hydrogen concentrations of the insulator 66a and the semiconductor 66b in some cases. Furthermore, the heat treatment can reduce oxygen vacancies in the insulator 66a and the semiconductor 66b in some cases. The heat treatment is performed at a temperature higher than or equal to 250° C. and lower than or equal to 650° C., preferably higher than or equal to 350° C. and lower than or equal to 450° C. Note that in the case where tantalum nitride is used for the conductor 62a serving as the back gate of the transistor, or the like, the temperature of the above heat treatment may be set to higher than or equal to 350° C. and lower than or equal to 410° C., preferably higher than or equal to 370° C. and lower than or equal to 400° C. The heat treatment within such a temperature range can prevent release of hydrogen from the tantalum nitride. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen. The heat treatment can increase the crystallinity of the insulator 66a and the semiconductor 66b and can remove impurities such as hydrogen and water, for example. For the heat treatment, lamp heating can be performed with use of an RTA apparatus. Heat treatment with an RTA apparatus is effective for an improvement in productivity because it needs short time as compared with the case of using a furnace. By heat treatment, the peak intensity is increased and a full width at half maximum is decreased when a CAAC-OS described later is used for the insulator 66a and the semiconductor 66b. In other words, the crystallinity of a CAAC-OS is increased by heat treatment.

By the heat treatment, oxygen can be supplied from the insulator 64 to the insulator 69a and the semiconductor 69b. The heat treatment performed on the insulator 64 makes it very easy to supply oxygen to the insulator to be the insulator 66a and the semiconductor to be the semiconductor 66b.

Here, the insulator 63 functions as a barrier film that blocks oxygen. The insulator 63 is provided below the insulator 64, thereby preventing the oxygen that has diffused in the insulator 64 from diffusing into the layers below the insulator 64.

Oxygen is supplied to the insulator to be the insulator 66a and the semiconductor to be the semiconductor 66b to reduce oxygen vacancies in this manner, whereby a highly purified intrinsic or substantially highly purified intrinsic oxide semiconductor with a low density of defect states can be obtained.

Figure 24C:
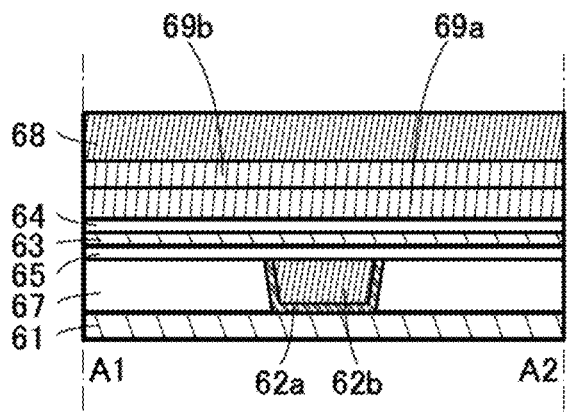
Figure 24D:
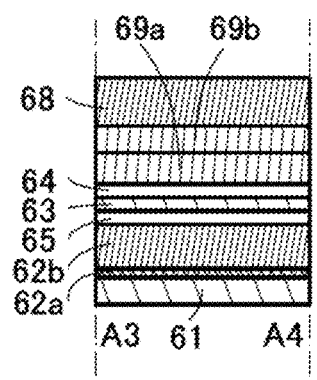

Next, a conductor 68 to be the conductors 68a and 68b is formed (see FIGS. 24C and 24D). Any of the above-described conductors that can be used as the conductors 68a and 68b can be used as the conductor 68. The conductor 68 can be formed by the sputtering method, the CVD method, the MBE method, the PLD method, the ALD method, or the like. For example, tantalum nitride may be deposited by a sputtering method, and tungsten may be deposited thereover to form the conductor 68.

Then, a resist or the like is formed over the conductor 68, and then the insulator 69a, the semiconductor 69b, and the conductor 68 are processed into an island shape using the resist or the like; as a result, the conductor 68, the semiconductor 66b, and the insulator 66a which have an island shape are formed.

Next, heat treatment may be performed. The heat treatment can further reduce water or hydrogen in the insulator 64, the insulator 63, the insulator 65, the insulator 66a, and the semiconductor 66b. The heat treatment is performed at a temperature higher than or equal to 250° C. and lower than or equal to 650° C., preferably higher than or equal to 350° C. and lower than or equal to 450° C. Note that in the case where tantalum nitride is used for the conductor 62a serving as the back gate of the transistor, or the like, the temperature of the above heat treatment may be set to higher than or equal to 350° C. and lower than or equal to 410° C., preferably higher than or equal to 370° C. and lower than or equal to 400° C. The heat treatment within such a temperature range can prevent release of hydrogen from the tantalum nitride. The heat treatment may be performed in an inert gas atmosphere. The heat treatment may be performed in an atmosphere containing an oxidizing gas. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen. For the heat treatment, lamp heating can be performed with use of an RTA apparatus. Heat treatment with an RTA apparatus is effective for an improvement in productivity because it needs short time as compared with the case of using a furnace.

Owing to the heat treatments performed so far, impurities that affect the oxide semiconductor, such as water and hydrogen, can be reduced before formation of the oxide semiconductor. In addition, since the via hole formed in the insulator 61 is filled with the conductor 121a and the like as described above, impurities contained in the layers below the insulator 61, such as hydrogen, can be prevented from diffusing into the layers over the insulator 61. Furthermore, when the temperature of process performed after formation of the oxide semiconductor is set to lower than or equal to the temperature at which hydrogen is diffused from the conductor 121a or the like, an influence by diffusion of impurities can be reduced.

When the heat treatment is performed at the stage where the insulator 66a and the semiconductor 66b are formed and a surface of the insulator 64 is exposed, as described above, it is possible to inhibit supply of water and hydrogen to the insulator 66a and the semiconductor 66b and to further reduce water and hydrogen in the insulator 64, the insulator 63, and the insulator 65.

In the case where an etching gas containing impurities such as hydrogen and carbon are used for the formation of the insulator 66a and the semiconductor 66b, the impurities such as hydrogen and carbon sometimes enter the insulator 66a, the semiconductor 66b, and the like. The impurities such as hydrogen and carbon that enter the insulator 66a and the semiconductor 66b at the time of etching can be released by heat treatment performed after the formation of the insulator 66a and the semiconductor 66b.

Figure 24E:
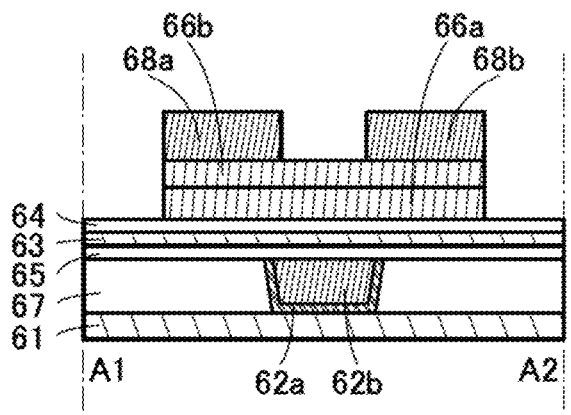
Figure 24F:
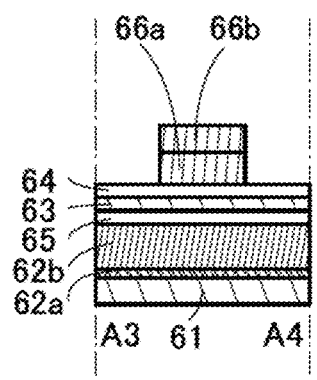

Next, a resist or the like is formed over the island-shaped conductor 68, and processing is performed using the resist or the like to form the conductors 68a and 68b (see FIGS. 24E and 24F).

A low-resistance region is formed in a region of the semiconductor 66b which is in contact with the conductor 68a or 68b in some cases. A region of the semiconductor 66b between the conductors 68a and 68b may have a smaller thickness than that of the region of the semiconductor 66b over which the conductor 68a or 68b is positioned. This region is formed by removing part of the top surface of the semiconductor 66b at the time of formation of the conductors 68a and 68b.

Then, an insulator 69c to be the insulator 66c is formed over the insulator 64, the insulator 66a, the semiconductor 66b, the conductor 68a, and the conductor 68b. Any of the above-described insulators or semiconductors that can be used for the insulator 66c and the like is used for the insulator 69c. The insulator 66c can be formed by a sputtering method, a CVD method, an MBE method, a PLD method, an ALD method, or the like. Before the formation of the insulator to be the insulator 66c, surfaces of the semiconductor 66b and the like may be etched. For example, plasma containing a rare gas can be used for the etching. After that, the insulator to be the insulator 66c is successively formed without being exposed to the air, whereby impurities can be prevented from entering an interface between the semiconductor 66b and the insulator 66c. In some cases, impurities at an interface between films are diffused more easily than impurities in a film. For this reason, a reduction in impurity at the interfaces leads to stable electrical characteristics of a transistor.

Next, an insulator 72a to be the insulator 72 is formed over the insulator 69c. Any of the above-described insulators that can be used for the insulator 72 can be used for the insulator 72a, for example. The insulator 72a can be formed by a sputtering method, a CVD method, an MBE method, a PLD method, an ALD method, or the like. For example, silicon oxynitride or the like may be deposited as the insulator 69c by a PECVD method. Note that successive formation of the insulator 69c and the insulator 72a without exposure to the air can reduce entry of impurities into the films and their interface.

Then, a conductor to be the conductor 74 is formed over the insulator 72. As the conductor 74, the conductor that can be used for the conductor 74 may be used. The conductor to be conductor 74 can be formed by a sputtering method, a CVD method, an MBE method, a PLD method, an ALD method, or the like. For example, to form the conductor to be the conductor 74, titanium is deposited by an ALD method and tungsten is deposited thereover by a sputtering method.

Figure 25A:
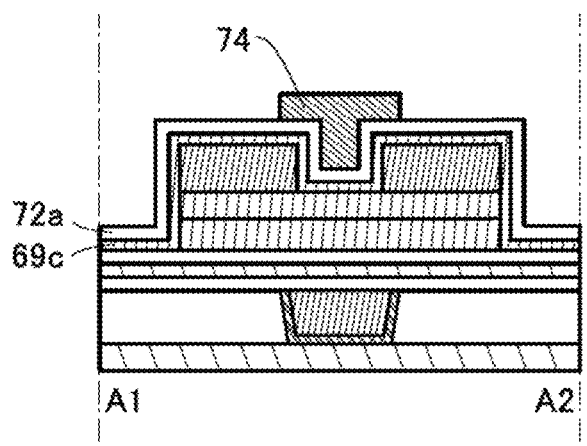
FIGS. 25A to 25F are cross-sectional views illustrating the method for manufacturing a semiconductor device of an embodiment of the present invention.
Figure 25B:
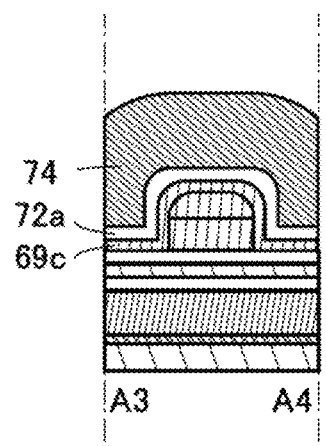

Subsequently, a resist or the like is formed over the conductor that is to be the conductor 74, and processing is performed using the resist or the like, whereby the conductor 74 is formed (see FIGS. 25A and 25B).

Next, an insulator to be the insulator 79 is formed over the insulator 72a. Any of the above-described insulators that can be used as the insulator 79 can be used as the insulator to be the insulator 79. The insulator to be the insulator 79 can be formed by a sputtering method, a CVD method, an MBE method, a PLD method, an ALD method, or the like. For example, gallium oxide, aluminum oxide, or the like may be deposited as the insulator to be the insulator 79 by an ALD method.

Figure 25C:
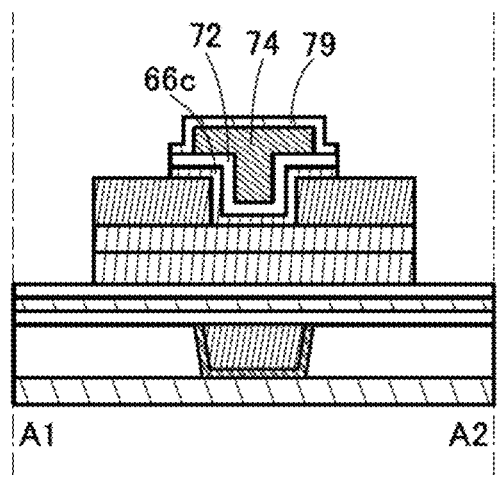
Figure 25D:
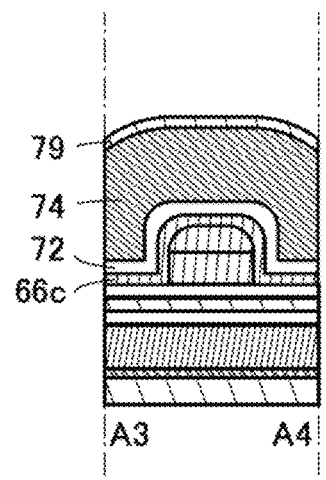
Figure 25E:
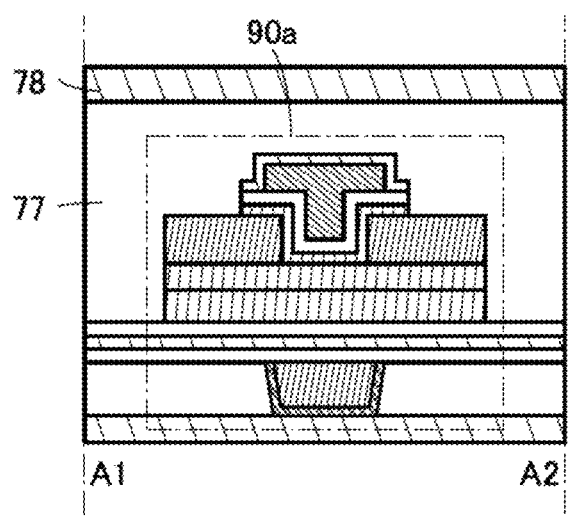
Figure 25F:
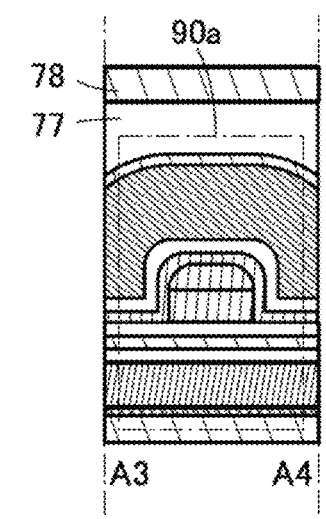

Next, a resist or the like is formed over the insulator to be the insulator 79, and processing is performed using the resist or the like, whereby the insulator 79 is formed (see FIGS. 25C and 25D).

After that, the insulator 77 is formed over the insulator 64, the insulator 79, the conductor 68a, the conductor 68b, and the like. Any of the above-mentioned insulators can be used for the insulator 77. As described above, the amount of impurities such as hydrogen, water, and nitrogen oxide contained in the insulator 77 is preferably small. The insulator 77 can be formed by a sputtering method, a CVD method, an MBE method, a PLD method, an ALD method, or the like. For example, silicon oxynitride or the like may be deposited as the insulator 77 by a PECVD method.

Then, it is preferable that the planarity of the top surface of the insulator 77 be improved by a CMP method or the like.

Here, as also illustrated in FIG. 17, an opening is preferably formed in the insulators 67, 65, 63, 64, and 77 in the vicinity of a region overlapping the scribe line 138, by lithography or the like.

Then, the insulator 78 is formed over the insulator 77. Any of the above-described insulators may be used as the insulator 78 (see FIGS. 25E and 25F). The insulator 78 can be formed by a sputtering method, a CVD method, an MBE method, a PLD method, an ALD method, or the like. As illustrated in FIG. 17, the insulator 78 is formed to cover side surfaces of the insulators 67, 65, 63, 64, and 77 in the opening in the vicinity of the scribe line 138, and the insulator 78 is in contact with the insulator 61 in the opening.

The insulator 78 is formed preferably with the use of plasma, further preferably by a sputtering method, and still further preferably by a sputtering method in an atmosphere containing oxygen.

As the sputtering method, a direct current (DC) sputtering method in which a direct-current power source is used as a sputtering power source, a DC sputtering method in which a pulsed bias is applied (i.e., a pulsed DC sputtering method), or a radio frequency (RF) sputtering method in which a high frequency power source is used as a sputtering power source may be used. Alternatively, a magnetron sputtering method using a magnet mechanism inside a chamber, a bias sputtering method in which voltage is also applied to a substrate during deposition, a reactive sputtering method performed in a reactive gas atmosphere, or the like may be used. Still alternatively, the above-described PESP or VDSP method may be used. The oxygen gas flow rate or deposition power for sputtering can be set as appropriate in accordance with the amount of oxygen to be added.

Here, as the insulator 78, an oxide insulating film of aluminum oxide or the like having a blocking effect against oxygen, hydrogen, water, or the like is preferably provided. For example, aluminum oxide may be formed as the insulator 78 by a sputtering method. In addition, aluminum oxide is preferably formed thereover by an ALD method. The use of aluminum oxide formed by an ALD method can prevent formation of pin holes and the like, leading to a further improvement in the blocking effect of the insulator 61 against hydrogen and water.

When the insulator 78 is formed by a sputtering method, oxygen is added to the vicinity of a surface of the insulator 77 (after the formation of the insulator 78, an interface between the insulator 77 and the insulator 78) at the same time as the formation. Although the oxygen is added to the insulator 77 as an oxygen radical, for example, the state of the oxygen at the time of being added is not limited thereto. The oxygen may be added to the insulator 77 as an oxygen atom, an oxygen ion, or the like. Note that by addition of oxygen, oxygen in excess of the stoichiometric composition is contained in the insulator 77 in some cases, and the oxygen in such a case can be called excess oxygen.

The insulator 78 is preferably formed while the substrate is being heated. The substrate heating may be performed at a temperature higher than or equal to 250° C. and lower than or equal to 650° C., preferably higher than or equal to 350° C. and lower than or equal to 450° C., for example. Note that in the case where tantalum nitride is used for the conductor 62a serving as the back gate of the transistor, or the like, the temperature of the above heat treatment may be set to higher than or equal to 350° C. and lower than or equal to 410° C., preferably higher than or equal to 370° C. and lower than or equal to 400° C. The heat treatment within such a temperature range can prevent release of hydrogen from the tantalum nitride.

Next, heat treatment is preferably performed. By the heat treatment, oxygen added to the insulator 64 or the insulator 77 can be diffused to be supplied to the insulator 66a, the semiconductor 66b, and the insulator 66c. The heat treatment is performed at a temperature higher than or equal to 250° C. and lower than or equal to 650° C., preferably higher than or equal to 350° C. and lower than or equal to 450° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with use of an RTA apparatus.

This heat treatment is preferably performed at a temperature lower than that of the heat treatment performed after formation of the semiconductor 66b. A temperature difference between the heat treatment and the heat treatment performed after formation of the semiconductor 66b is higher than or equal to 20° C. and lower than or equal to 150° C., preferably higher than or equal to 40° C. and lower than or equal to 100° C. Accordingly, superfluous release of excess oxygen (oxygen) from the insulator 64 and the like can be inhibited. Note that in the case where heating at the time of formation of the layers (e.g., heating at the time of formation of the insulator 78) doubles as the heat treatment after formation of the insulator 78, the heat treatment after formation of the insulator 78 is not necessarily performed.

By the heat treatment, oxygen added to the insulator 64 and the insulator 77 is diffused to the insulator 64 or the insulator 72. The insulator 78 is less permeable to oxygen than the insulator 77 and functions as a barrier film that blocks oxygen. Since the insulator 78 is formed over the insulator 77, oxygen diffuses into the insulator 77 not in the upward direction but mainly in the horizontal direction or the downward direction. In the case where the insulator 78 is heated while the substrate is heated, oxygen can be concurrently added and diffused to the insulator 64 and the insulator 77.

The oxygen diffused into the insulator 64 or the insulator 77 is supplied to the insulator 66a, the insulator 66c, and the semiconductor 66b. The insulator 63 having a function of blocking oxygen is provided below the insulator 64, thereby preventing the oxygen diffusing into the insulator 64 from diffusing into the layers below the insulator 64. In the vicinity of the scribe line 138 illustrated in FIG. 17, the insulators 78 and 61 covering the side surface of the insulator 77 inhibit diffusion of oxygen into the outside of the insulator 78, whereby the insulator 77 can be filled with oxygen and oxygen can be supplied from the insulator 77 to the insulator 66a, the semiconductor 66b, and the insulator 66c.

In the heat treatment, the insulator 61, the conductor 121a provided in the via hole formed in the insulator 61, and the like can block impurities such as hydrogen and water that diffuse from the lower layers, and the insulator 78 can block impurities such as hydrogen and water that diffuse from the top and side surfaces of the insulator 77. Thus, the amount of impurities such as hydrogen and water included in the insulator 77, 66a, 66c, and 66b which are wrapped with the insulators 61 and 78 can be small. Impurities such as hydrogen are sometimes bonded to oxygen in the insulator 77 or the like to become water, which might prevent diffusion of oxygen. Therefore, reducing the amount of impurities such as hydrogen and water in the insulator 77 can promote supply of oxygen.

In this manner, impurities such as water and hydrogen can be prevented from diffusing into the insulator 66a, the insulator 66c, and the semiconductor 66b, in particular, the semiconductor 66b; as a result, oxygen can be efficiently supplied thereto. Oxygen is supplied to the insulator 66a, the insulator 66c, and the semiconductor 66b to reduce oxygen vacancies in this manner, whereby a highly purified intrinsic or substantially highly purified intrinsic oxide semiconductor with a low density of defect states can be obtained.

Note that heat treatment after the formation of the insulator 78 may be performed at any time after the insulator 78 is formed.

Through the above process, the transistor 60a can be formed.

The use of the method for manufacturing a semiconductor device described in this embodiment makes it possible to provide a semiconductor device with a transistor having stable electrical characteristics, a semiconductor device with a transistor having a low leakage current in an off state, a semiconductor device with a transistor having normally-off characteristics, and a semiconductor device with a highly reliable transistor.

The structure and method described in this embodiment can be combined as appropriate with any of the other structures and methods described in the other embodiments.

Embodiment 2

In this embodiment, an oxide semiconductor included in a semiconductor device of one embodiment of the present invention is described below in detail.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 29A:
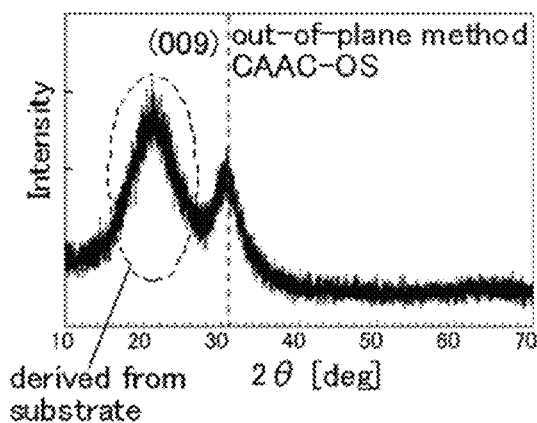
FIGS. 29A to 29E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 29A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 29B:
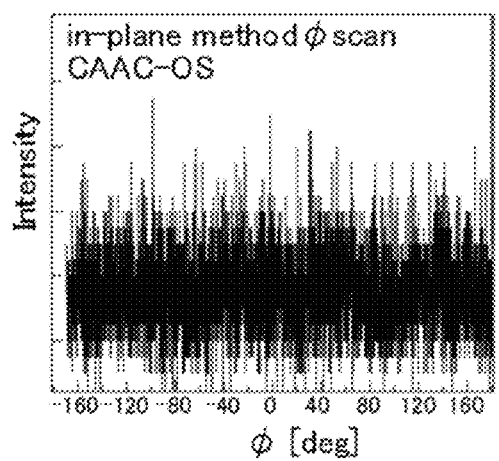
Figure 29C:
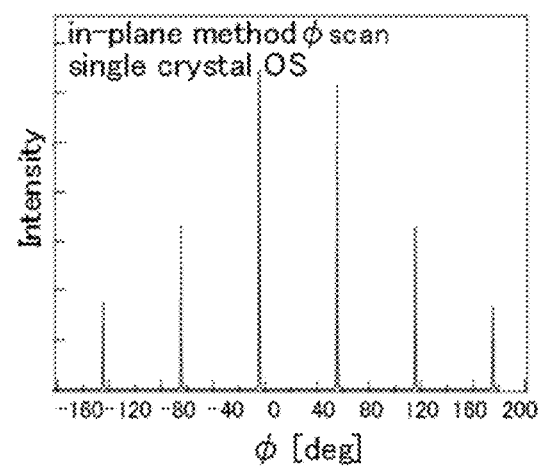

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (ϕ scan) is performed with 2θ fixed at around 56° and with the sample rotated using a normal vector to the sample surface as an axis (ϕ axis), as shown in FIG. 29B, a peak is not clearly observed. In contrast, in the case where single crystal InGaZnO$_4$ is subjected to ϕ scan with 2θ fixed at around 56°, as shown in FIG. 29C, six peaks that are derived from crystal planes equivalent to the (110) plane are observed. Accordingly, the structural analysis using XRD shows that the directions of a-axes and b-axes are irregularly oriented in the CAAC-OS.

Figure 29D:
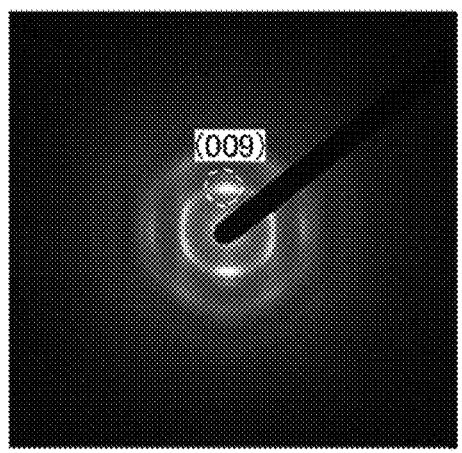
Figure 29E:
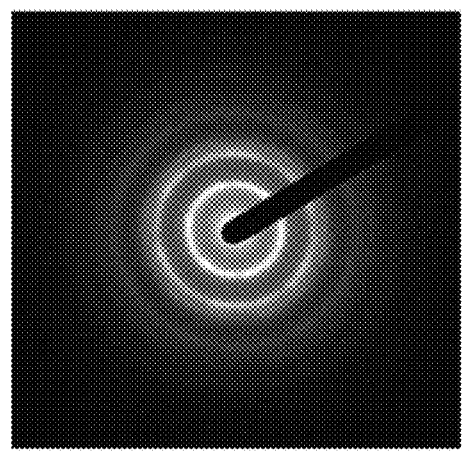

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 29D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 29E shows a diffraction pattern obtained in such a manner that an electron beam with a probe diameter of 300 nm is incident on the same sample in a direction perpendicular to the sample surface. As shown in FIG. 29E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 29E is considered to be derived from the (010) plane, the (100) plane, and the like of the InGaZnO$_4$ crystal. The second ring in FIG. 29E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 30A:
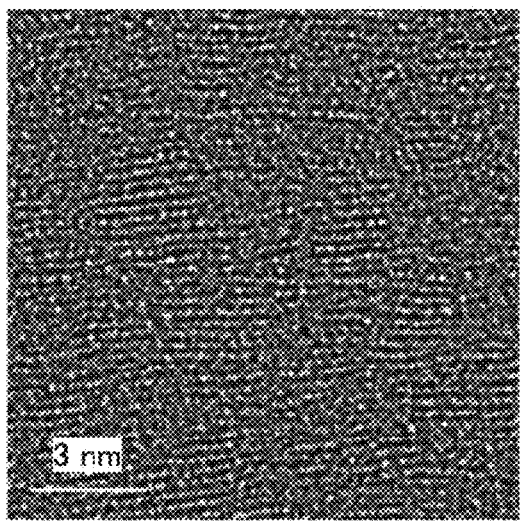
FIGS. 30A to 30E show a cross-sectional TEM image and plan-view TEM images of a CAAC-OS and images obtained through analysis thereof.

FIG. 30A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 30A shows pellets in which metal atoms are arranged in a layered manner. FIG. 30A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 30B:
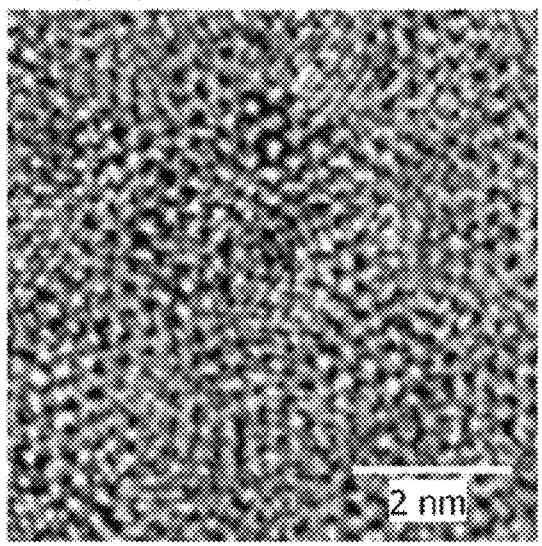
Figure 30C:
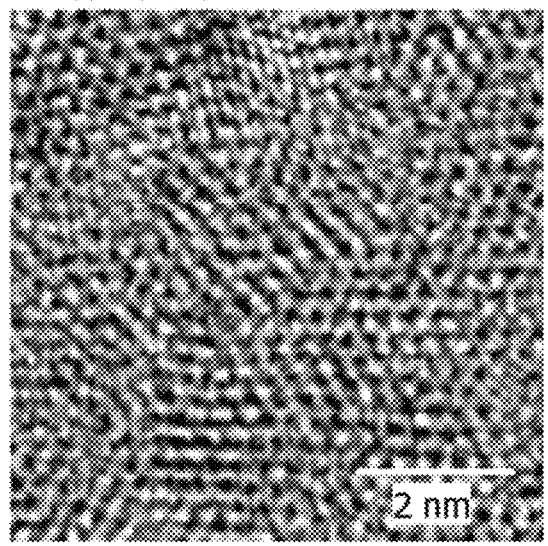
Figure 30D:
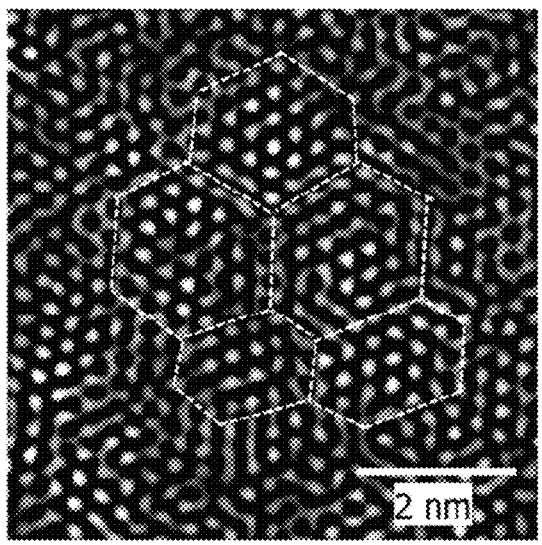
Figure 30E:
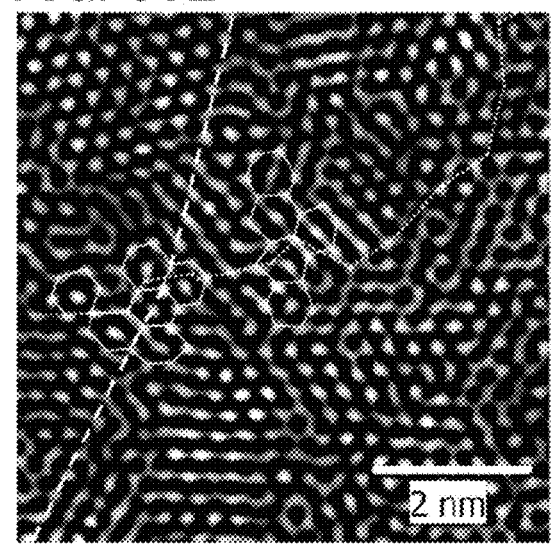

FIGS. 30B and 30C show Cs-corrected high-resolution TEM images of a plane of the CAAC-OS observed from a direction substantially perpendicular to the sample surface. FIGS. 30D and 30E are images obtained through image processing of FIGS. 30B and 30C. The method of image processing is as follows. The image in FIG. 30B is subjected to fast Fourier transform (FFT), so that FFT images are obtained. Then, mask processing is performed such that a range of from 2.8 nm$^{-1}$ to 5.0 nm$^{-1}$ from the origin point in the obtained FFT images remains. After the mask processing, the FFT images are processed by inverse fast Fourier transform (IFFT) to obtain processed images. The images obtained in this manner are called FFT filtering images. An FFT filtering image is a Cs-corrected high-resolution TEM image from which a periodic component is extracted, and shows a lattice arrangement.

In FIG. 30D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 30E, a dotted line denotes a portion where the direction of a lattice arrangement is changed between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancies in the oxide semiconductor might serve as carrier traps or serve as carrier generation sources when hydrogen is captured therein.

The CAAC-OS having small amounts of impurities and oxygen vacancies is an oxide semiconductor film with a low carrier density (specifically, lower than $8 \times 10^{11}/cm^3$, preferably lower than $1 \times 10^{11}/cm^3$, and further preferably lower than $1 \times 10^{10}/cm^3$ and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 31A:
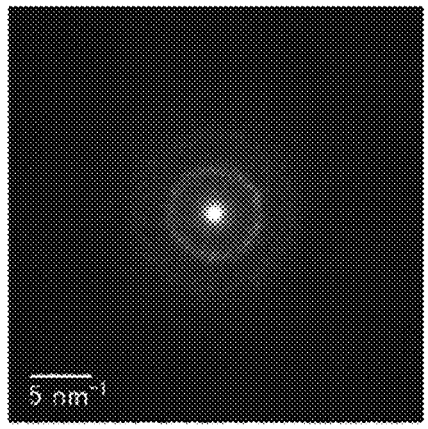
FIGS. 31A to 31D show electron diffraction patterns and a cross-sectional TEM image of an nc-OS.
Figure 31B:
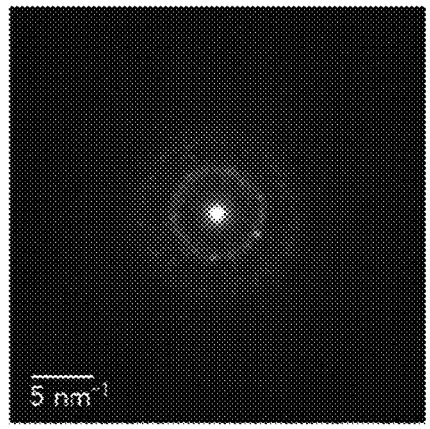

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 31A is observed. FIG. 31B shows a diffraction pattern obtained when an electron beam with a probe diameter of 1 nm is incident on the same sample. As shown in FIG. 31B, a plurality of spots are observed in a ring-like region. In other words, ordering in an nc-OS is not observed with an electron beam with a probe diameter of 50 nm but is observed with an electron beam with a probe diameter of 1 nm.

Figure 31C:
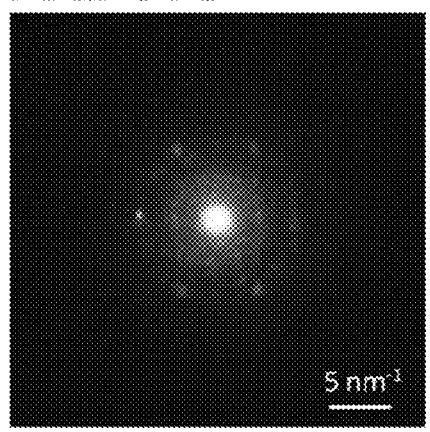

Furthermore, an electron diffraction pattern in which spots are arranged in an approximately regular hexagonal shape is observed in some cases as shown in FIG. 31C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 31D:
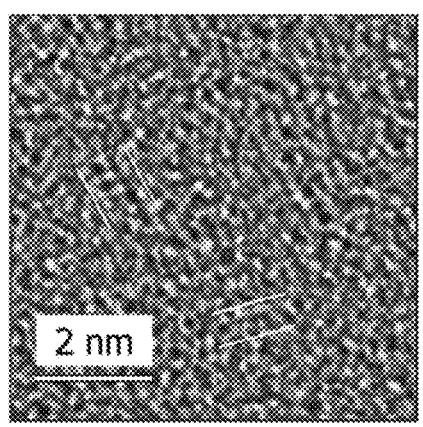

FIG. 31D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 31D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

Figure 32A:
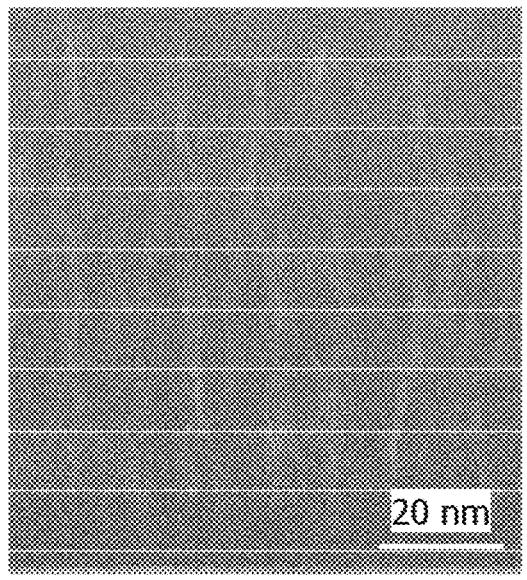
FIGS. 32A and 32B show cross-sectional TEM images of an a-like OS.
Figure 32B:
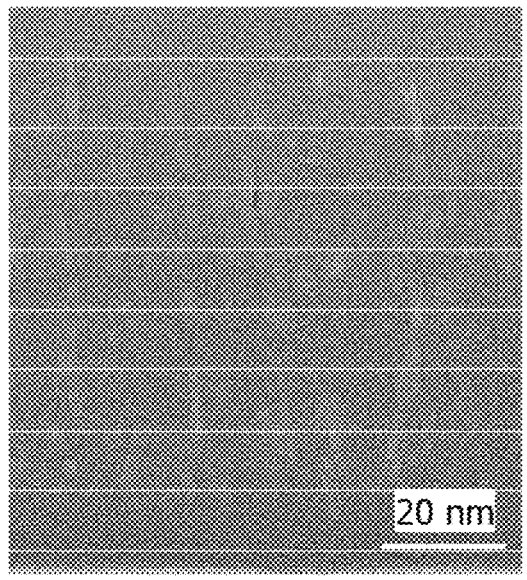

FIGS. 32A and 32B are high-resolution cross-sectional TEM images of an a-like OS. FIG. 32A is the high-resolution cross-sectional TEM image of the a-like OS at the start of the electron irradiation. FIG. 32B is the high-resolution cross-sectional TEM image of a-like OS after the electron (e) irradiation at $4.3 \times 10^8$ e$^-$/nm$^2$. FIGS. 32A and 32B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 33:
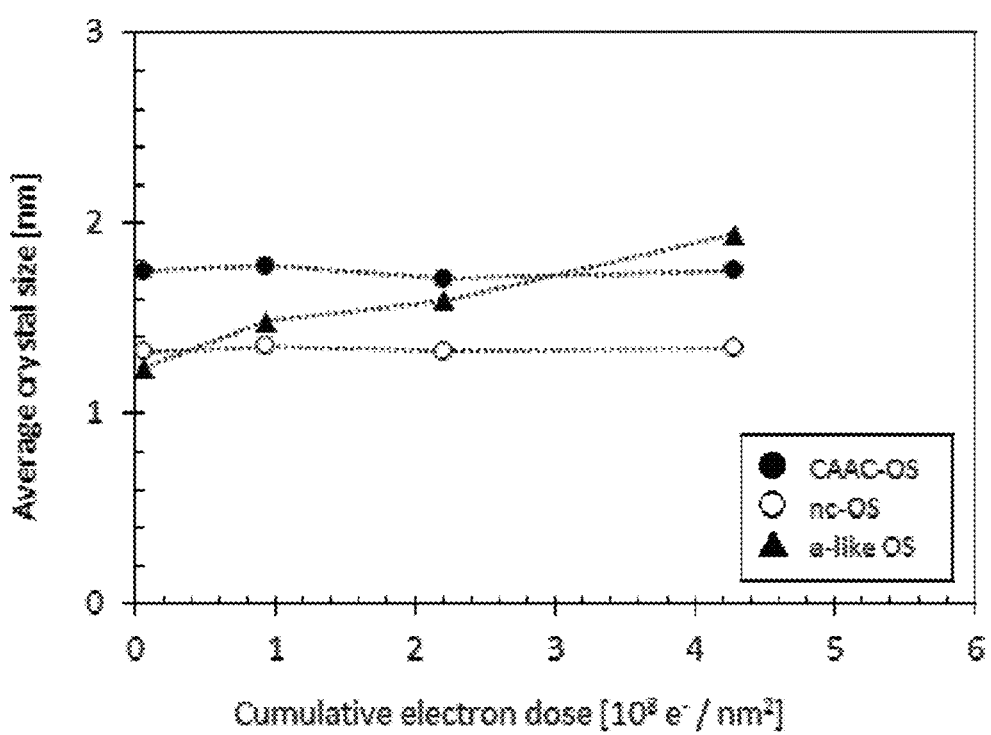
FIG. 33 shows a change in crystal part of an In—Ga—Zn oxide induced by electron irradiation.

FIG. 33 shows a change in the average size of crystal parts (at 22 points to 30 points) in each sample. Note that the crystal part size corresponds to the length of a lattice fringe. FIG. 33 indicates that the crystal part size in the a-like OS increases with an increase in the cumulative electron dose in obtaining TEM images, for example. As shown in FIG. 33, a crystal part of approximately 1.2 nm (also referred to as an initial nucleus) at the start of TEM observation grows to a size of approximately 1.9 nm at a cumulative electron (e⁻) dose of $4.2 \times 10^8$ e⁻/nm². In contrast, the crystal part size in the nc-OS and the CAAC-OS shows little change from the start of electron irradiation to a cumulative electron dose of $4.2 \times 10^8$ e/nm². As shown in FIG. 33, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e⁻/(nm²·s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO₄ with a rhombohedral crystal structure is 6.357 g/cm³. Accordingly, in the case of the oxide semiconductor having an atomic ratio of In:Ga:Zn=1:1:1, the density of the a-like OS is higher than or equal to 5.0 g/cm³ and lower than 5.9 g/cm³. For example, in the case of the oxide semiconductor having an atomic ratio of In:Ga:Zn=1:1:1, the density of each of the nc-OS and the CAAC-OS is higher than or equal to 5.9 g/cm³ and lower than 6.3 g/cm³.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

The structures and methods described in this embodiment can be used in combination as appropriate with any of the other structures and methods described in the other embodiments.

Embodiment 3

In this embodiment, an example of a circuit of a semiconductor device including the transistor or the like of one embodiment of the present invention is described.

<Circuit>

An example of a circuit of a semiconductor device including a transistor or the like of one embodiment of the present invention is described below.

<CMOS Inverter>

Figure 34A:
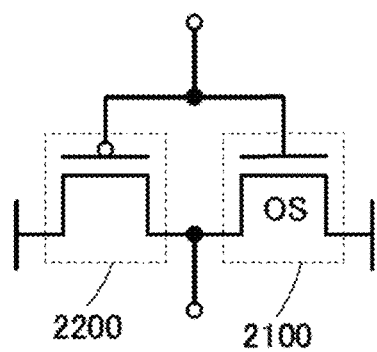
FIGS. 34A and 34B are circuit diagrams each illustrating a semiconductor device of one embodiment of the present invention.

A circuit diagram in FIG. 34A shows a configuration of what is called a CMOS inverter in which a p-channel transistor 2200 and an n-channel transistor 2100 are connected to each other in series and in which gates of them are connected to each other. Here, in the circuit shown in FIG. 34A, the transistor 2200 can be formed using the transistor 60a or the transistor 60b in FIGS. 13A to 13D, and the transistor 2100 can be formed using the transistor 90a or the transistor 90b in FIGS. 15A to 15D.

In the semiconductor device shown in FIG. 34A, a p-channel transistor is formed utilizing a semiconductor substrate, and an n-channel transistor is formed above that; therefore, the area occupied by the element can be reduced. That is, the integration degree of the semiconductor device can be improved. In addition, the manufacturing process can be simplified compared with the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared with a semiconductor device where an n-channel transistor is formed utilizing the semiconductor substrate.

<CMOS Analog Switch>

Figure 34B:
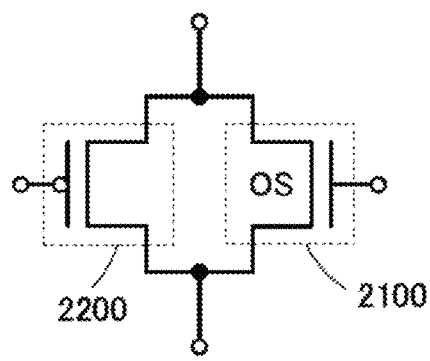

A circuit diagram in FIG. 34B shows a configuration in which sources of the transistors 2100 and 2200 are connected to each other and drains of the transistors 2100 and 2200 are connected to each other. With such a configuration, the transistors can function as a so-called CMOS analog switch. Here, in the circuit shown in FIG. 34B, the transistor 2200 can be formed using the transistor 60a or the transistor 60b in FIGS. 13A to 13D, and the transistor 2100 can be formed using the transistor 90a or the transistor 90b in FIGS. 15A to 15D.

<Memory Device 1>

Figure 35A:
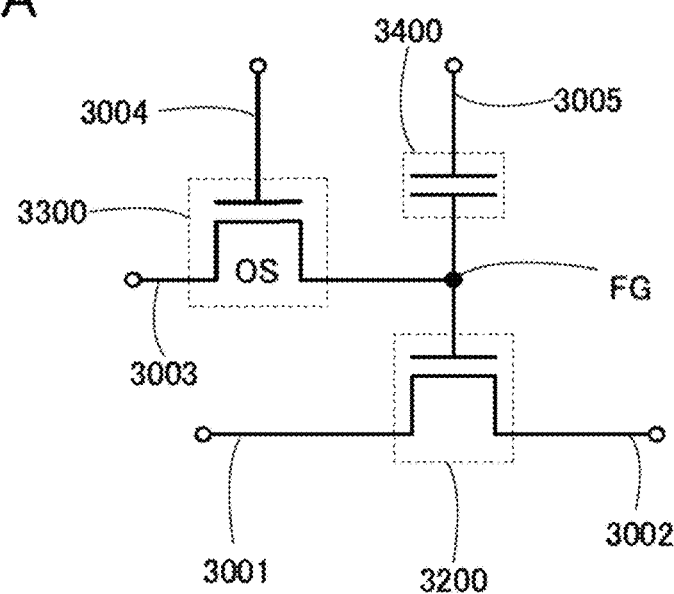
FIGS. 35A to 35C are each a circuit diagram illustrating a memory device of one embodiment of the present invention.
Figure 35B:
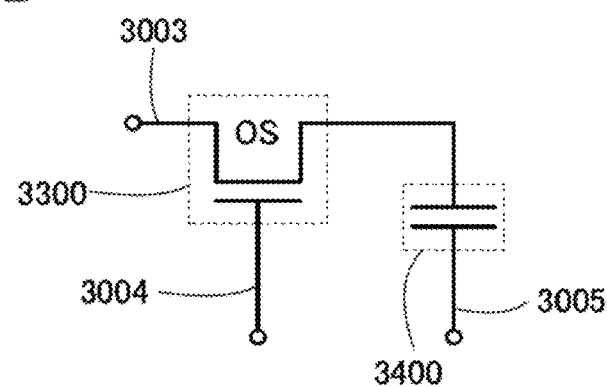

An example of a semiconductor device (memory device) which includes the transistor of one embodiment of the present invention, which can retain stored data even when not powered, and which has an unlimited number of write cycles is shown in FIGS. 35A and 35B.

The semiconductor device illustrated in FIG. 35A includes a transistor 3200 using a first semiconductor, a transistor 3300 using a second semiconductor, and a capacitor 3400. Note that a transistor similar to the above-described transistor 2100 can be used as the transistor 3300. Here, the transistor 3200 is formed using the element layer 50, the transistor 3300 is formed using the element layer 30, and the capacitor 3400 is formed using the element layer 40, whereby the circuit shown in FIG. 35A can be configured using the semiconductor device illustrated in FIG. 16 or the like.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 35A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 35A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charge providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is brought into "on state." In the case where the low-level electric charge is supplied to the node FG in writing, even when the potential of the fifth wiring 3005 is $V_0$($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. A configuration in which only data of a desired memory cell can be read by supplying a potential at which the transistor 3200 is brought into an "off state" regardless of the charge supplied to the node FG, that is, a potential lower than $V_{th\_H}$ to the fifth wiring 3005 of memory cells from which data is not read may be employed, for example. Alternatively, a configuration in which only data of a desired memory cell can be read by supplying a potential at which the transistor 3200 is brought into an "on state" regardless of the charge supplied to the node FG, that is, a potential higher than $V_{th\_L}$ to the fifth wiring 3005 of memory cells from which data is not read may be employed.

Although an example in which two kinds of electric charge are retained in the node FG, the semiconductor device of the present invention is not limited to this example. For example, a structure in which three or more kinds of electric charge can be retained in the node FG of the semiconductor device may be employed. With such a structure, the semiconductor device can be a multi-level semiconductor device with increased storage capacity.

<Memory Device 2>

The semiconductor device in FIG. 35B is different from the semiconductor device in FIG. 35A in that the transistor 3200 is not provided. Also in this case, data can be written and retained in a manner similar to that of the semiconductor device in FIG. 35A. Here, in the circuit shown in FIG. 35B, the transistor 3300 can be formed using the transistor 60a or the transistor 60b illustrated in FIGS. 13A to 13D, and the capacitor 3400 can be formed using the capacitor 80a and the like illustrated in FIGS. 14A to 14C. In addition, a sense amplifier or the like can be provided below the semiconductor device shown in FIG. 35B, in which case the transistor 90a or the transistor 90b illustrated in FIGS. 15A to 15D can be used in the sense amplifier.

Reading of data in the semiconductor device in FIG. 35B is described. When the transistor 3300 is brought into on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is unlikely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Memory Device 3>

A modification example of the semiconductor device (memory device) illustrated in FIG. 35A is described with reference to a circuit diagram in FIG. 36.

Figure 36:
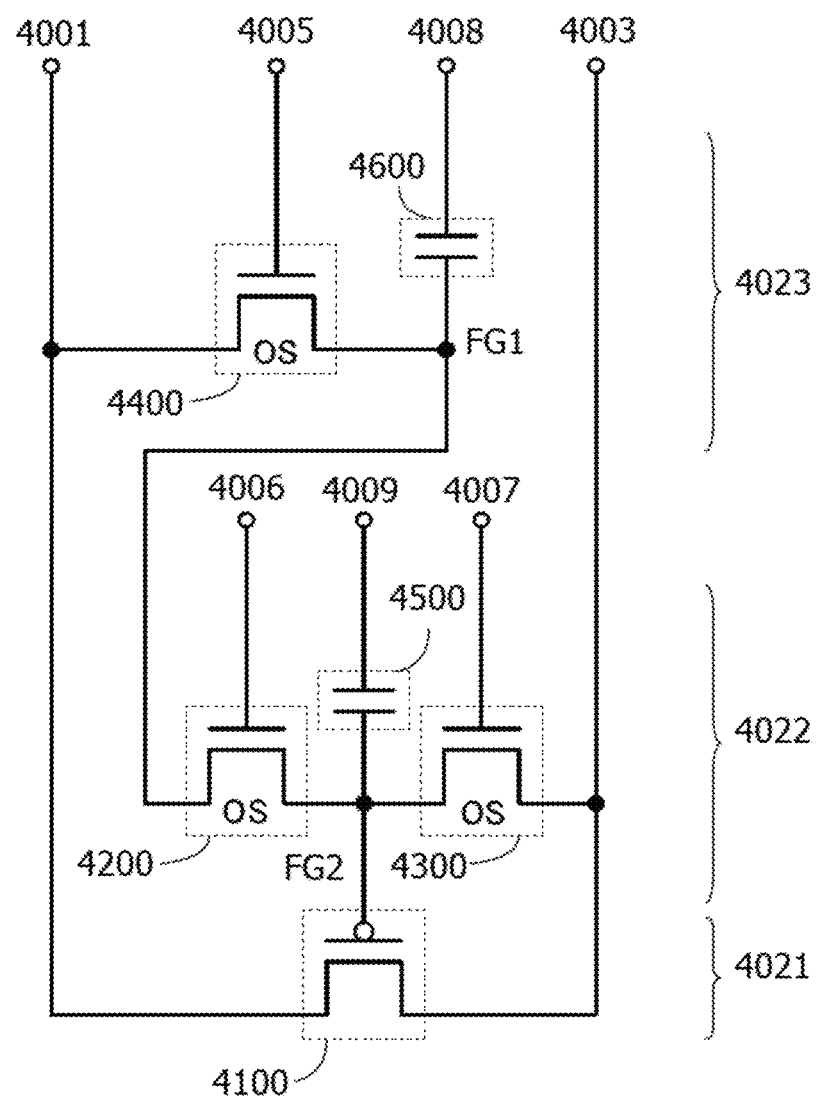
FIG. 36 is a circuit diagram illustrating a memory device of one embodiment of the present invention.

The semiconductor device illustrated in FIG. 36 includes transistors 4100, 4200, 4300, and 4400 and capacitors 4500 and 4600. Here, a transistor similar to the above-described transistor 3200 can be used as the transistor 4100, and transistors similar to the above-described transistor 3300 can be used as the transistors 4200 to 4400. Although not illustrated in FIG. 36, a plurality of semiconductor devices in FIG. 36 are provided in a matrix. The semiconductor devices in FIG. 36 can control writing and reading of a data voltage in accordance with a signal or a potential supplied to a wiring 4001, a wiring 4003, and wirings 4005 to 4009. Here, in the circuit shown in FIG. 36, the transistor 4100 can be formed using the transistor 90a or the transistor 90b illustrated in FIGS. 15A to 15D; the transistor 4200, the transistor 4300, and the transistor 4400 can each be formed using the transistor 60a or the transistor 60b illustrated in FIGS. 13A to 13D; and the capacitor 4500 and the capacitor 4600 can each be formed using the capacitor 80a illustrated in FIGS. 14A to 14C.

One of a source and a drain of the transistor 4100 is connected to the wiring 4003. The other of the source and the drain of the transistor 4100 is connected to the wiring 4001. Although the transistor 4100 is a p-channel transistor in FIG. 36, the transistor 4100 may be an n-channel transistor.

The semiconductor device in FIG. 36 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining an electric charge. Note that, as each of the transistors 4200, 4300, and 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200, 4300, and 4400 are n-channel transistors in FIG. 36, the transistors 4200, 4300, and 4400 may be p-channel transistors.

The transistors 4200 and 4300 are preferably provided in a layer different from the layer where the transistor 4400 is provided even when the transistors 4200, 4300, and 4400 are transistors including oxide semiconductors. In other words, the semiconductor device in FIG. 36 preferably includes, as illustrated in FIG. 36, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 36 is described.

First, operation of writing data voltage to the data retention portion connected to the node FG1 (hereinafter referred to as writing operation 1) is described. In the following description, data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. The current flows through the transistor 4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between a gate and a source of the transistor 4100 reaches the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}-V_{th}$" in which $V_{D1}$ is decreased by $V_{th}$.

When a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing data voltage to the data retention portion connected to the node FG2 (hereinafter referred to as writing operation 2) is described. In the following description, data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 36, after data voltages are written to the plurality of data retention portions, the wiring 4009 is set at the high level, so that the potentials of the nodes FG1 and FG2 are increased. Then, the transistors are turned off to stop the movement of electric charge; thus, the written data voltages are retained.

By the above-described writing operation of the data voltages to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multi-level data. Therefore, in the case where the data retention portions each retain 4-bit data, 16-level "$V_{D1}-V_{th}$" and 16-level "$V_{D2}-V_{th}$" can be obtained.

Next, operation of reading data from the semiconductor device illustrated in FIG. 36 is described.

First, operation of reading data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$", by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D2}$". In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, data voltage in the data retention portion connected to the node FG1 is transferred to the data retention portion connected to the node FG2. The wirings 4001 and 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$". Thus, the capacitance of the capacitor 4600 is preferably larger than the capacitance of the capacitor 4500. Alternatively, the potential written to the node FG1, "$V_{D1}-V_{th}$", is preferably larger than the potential corresponding to the same data, "$V_{D2}-V_{th}$". By changing the ratio of the capacitances and setting the written potential larger in advance as described above, a decrease in potential after the electric charge distribution can be suppressed. The change in potential due to the electric charge distribution is described later.

Next, operation of reading data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$". The potential of the node FG2 is decreased, so that a current flows through the transistor 4100. The current flows, so that the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$", by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D1}$". In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 36, the storage capacity can be increased by adding layers without increasing the area of the semiconductor device.

The read potential can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled out in reading. As a result, the storage capacity per memory cell can be improved and read data can be close to accurate data; thus, the data reliability becomes excellent.

<Memory Device 4>

Figure 35C:
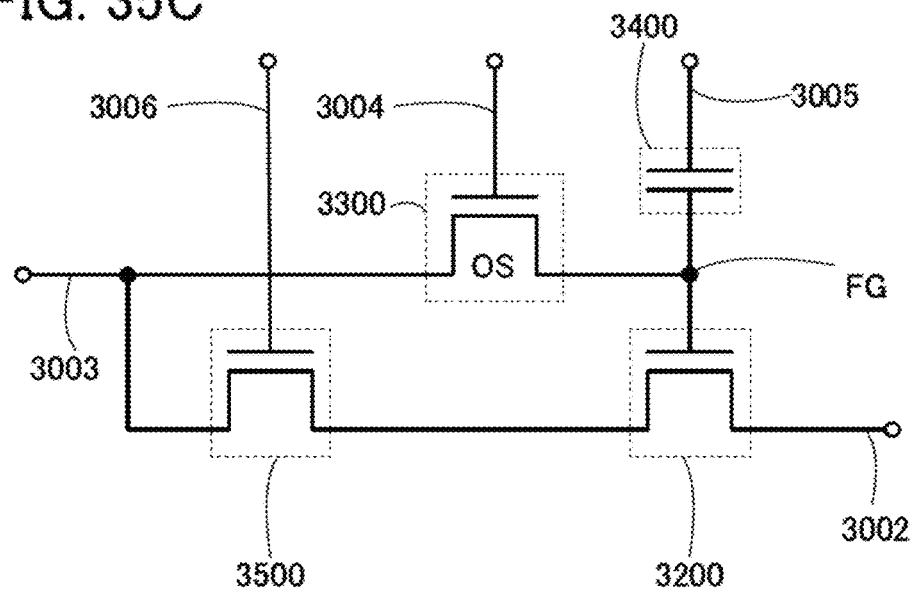

The semiconductor device in FIG. 35C is different from the semiconductor device in FIG. 35A in that the transistor 3500 and a sixth wiring 3006 are included. Also in this case, data can be written and retained in a manner similar to that of the semiconductor device in FIG. 35A. A transistor similar to the transistor 3200 described above can be used as the transistor 3500. Here, the transistor 3200 and the transistor 3500 are each formed using the element layer 50, the transistor 3300 is formed using the element layer 30, and the capacitor 3400 is formed using the element layer 40, whereby the circuit shown in FIG. 35A can be configured using the semiconductor device illustrated in FIG. 10A or 10B. Here, in the circuit shown in FIG. 35C, the transistor 3200 and the transistor 3500 can each be formed using the transistor 90a or the transistor 90b illustrated in FIGS. 15A to 15D, the transistor 3300 can be formed using the transistor 60a or the transistor 60b illustrated in FIGS. 13A to 13D, and the capacitor 3400 can be formed using the capacitor 80a illustrated in FIGS. 14A to 14C.

The sixth wiring 3006 is electrically connected to a gate of the transistor 3500, one of a source and a drain of the transistor 3500 is electrically connected to the drain of the transistor 3200, and the other of the source and the drain of the transistor 3500 is electrically connected to the third wiring 3003.

The structure described in this embodiment can be used in appropriate combination with the structure described in any of the other embodiments.

Embodiment 4

In this embodiment, circuit configuration examples to which the OS transistors described in the above embodiment can be used are described with reference to FIGS. 37A to 37C, FIGS. 38A to 38C, FIGS. 39A and 39B, and FIGS. 40A and 40B.

Figure 37A:
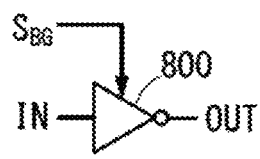
FIGS. 37A to 37C are circuit diagrams and a timing chart illustrating one embodiment of the present invention.

FIG. 37A is a circuit diagram of an inverter. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 37B:
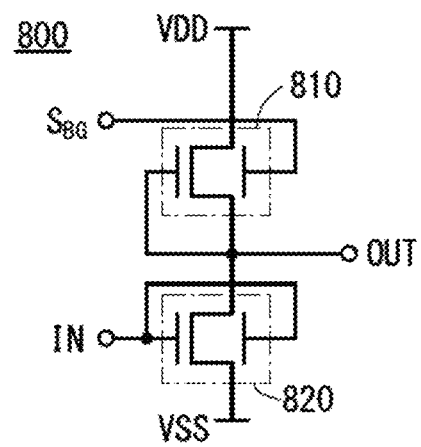

FIG. 37B illustrates an example of the inverter 800. The inverter 800 includes an OS transistor 810 and an OS transistor 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including Si transistors. Since the inverter 800 can be provided so as to overlap with the CMOS circuit, no additional area is required for the inverter 800, and thus, an increase in the circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage VSS.

Figure 37C:
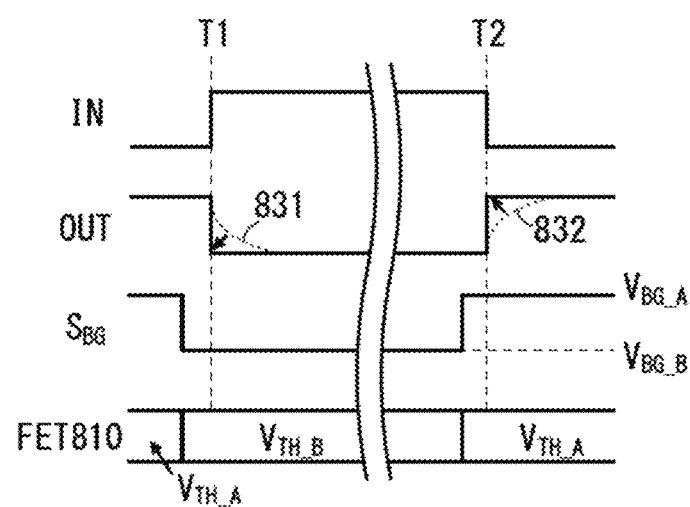

FIG. 37C is a timing chart illustrating the operation of the inverter 800. The timing chart in FIG. 37C illustrates changes of a signal waveform of the input terminal IN, a signal waveform of the output terminal OUT, a signal waveform of the signal $S_{BG}$, and the threshold voltage of the OS transistor 810 (FET 810).

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG\_B}$ is applied to the second gate.

Figure 38A:
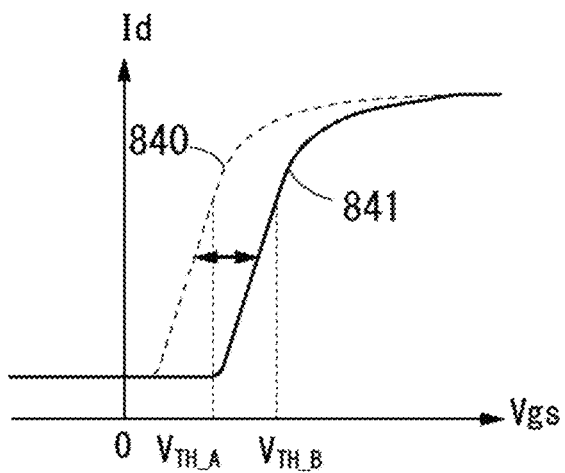
FIGS. 38A to 38C are a graph and circuit diagrams illustrating one embodiment of the present invention.

To visualize the above description, FIG. 38A shows a $V_g$-$I_d$ curve, which is one of indicators of the transistor's electrical characteristics.

When a high voltage such as the voltage $V_{BG\_A}$ is applied to the second gate, the electrical characteristics of the OS transistor 810 can be shifted to match a curve shown by a dashed line 840 in FIG. 38A. When a low voltage such as the voltage $V_{BG\_B}$ is applied to the second gate, the electrical characteristics of the OS transistor 810 can be shifted to match a curve shown by a solid line 841 in FIG. 38A. As shown in FIG. 38A, switching the signal $S_{BG}$ between the voltage $V_{BG\_A}$ and the voltage $V_{BG\_B}$ enables the threshold voltage of the OS transistor 810 to be shifted in the negative direction or the positive direction.

Figure 38B:
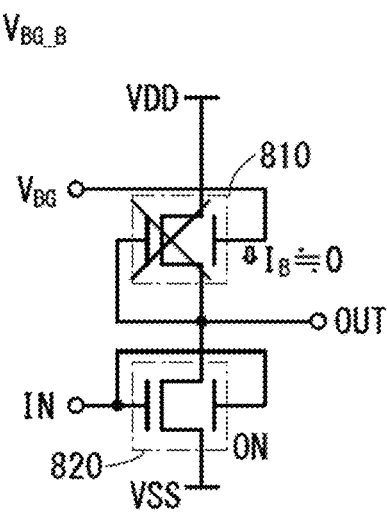

The shift of the threshold voltage in the positive direction toward the threshold voltage $V_{TH\_B}$ can make a current less likely to flow in the OS transistor 810. FIG. 38B visualizes the state. As illustrated in FIG. 38B, a current $I_B$ that flows in the OS transistor 810 can be extremely low. Thus, when a signal supplied to the input terminal IN is at a high level and the OS transistor 820 is on (ON), the voltage of the output terminal OUT can drop sharply.

Since a state in which a current is less likely to flow in the OS transistor 810 as illustrated in FIG. 38B can be obtained, a signal waveform 831 of the output terminal in the timing chart in FIG. 37C can be made steep. Shoot-through current between the wiring that supplies the voltage VDD and the wiring that supplies the voltage VSS can be low, leading to low-power operation.

Figure 38C:
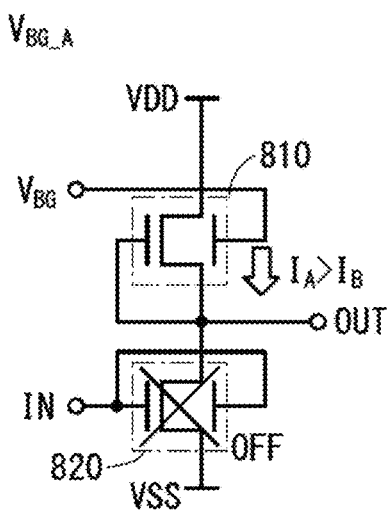

The shift of the threshold voltage in the negative direction toward the threshold voltage $V_{TH\_A}$ can make a current flow easily in the OS transistor 810. FIG. 38C visualizes the state. As illustrated in FIG. 38C, a current $I_A$ flowing at this time can be higher than at least the current $I_B$. Thus, when a signal supplied to the input terminal IN is at a low level and the OS transistor 820 is off (OFF), the voltage of the output terminal OUT can be increased sharply.

Since a state in which current is likely to flow in the OS transistor 810 as illustrated in FIG. 38C can be obtained, a signal waveform 832 of the output terminal in the timing chart in FIG. 37C can be made steep.

Note that the threshold voltage of the OS transistor 810 is preferably controlled by the signal $S_{BG}$ before the state of the OS transistor 820 is switched, i.e., before time T1 or time T2. For example, as in FIG. 37C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 37C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 39A:
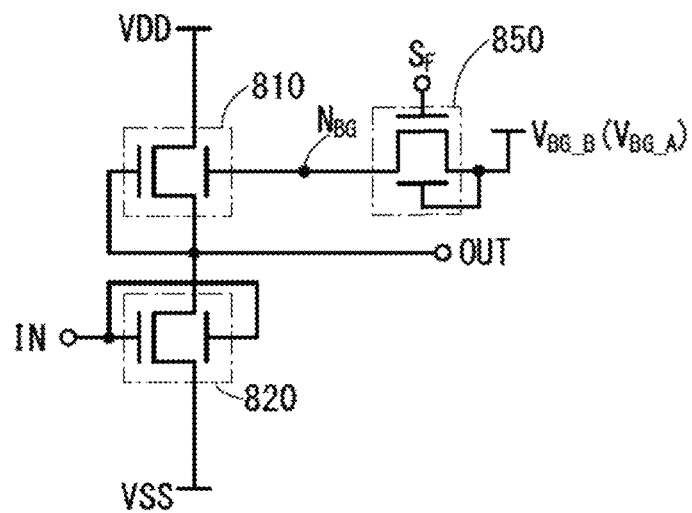
FIGS. 39A and 39B are a circuit diagram and a timing chart illustrating one embodiment of the present invention.

Although the timing chart in FIG. 37C illustrates the structure in which the level of the signal $S_{BG}$ is switched in accordance with the signal supplied to the input terminal IN, a different structure may be employed in which voltage for controlling the threshold voltage is held by the second gate of the OS transistor 810 in a floating state, for example. FIG. 39A illustrates an example of such a circuit configuration.

The circuit configuration in FIG. 39A is the same as that in FIG. 37B, except that an OS transistor 850 is added. A first terminal of the OS transistor 850 is connected to the second gate of the OS transistor 810. A second terminal of the OS transistor 850 is connected to a wiring that supplies the voltage $V_{BG\_B}$ (or the voltage $V_{BG\_A}$). A first gate of the OS transistor 850 is connected to a wiring that supplies a signal $S_F$. A second gate of the OS transistor 850 is connected to the wiring that supplies the voltage $V_{BG\_B}$ (or the voltage $V_{BG\_A}$).

Figure 39B:
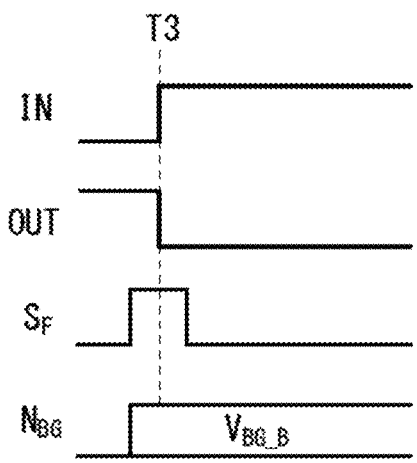

The operation with the circuit configuration in FIG. 39A is described with reference to a timing chart in FIG. 39B.

The voltage for controlling the threshold voltage of the OS transistor 810 is supplied to the second gate of the OS transistor 810 before time T3 at which the level of the signal supplied to the input terminal IN is switched to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off and the node $N_{BG}$ is in a state that is very close to a floating state. Therefore, the number of times the voltage $V_{BG\_B}$ is supplied to the second gate of the OS transistor 850 can be reduced and accordingly, the power consumption for rewriting the voltage $V_{BG\_B}$ can be reduced.

Figure 40A:
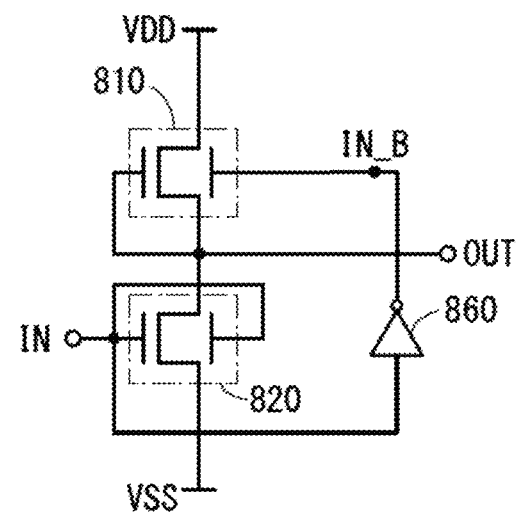
FIGS. 40A and 40B are a circuit diagram and a timing chart illustrating one embodiment of the present invention.

Although FIG. 37B and FIG. 39A each illustrate the case where the voltage is supplied to the second gate of the OS transistor 810 by control from the outside, a different structure may be employed in which voltage for controlling the threshold voltage is generated on the basis of the signal supplied to the input terminal IN and supplied to the second gate of the OS transistor 810, for example. FIG. 40A illustrates an example of such a circuit configuration.

The circuit configuration in FIG. 40A is the same as that in FIG. 37B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit configuration in FIG. 40A is described with reference to a timing chart in FIG. 40B. The timing chart in FIG. 40B illustrates changes of a signal waveform of the input terminal IN, a signal waveform of the output terminal OUT, an output waveform IN_B of the CMOS inverter 860, and a threshold voltage of the OS transistor 810 (FET 810).

The output waveform IN_B which corresponds to a signal whose logic is inverted from the logic of the signal supplied to the input terminal IN can be used as a signal that controls the threshold voltage of the OS transistor 810. Thus, the threshold voltage of the OS transistor 810 can be controlled as described with reference to FIGS. 38A to 38C. For example, the signal supplied to the input terminal IN is at a high level and the OS transistor 820 is turned on at time T4 in FIG. 40B. At this time, the output waveform IN_B is at a low level. Accordingly, a current can be made less likely to flow in the OS transistor 810; thus, the voltage of the output terminal OUT can be sharply decreased.

Figure 40B:
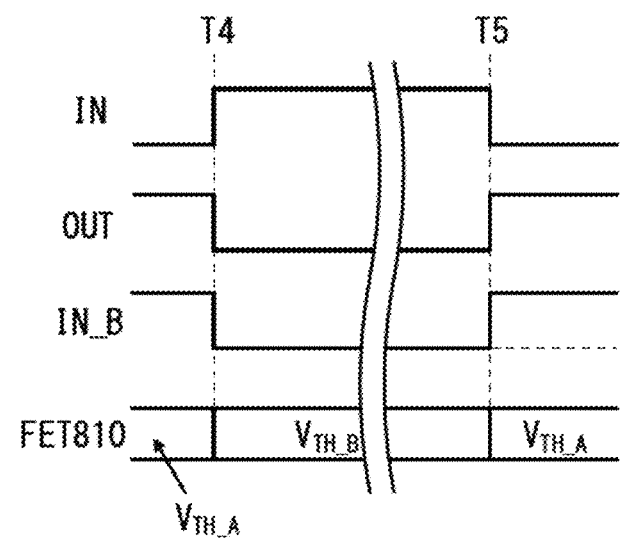

Moreover, the signal supplied to the input terminal IN is at a low level and the OS transistor 820 is turned off at time T5 in FIG. 40B. At this time, the output waveform IN_B is at a high level. Accordingly, a current can easily flow in the OS transistor 810; thus, a rise in the voltage of the output terminal OUT can be made steep.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

Embodiment 5

In this embodiment, examples of a semiconductor device which includes a plurality of circuits including OS transistors described in the above embodiment are described with reference to FIGS. 41A to 41E, FIGS. 42A and 42B, FIGS. 43A and 43B, FIGS. 44A to 44C, FIGS. 45A and 45B, FIGS. 46A to 46C, and FIGS. 47A and 47B.

Figure 41A:
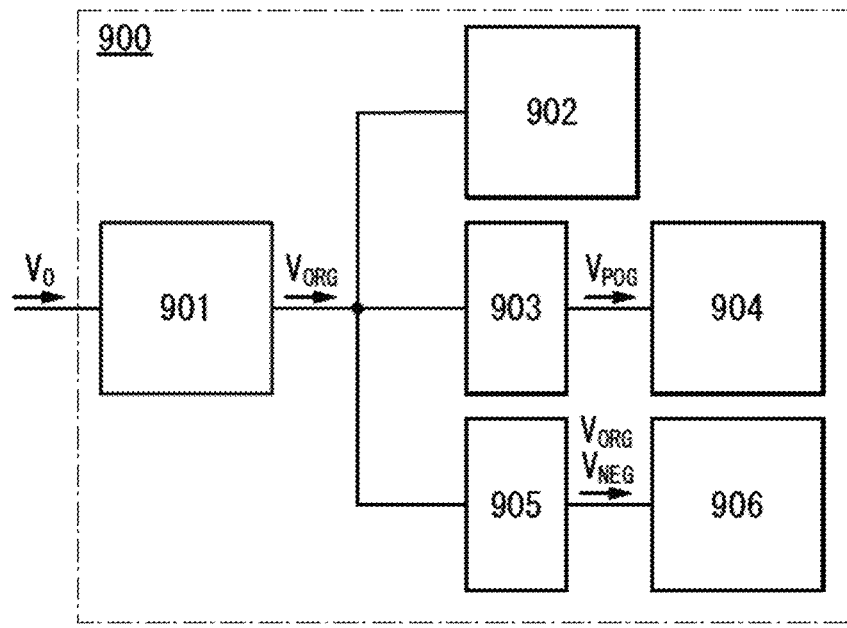
FIGS. 41A to 41E are a block diagram, circuit diagrams, and waveform diagrams for illustrating one embodiment of the present invention.

FIG. 41A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without the supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG}>V_{SS}$). For example, the power supply voltage of the circuit 904 is a voltage applied on the basis of a voltage $V_{POG}$ and the voltage $V_{SS}$ ($V_{POG} > V_{ORG}$). For example, the power supply voltages of the circuit 906 are voltages applied on the basis of the voltage $V_{ORG}$, the voltage $V_{SS}$, and a voltage $V_{NEG}$ ($V_{ORG} > V_{SS} > V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 41B:
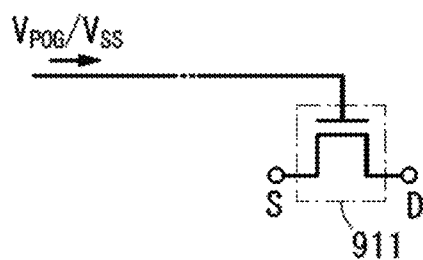
Figure 41C:
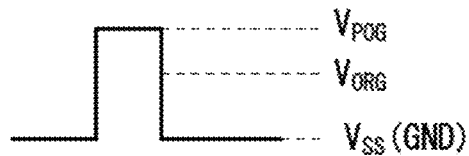

FIG. 41B illustrates an example of the circuit 904 that operates with the voltage $V_{POG}$ and FIG. 41C illustrates an example of a waveform of a signal for operating the circuit 904.

FIG. 41B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ at the time when the transistor 911 is turned on and on the basis of the voltage $V_{SS}$ at the time when the transistor 911 is turned off. As shown in FIG. 41C, the voltage $V_{POG}$ is higher than the voltage $V_{ORG}$. Therefore, an operation for bringing a source (S) and a drain (D) of the transistor 911 into a conduction state can be performed more surely. As a result, the frequency of malfunction of the circuit 904 can be reduced.

Figure 41D:
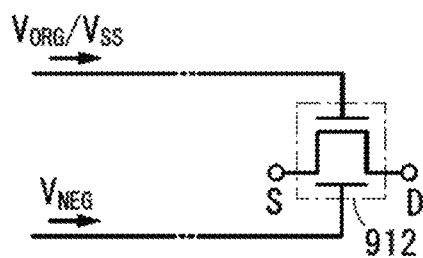
Figure 41E:
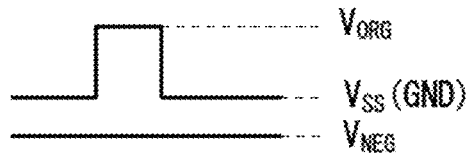

FIG. 41D illustrates an example of the circuit 906 that operates with the voltage $V_{NEG}$ and FIG. 41E illustrates an example of a waveform of a signal for operating the circuit 906.

FIG. 41D illustrates a transistor 912 having a back gate. A signal supplied to a gate of the transistor 912 is generated on the basis of, for example, the voltage $V_{ORG}$ and the voltage $V_{SS}$. The signal has generated on the basis of the voltage $V_{ORG}$ at the time when the transistor 912 is turned on and on the basis of the voltage $V_{SS}$ at the time when the transistor 912 is turned off. A signal supplied to the back gate of the transistor 912 is generated on the basis of the voltage $V_{NEG}$. As shown in FIG. 41E, the voltage $V_{NEG}$ is lower than the voltage $V_{SS}$ (GND). Therefore, the threshold voltage of the transistor 912 can be controlled so as to be shifted in the positive direction. Thus, the transistor 912 can be surely turned off and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may be supplied to the back gate of the transistor 912.

Figure 42A:
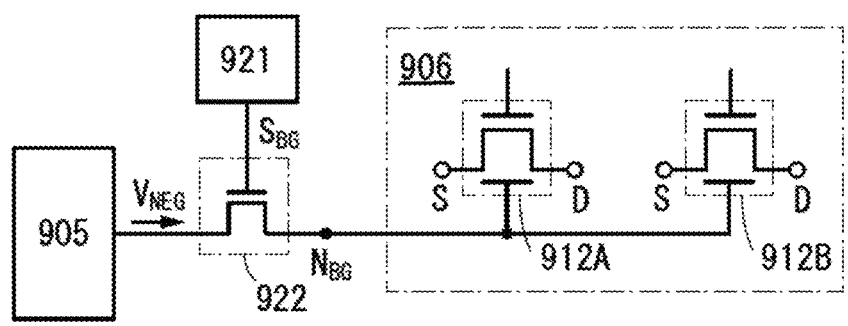
FIGS. 42A and 42B are a circuit diagram and a timing chart illustrating one embodiment of the present invention.
Figure 42B:
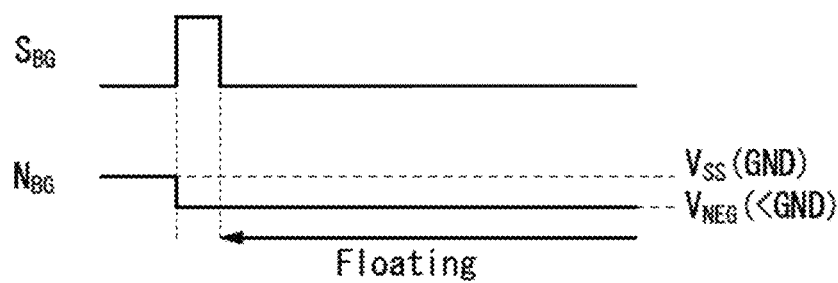

FIGS. 42A and 42B illustrate a modification example of FIGS. 41D and 41E.

In a circuit diagram illustrated in FIG. 42A, a transistor 922 whose conduction state can be controlled by a control circuit 921 is provided between the voltage generation circuit 905 and the circuit 906. The transistor 922 is an n-channel OS transistor. The control signal $S_{BG}$ output from the control circuit 921 is a signal for controlling the conduction state of the transistor 922. Transistors 912A and 912B included in the circuit 906 are the same OS transistors as the transistor 922.

A timing chart in FIG. 42B shows changes in a potential of the control signal $S_{BG}$ and a potential of the node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be held.

Figure 43A:
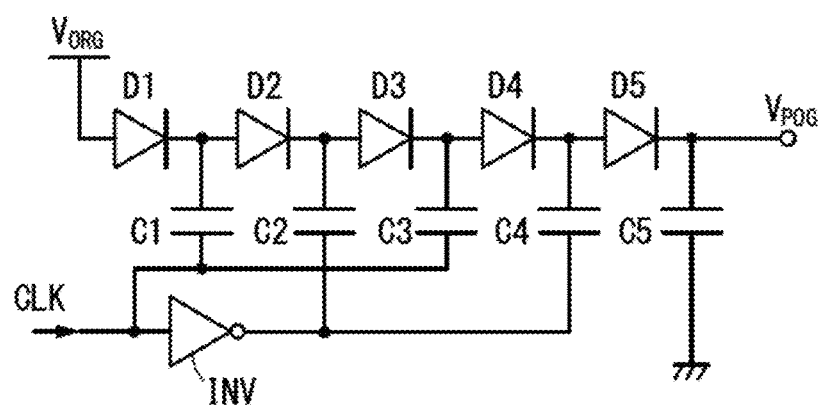
FIGS. 43A and 43B are circuit diagrams each illustrating one embodiment of the present invention.

FIG. 43A illustrates an example of a circuit configuration applicable to the above-described voltage generation circuit 903. The voltage generation circuit 903 illustrated in FIG. 43A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that a forward voltage of the diodes D1 to D5 is 0 V. A desired voltage $V_{POG}$ can be obtained when the number of stages of the charge pump is changed.

Figure 43B:
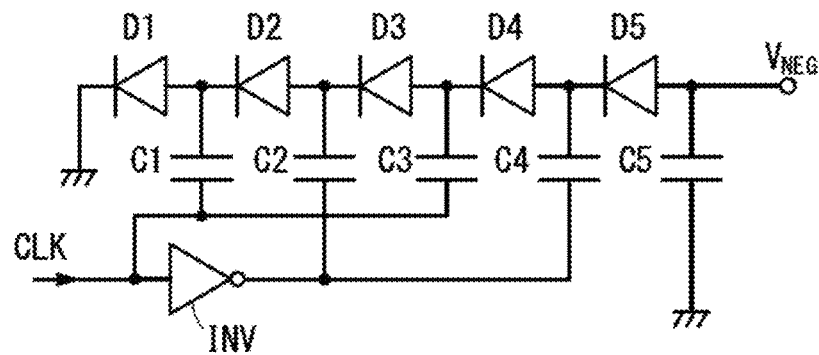

FIG. 43B illustrates an example of a circuit configuration applicable to the above-described voltage generation circuit 905. The voltage generation circuit 905 illustrated in FIG. 43B is a four-stage charge pump including the diodes D1 to D5, the capacitors C1 to C5, and the inverter INV. The clock signal CLK is supplied to the capacitors C1 to C4 directly or through the inverter INV. When a power supply voltage of the inverter INV is a voltage applied on the basis of the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by application of the clock signal CLK, can be obtained. Note that a forward voltage of the diodes D1 to D5 is 0 V. A desired voltage $V_{NEG}$ can be obtained when the number of stages of the charge pump is changed.

The circuit configuration of the voltage generation circuit 903 is not limited to the configuration of the circuit diagram illustrated in FIG. 43A. Modification examples of the voltage generation circuit 903 are shown in FIGS. 44A to 44C and FIGS. 45A and 45B.

Figure 44A:
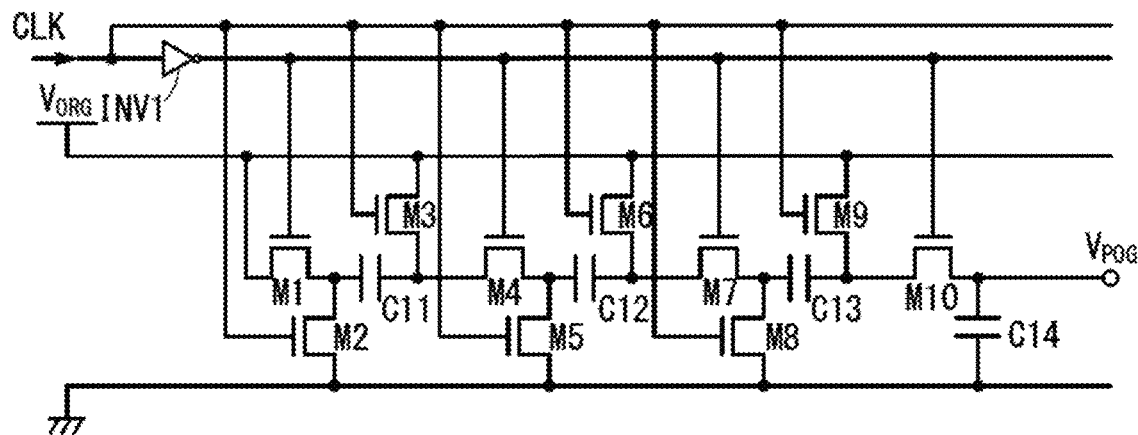
FIGS. 44A to 44C are circuit diagrams each illustrating one embodiment of the present invention.

The voltage generation circuit 903A illustrated in FIG. 44A includes transistors M1 to M10, capacitors C11 to C14, and an inverter INV1. The clock signal CLK is supplied to gates of the transistors M1 to M10 directly or through the inverter INV1. By application of the clock signal CLK, the voltage $V_{POG}$, which has been increased to a positive voltage having a positively quadrupled value of the voltage $V_{ORG}$, can be obtained. A desired voltage $V_{POG}$ can be obtained when the number of stages is changed. In the voltage generation circuit 903A in FIG. 44A, off-state current of each of the transistors M1 to M10 can be low when the transistors M1 to M10 are OS transistors, and leakage of charge held in the capacitors C11 to C14 can be suppressed.

Accordingly, raising from the voltage $V_{ORG}$ to the voltage $V_{POG}$ can be efficiently performed.

Figure 44B:
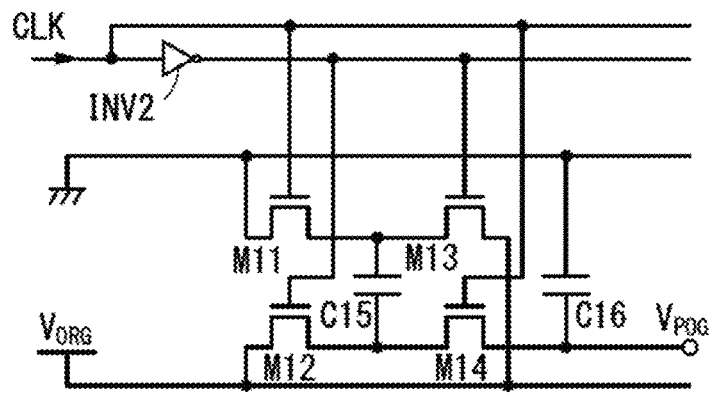

The voltage generation circuit 903B illustrated in FIG. 44B includes transistors M11 to M14, capacitors C15 and C16, and an inverter INV2. The clock signal CLK is supplied to gates of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 903B in FIG. 44B, off-state current of each of the transistors M11 to M14 can be low when the transistors M11 to M14 are OS transistors, and leakage of charge held in the capacitors C15 and C16 can be suppressed. Accordingly, raising from the voltage $V_{ORG}$ to the voltage $V_{POG}$ can be efficiently performed.

Figure 44C:
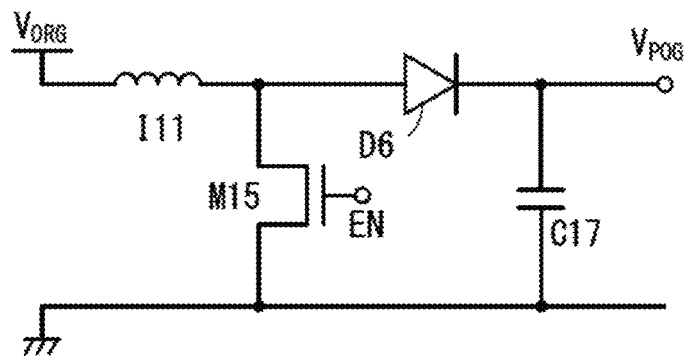

The voltage generation circuit 903C in FIG. 44C includes an inductor Ill, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 44C increases the voltage using the inductor Ill, the voltage can be increased efficiently.

Figure 45A:
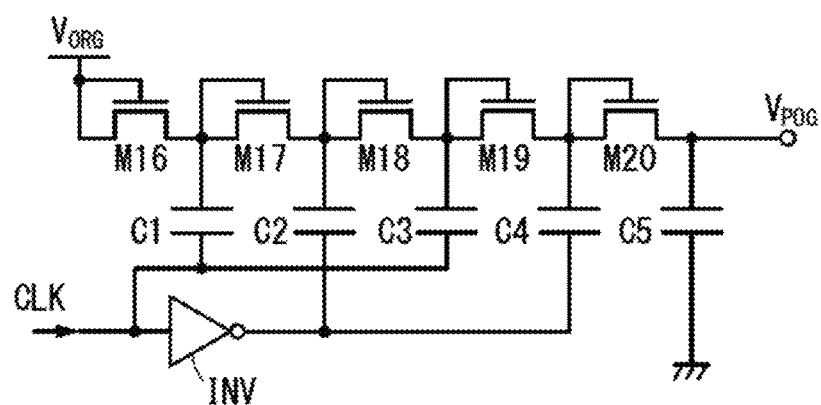
FIGS. 45A and 45B are circuit diagrams each illustrating one embodiment of the present invention.

A voltage generation circuit 903D in FIG. 45A has a configuration in which the diodes D1 to D5 of the voltage generation circuit 903 in FIG. 43A are replaced with diode-connected transistors M16 to M20. In the voltage generation circuit 903D in FIG. 45A, when the OS transistors are used as the transistors M16 to M20, the off-state current can be reduced, so that leakage of charge held in the capacitors C1 to C5 can be inhibited. Thus, efficient voltage increase from the voltage $V_{ORG}$ to the voltage $V_{POG}$ is possible.

Figure 45B:
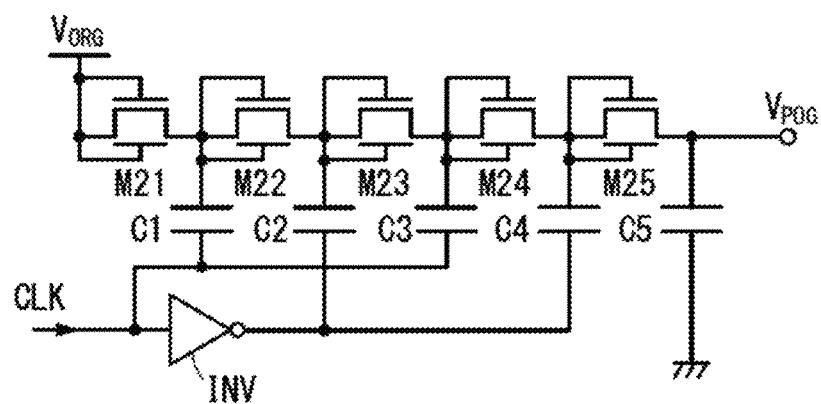
Figure 46A:
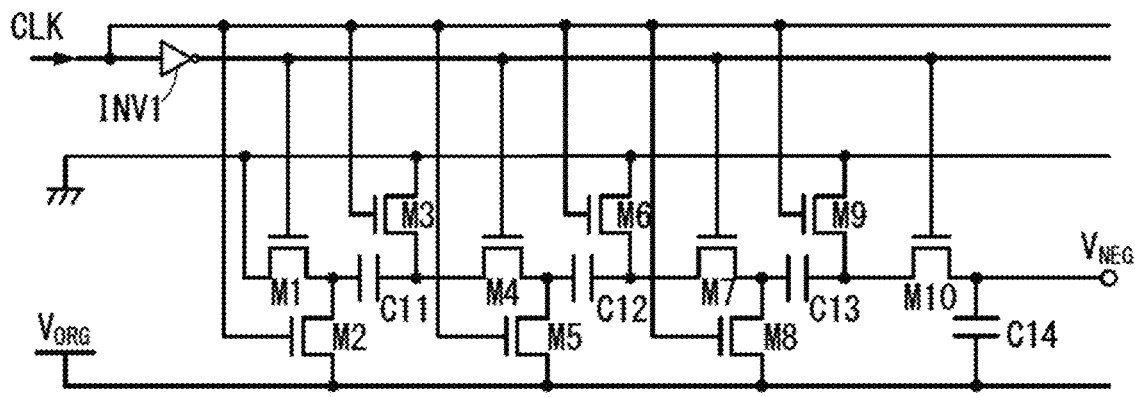
FIGS. 46A to 46C are circuit diagrams each illustrating one embodiment of the present invention.
Figure 46B:
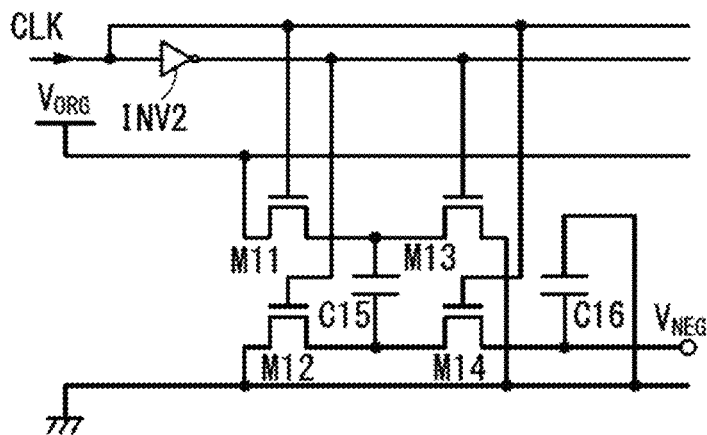
Figure 46C:
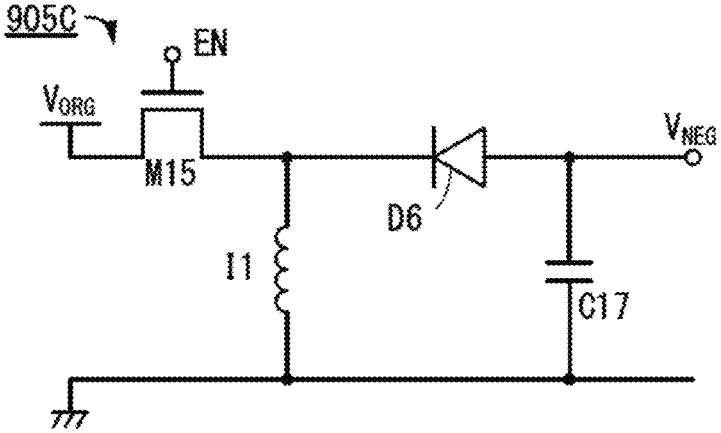
Figure 47A:
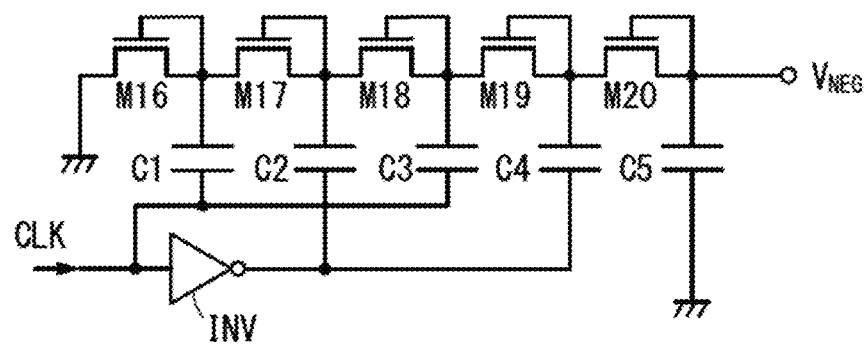
FIGS. 47A and 47B are circuit diagrams each illustrating one embodiment of the present invention.
Figure 47B:
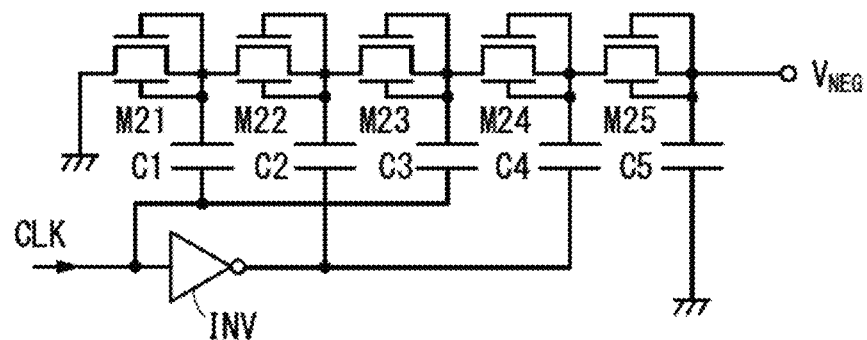

A voltage generation circuit 903E in FIG. 45B has a configuration in which the transistors M16 to M20 of the voltage generation circuit 903D in FIG. 45A are replaced with transistor M21 to M25 having back gates. In the voltage generation circuit 903E in FIG. 45B, the back gates can be supplied with voltages that are the same as those of the gates, so that the current flowing through the transistors can be increased. Thus, efficient voltage increase from the voltage $V_{ORG}$ to the voltage $V_{POG}$ is possible.

Note that the modification examples of the voltage generation circuit 903 can also be applied to the voltage generation circuit 905 in FIG. 43B. The configurations of a circuit diagram in this case are illustrated in FIGS. 46A to 46C and FIGS. 47A and 47B. In a voltage generation circuit 905A illustrated in FIG. 46A, the voltage $V_{NEG}$ which has been reduced from the voltage $V_{SS}$ to a negative voltage having a negatively tripled value of the voltage $V_{ORG}$ by application of the clock signal CLK, can be obtained. In a voltage generation circuit 905B illustrated in FIG. 46B, the voltage $V_{NEG}$ which has been reduced from the voltage $V_{SS}$ to a negative voltage having a negatively doubled value of the voltage $V_{ORG}$ by application of the clock signal CLK, can be obtained.

The voltage generation circuits 905A to 905E illustrated in FIGS. 46A to 46C and FIGS. 47A and 47B have configurations formed by changing the voltages applied to the wirings or the arrangement of the elements of the voltage generation circuits 903A to 903E illustrated in FIGS. 44A to 44C and FIGS. 45A and 45B. In the voltage generation circuits 905A to 905E illustrated in FIGS. 46A to 46C and FIGS. 47A and 47B, an efficient voltage decrease from the voltage $V_{SS}$ to the voltage $V_{NEG}$ is possible.

As described above, in any of the structures of this embodiment, a voltage required for circuits included in a semiconductor device can be internally generated. Thus, in the semiconductor device, the kinds of power supply voltages supplied from the outside can be reduced.

Embodiment 6

In this embodiment, an example of CPU including semiconductor devices such as the transistor of one embodiment of the present invention and the above-described memory device is described. A configuration of CPU described below can be formed using the semiconductor illustrated in FIG. 16 or the like.

<Configuration of CPU>

Figure 48:
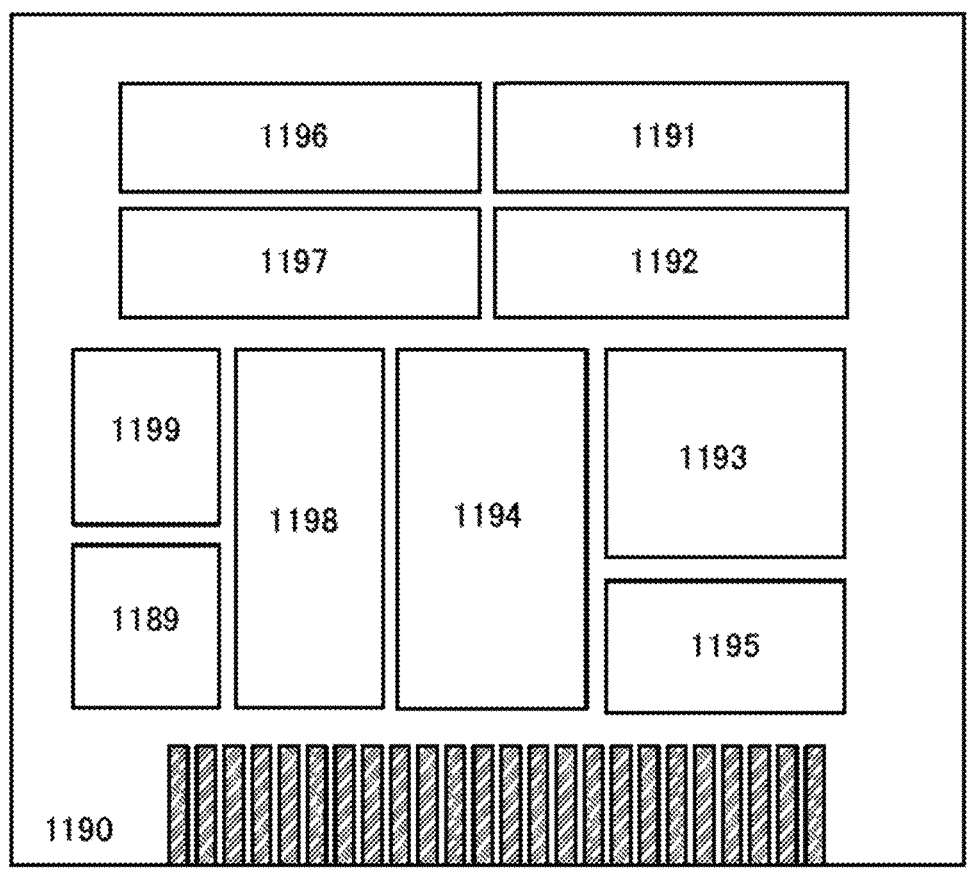
FIG. 48 is a block diagram illustrating a semiconductor device of one embodiment of the present invention.

FIG. 48 is a block diagram illustrating a configuration example of a CPU including any of the above-described transistors as a component. The following configuration of the CPU can be obtained using the semiconductor device illustrated in FIG. 16 or the like.

The CPU illustrated in FIG. 48 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The rewritable ROM 1199 and the ROM interface 1189 may be provided over a separate chip. Needless to say, the CPU in FIG. 48 is just an example in which the configuration has been simplified, and an actual CPU may have a variety of configurations depending on the application. For example, the CPU may have the following configuration: a structure including the CPU illustrated in FIG. 48 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 48, a memory cell is provided in the register 1196. For the memory cell of the register 1196, any of the above-described transistors, the above-described memory device, or the like can be used.

In the CPU illustrated in FIG. 48, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 49:
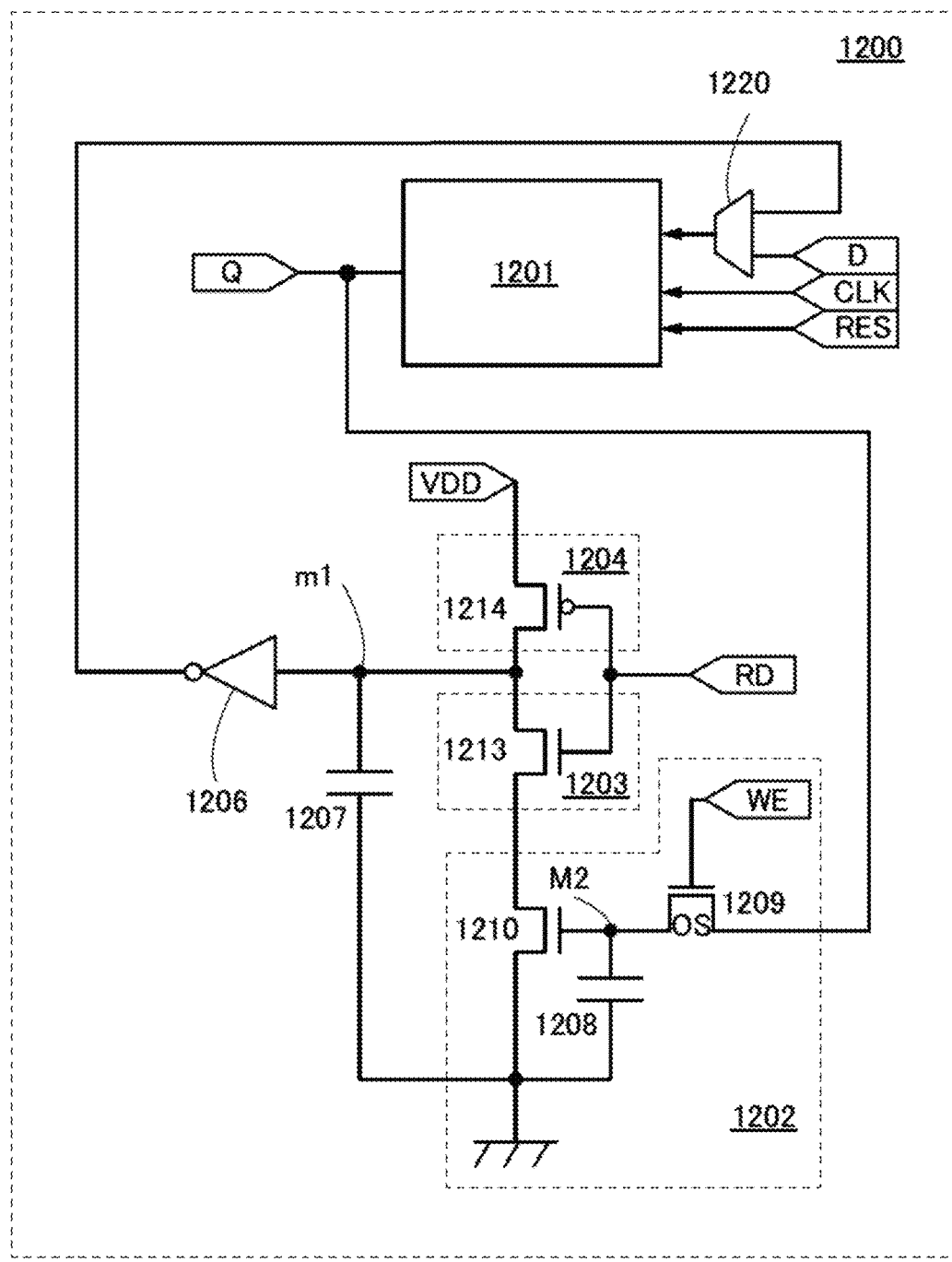
FIG. 49 is a circuit diagram illustrating a semiconductor device of one embodiment of the present invention.

FIG. 49 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node ml. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 49 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 49, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 49, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 49, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the state of the transistor 1210 (the on state or the off state) is determined in accordance with the signal retained by the capacitor 1208, and a signal can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a programmable logic device (PLD), or a custom LSI, and a radio frequency (RF) device.

The structure described in this embodiment can be used in appropriate combination with any of the structures described in the other embodiments.

Embodiment 7

In this embodiment, an example of an imaging device including the transistor or the like of one embodiment of the present invention is described.
<Imaging Device>

An imaging device of one embodiment of the present invention is described below.

Figure 50A:
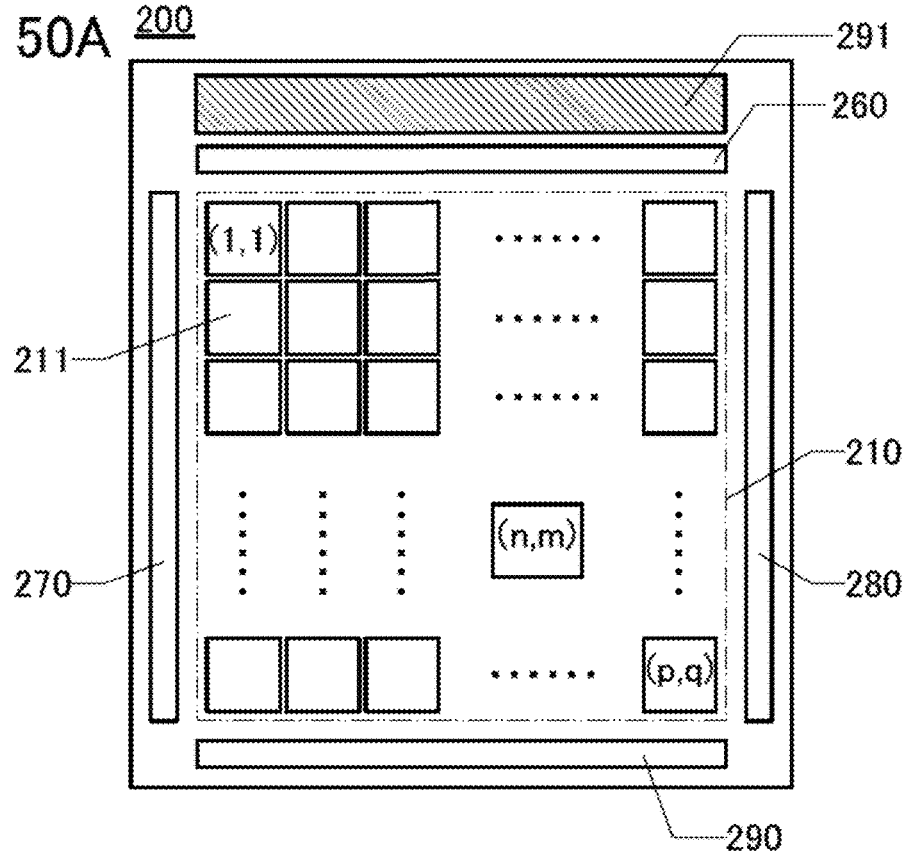
FIGS. 50A and 50B are top views each illustrating a semiconductor device of one embodiment of the present invention.

FIG. 50A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer of 2 or more). The peripheral circuit 260, the peripheral circuit 270, the peripheral circuit 280, and the peripheral circuit 290 are each connected to the plurality of pixels 211, and a signal for driving the plurality of pixels 211 is supplied. In this specification and the like, in some cases, a "peripheral circuit" or a "driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. A semiconductor device such as an IC chip may be used as part or the whole of the peripheral circuit. Note that as the peripheral circuit, one or more of the peripheral circuits 260, 270, 280, and 290 may be omitted.

Figure 50B:
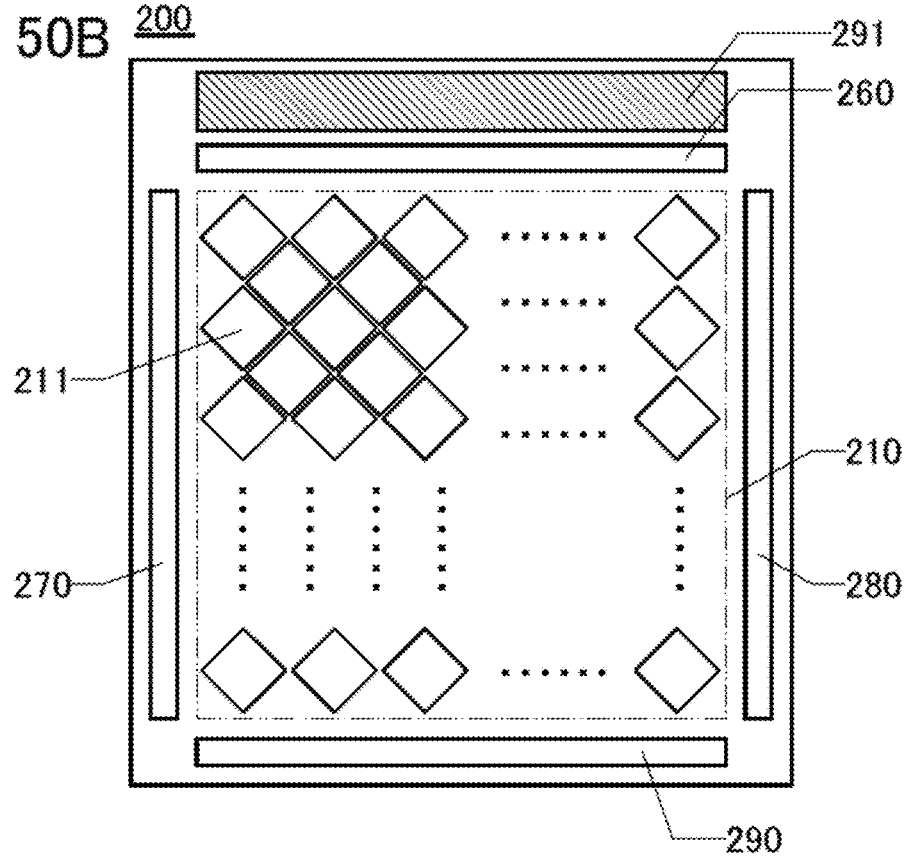

As illustrated in FIG. 50B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

Configuration Example 1 of Pixel

The pixel 211 included in the imaging device 200 is formed with a plurality of subpixels 212, and each subpixel 212 is combined with a filter (color filter) which transmits light in a specific wavelength band, whereby data for achieving color image display can be obtained.

Figure 51A:
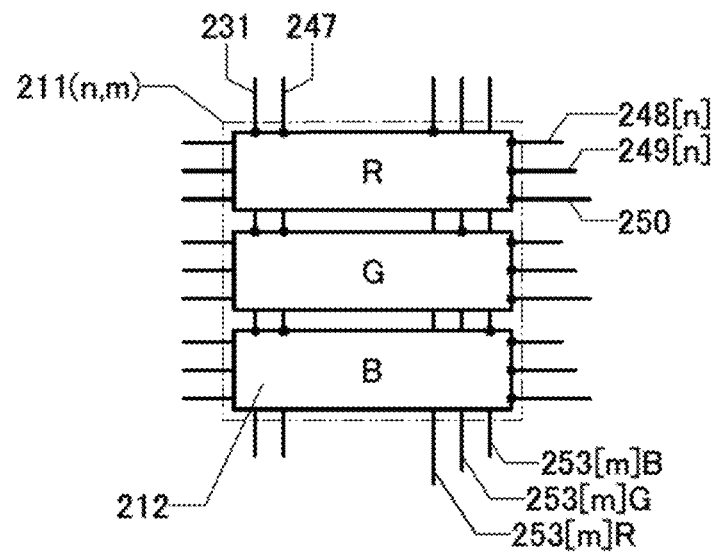
FIGS. 51A and 51B are block diagrams illustrating a semiconductor device of one embodiment of the present invention.

FIG. 51A is a top view showing an example of the pixel 211 with which a color image is obtained. The pixel 211 illustrated in FIG. 51A includes a subpixel 212 provided with a color filter that transmits light in a red (R) wavelength band (also referred to as a subpixel 212R), a subpixel 212 provided with a color filter that transmits light in a green (G) wavelength band (also referred to as a subpixel 212G), and a subpixel 212 provided with a color filter that transmits light in a blue (B) wavelength band (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independently provided. In this specification and the like, for example, the wiring 248 and the wiring 249 that are connected to the pixel 211 in the n-th row are referred to as a wiring 248[$n$] and a wiring 249[$n$]. For example, the wiring 253 connected to the pixel 211 in the m-th column is referred to as a wiring 253[$m$]. Note that in FIG. 51A, the wirings 253 connected to the subpixel 212R, the subpixel 212G, and the subpixel 212B in the pixel 211 in the m-th column are referred to as a wiring 253[$m$]R, a wiring 253[$m$]G, and a wiring 253[$m$]B. The subpixels 212 are electrically connected to the peripheral circuit through the above wirings.

Figure 51B:
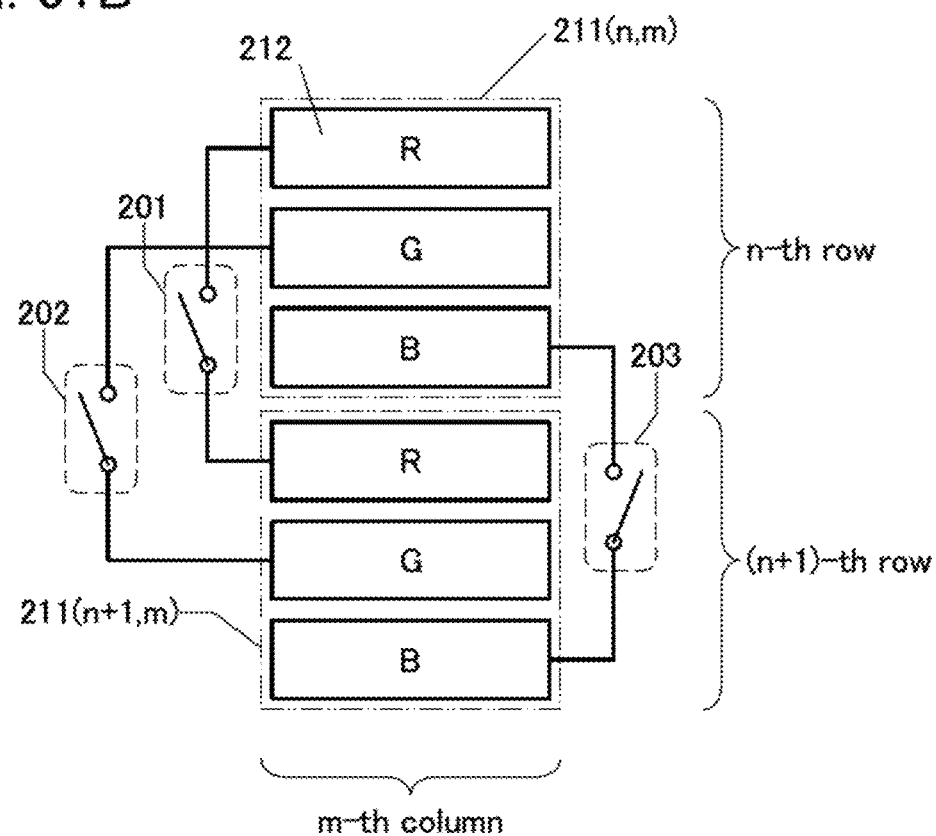

The imaging device 200 has a structure in which the subpixel 212 is electrically connected to the subpixel 212 in an adjacent pixel 211 which is provided with a color filter transmitting light in the same wavelength band as the subpixel 212, via a switch. FIG. 51B shows a connection example of the subpixels 212: the subpixel 212 in the pixel 211 arranged in the n-th (n is an integer greater than or equal to 1 and less than or equal to p) row and the m-th (m is an integer greater than or equal to 1 and less than or equal to q) column and the subpixel 212 in the adjacent pixel 211 arranged in an (n+1)-th row and the m-th column. In FIG. 51B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light in three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light in four different wavelength bands are provided in one pixel 211, the reproducibility of colors of an obtained image can be increased.

For example, in FIG. 51A, in regard to the subpixel 212 sensing light in a red wavelength band, the subpixel 212 sensing light in a green wavelength band, and the subpixel 212 sensing light in a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing light in the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 52A and 52B. With the lens 255, the photoelectric conversion element can receive incident light efficiently. Specifically, as illustrated in FIG. 52A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with dashed dotted lines, however, part of the light 256 indicated by arrows might be blocked by some wirings 257. Thus, a preferable structure is such that the lens 255 and the filter 254 are provided on the photoelectric conversion element 220 side as illustrated in FIG. 52B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 52A:
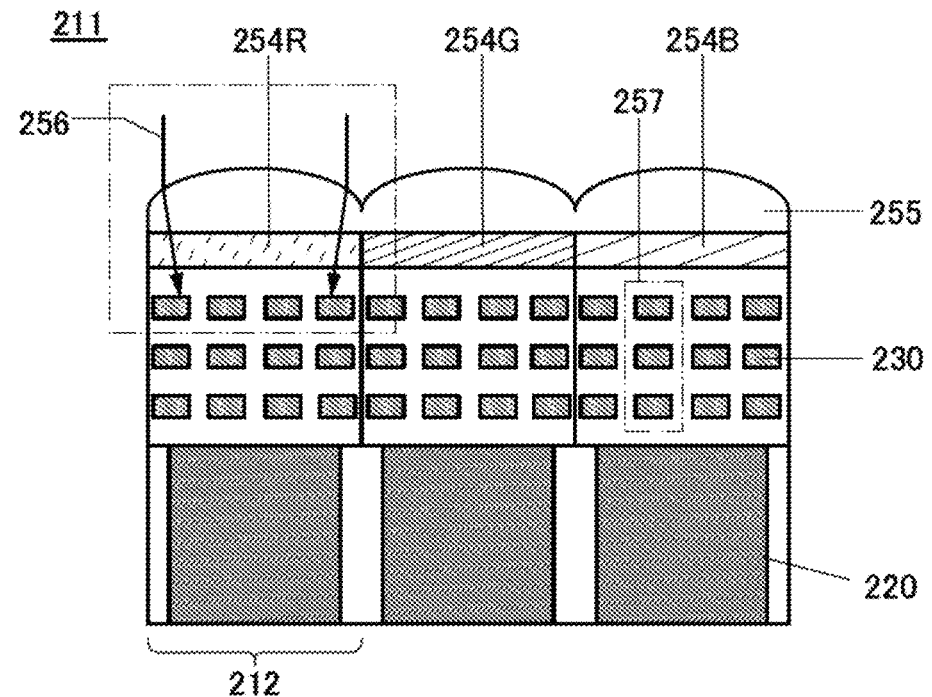
FIGS. 52A and 52B are cross-sectional views each illustrating a semiconductor device of one embodiment of the present invention.
Figure 52B:
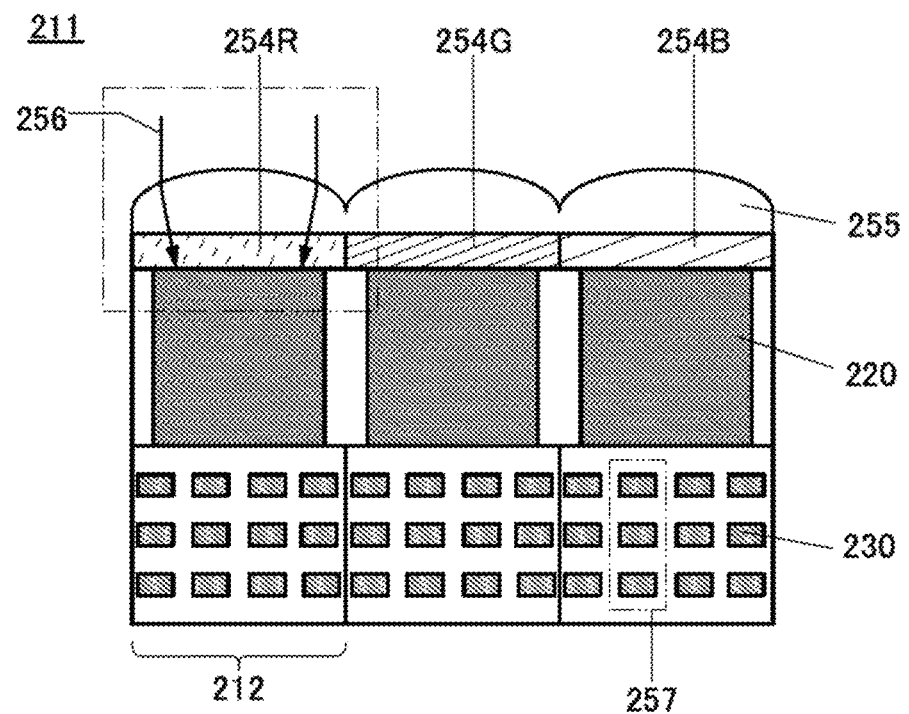

As the photoelectric conversion element 220 illustrated in FIGS. 52A and 52B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength band, such as visible light, ultraviolet light, infrared light, X-rays, and gamma rays.

One pixel 211 included in the imaging device 200 may include the subpixel 212 with a first filter in addition to the subpixel 212 illustrated in FIGS. 51A and 51B.

Configuration Example 2 of Pixel

An example of a pixel including a transistor including silicon and a transistor including an oxide semiconductor is described below. A transistor similar to any of the transistors described in the above embodiment can be used as each of the transistors.

Figure 53:
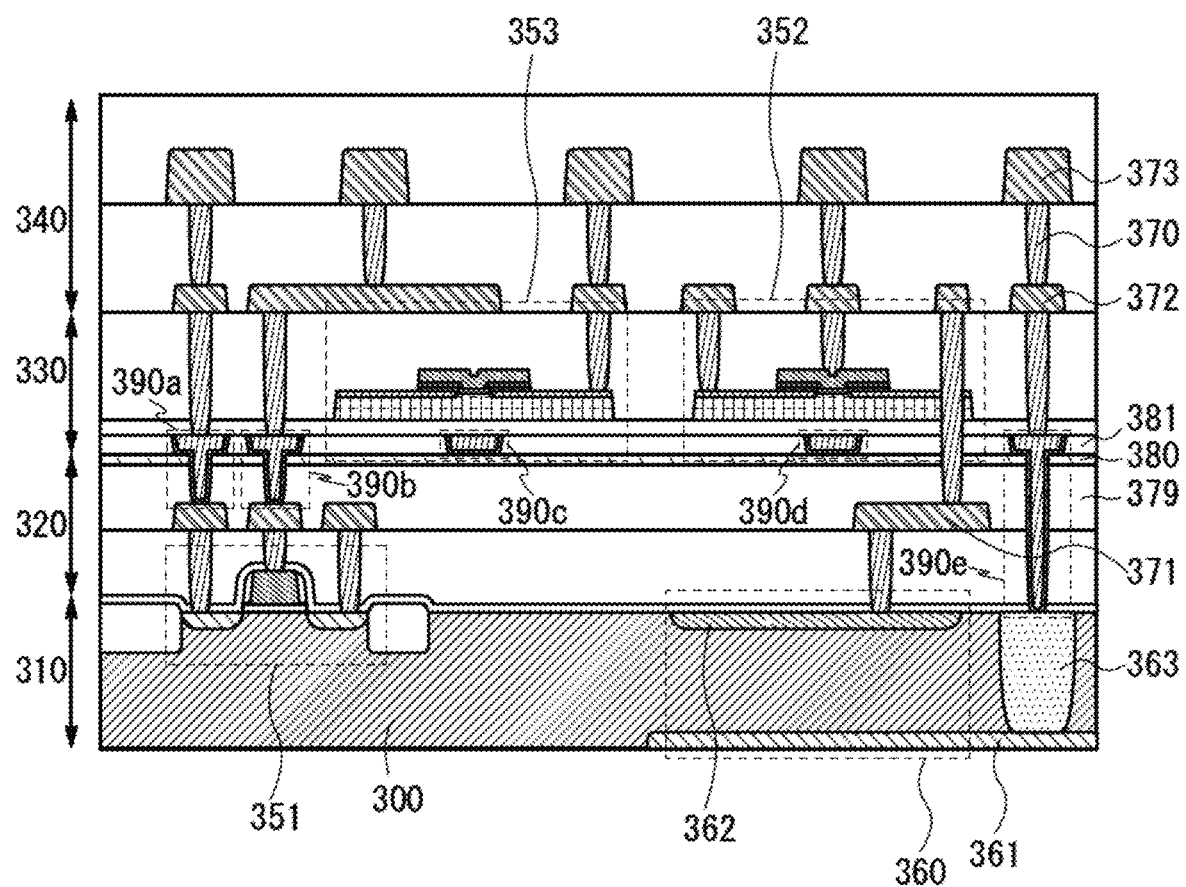
FIG. 53 is a cross-sectional view illustrating a semiconductor device of one embodiment of the present invention.

FIG. 53 is a cross-sectional view of an element included in an imaging device. The imaging device illustrated in FIG. 53 includes a transistor 351 including silicon over a silicon substrate 300, transistors 352 and 353 which include an oxide semiconductor and are stacked over the transistor 351, and a photodiode 360 provided in the silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of the cross-sectional view in FIG. 53, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors including an oxide semiconductor, the layer 310 may include the transistor including an oxide semiconductor. Alternatively, the layer 310 may be omitted, and the pixel may include only transistors including an oxide semiconductor.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380. An insulator 379 is provided under the insulator 380, and an insulator 381 is provided over the insulator 380. Here, the insulator 379 corresponds to the insulator 110 illustrated in FIG. 16, the insulator 380 corresponds to the insulator 61 illustrated in FIG. 16, and the insulator 381 corresponds to the insulator 67 illustrated in FIG. 16.

Conductors 390a to 390e are provided in openings formed in the insulators 379 and 380. The conductors 390a, 390b, and 390e correspond to the conductor 121a, the conductor 122a, and the like illustrated in FIG. 16 and function as plugs and wirings. The conductor 390c corresponds to the conductor 62a and the conductor 62b illustrated in FIG. 16 and functions as a back gate of the transistor 353. The conductor 390d corresponds to the conductor 62a and the conductor 62b illustrated in FIG. 16 and functions as a back gate of the transistor 352.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. For this reason, in the case where the transistor including an oxide semiconductor is provided over the transistor including a silicon-based semiconductor, it is preferable that the insulator 380 having a function of blocking hydrogen be provided between the transistors. When the hydrogen is confined in layers below the insulator 380, the reliability of the transistor 351 can be improved. In addition, the hydrogen can be prevented from diffusing from the layers below the insulator 380 to layers above the insulator 380; thus, the reliability of the transistor 352, the transistor 353, and the like can be increased. The conductors 390a, 390b, and 390e can prevent hydrogen from diffusing to the layers provided thereover through the via holes formed in the insulator 380, resulting in improvement in the reliability of the transistors 352 and 353 and the like.

In the cross-sectional view in FIG. 53, the photodiode 360 in the layer 310 and the transistor in the layer 330 can be formed so as to overlap with each other. Thus, the degree of integration of pixels can be increased. In other words, the resolution of the imaging device can be increased.

Part or the whole of the imaging device may be bent. The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction in size or weight of electronic devices using the imaging device, and the like, can be achieved. In addition, the quality of a captured image can be improved.

The structure described in this embodiment can be used in appropriate combination with the structure described in any of the other embodiments.

Embodiment 8

In this embodiment, electronic devices including the transistor or the like of one embodiment of the present invention are described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 54A to 54F illustrate specific examples of these electronic devices.

Figure 54A:
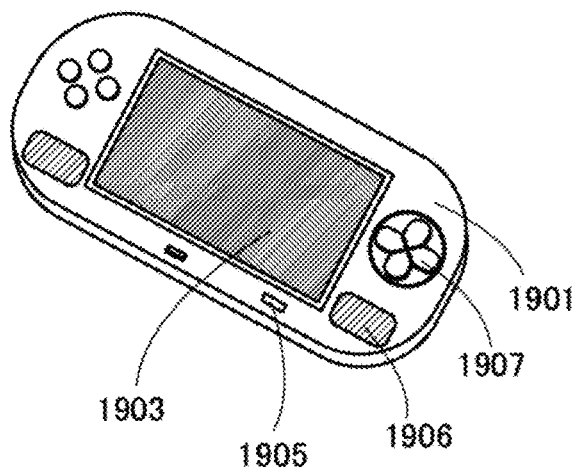
FIGS. 54A to 54F are perspective views each illustrating an electronic device of one embodiment of the present invention.

FIG. 54A illustrates a portable game console including a housing 1901, a display portion 1903, a microphone 1905, a speaker 1906, an operation key 1907, and the like. Although the portable game console in FIG. 54A has the one display portion 1903, the number of display portions included in the portable game console is not limited to this. For example, a plurality of display portions may be included. In addition, a stylus for operating the display portion 1903 may be attached.

Figure 54B:
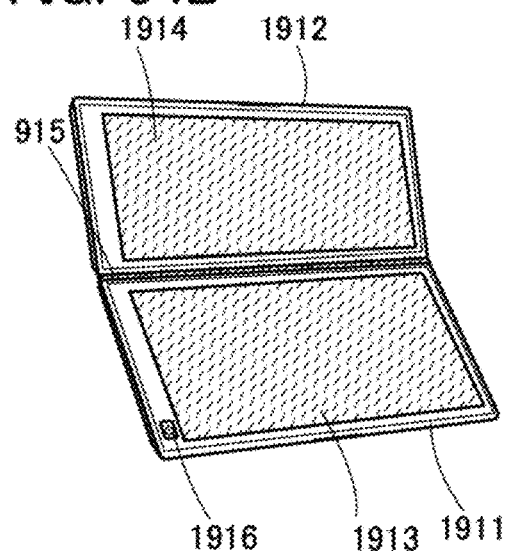

FIG. 54B illustrates a portable data terminal including a first housing 1911, a second housing 1912, a first display portion 1913, a second display portion 1914, a joint 1915, an operation key 1916, and the like. The first display portion 1913 is provided in the first housing 1911, and the second display portion 1914 is provided in the second housing 1912. The first housing 1911 and the second housing 1912 are connected to each other with the joint 1915, and the angle between the first housing 1911 and the second housing 1912 can be changed with the joint 1915. An image on the first display portion 1913 may be switched in accordance with the angle at the joint 1915 between the first housing 1911 and the second housing 1912. A display device with a position input function may be used as at least one of the first display portion 1913 and the second display portion 1914. Note that the position input function can be added by providing a touch panel in a display device. Alternatively, the position input function can be added by providing a photoelectric conversion element called a photosensor in a pixel portion of a display device.

Figure 54C:
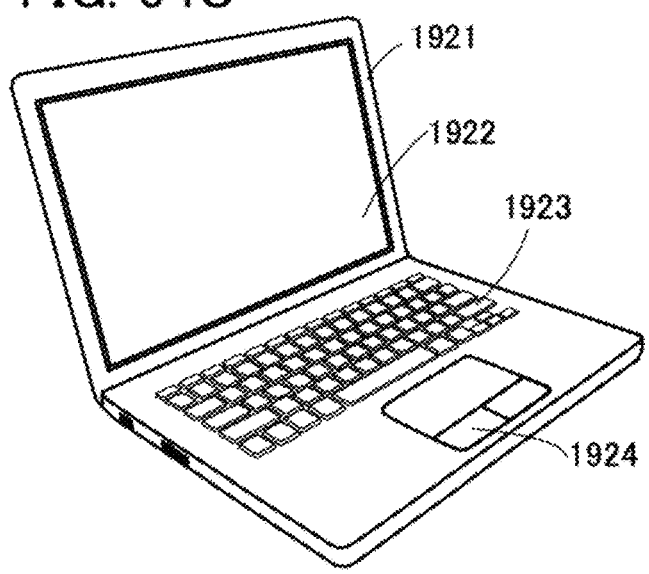

FIG. 54C illustrates a notebook personal computer, which includes a housing 1921, a display portion 1922, a keyboard 1923, a pointing device 1924, and the like.

Figure 54D:
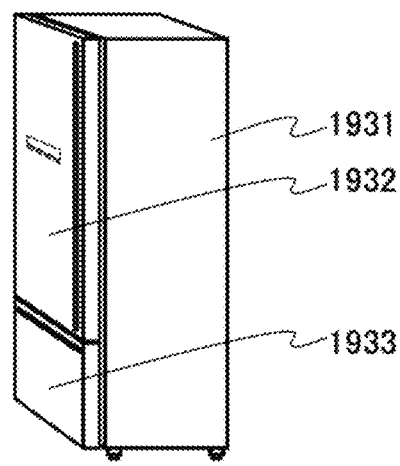

FIG. 54D illustrates an electric refrigerator-freezer, which includes a housing 1931, a door for a refrigerator 1932, a door for a freezer 1933, and the like.

Figure 54E:
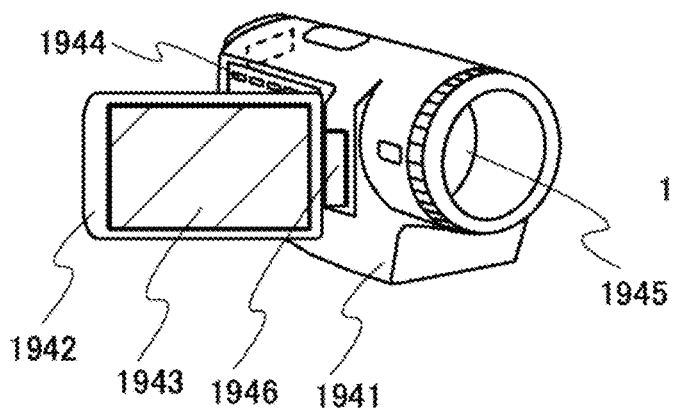

FIG. 54E illustrates a video camera, which includes a first housing 1941, a second housing 1942, a display portion 1943, operation keys 1944, a lens 1945, a joint 1946, and the like. The operation keys 1944 and the lens 1945 are provided for the first housing 1941, and the display portion 1943 is provided for the second housing 1942. The first housing 1941 and the second housing 1942 are connected to each other with the joint 1946, and the angle between the first housing 1941 and the second housing 1942 can be changed with the joint 1946. Images displayed on the display portion 1943 may be switched in accordance with the angle at the joint 1946 between the first housing 1941 and the second housing 1942.

Figure 54F:
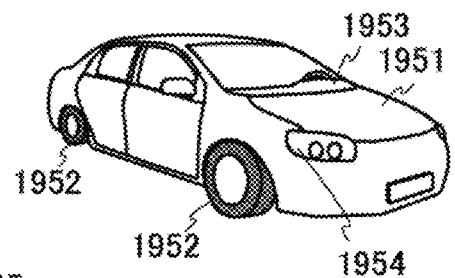

FIG. 54F illustrates a car including a car body 1951, wheels 1952, a dashboard 1953, lights 1954, and the like.

In Embodiment 8, embodiments of the present invention have been described. However, embodiments of the present invention are not limited to the above-described embodiments. That is, various embodiments of the invention are described in this embodiment and the like, and one embodiment of the present invention is not limited to a particular embodiment. Although an example in which a channel formation region, a source region, a drain region, or the like of a transistor includes an oxide semiconductor is described as one embodiment of the present invention, one embodiment of the present invention is not limited to this example. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor. The structure described in this embodiment can be used in appropriate combination with the structure described in any of the other embodiments.

Example 1

This example describes observation results of a wiring and a plug formed by the method described in the above embodiment. The observations were performed using a scanning electron microscope (SEM) and a scanning transmission electron microscope (STEM).

Samples of this example were each formed in the following manner: a tungsten film, a silicon oxide film, an aluminum oxide film, and a silicon oxynitride film were stacked in this order; the stacked films were etched to form an opening; and a tantalum film, a titanium film, and a tungsten film were stacked in this order to be embedded in the opening.

Processes for fabricating Sample 1A and Sample 1B used in this example were described below. Note that the process for Sample 1A differs from that for Sample 1B in a way to form the tantalum nitride film. A sputtering method and a collimated sputtering method were used to form the tantalum nitride films in Sample 1A and Sample 1B, respectively.

First, a silicon substrate was prepared and subjected to heat treatment in an HCl atmosphere so as to form a thermally oxidized silicon film with a thickness of 100 nm.

Next, a tungsten film (hereinafter, denoted by W in the drawings) was formed over the thermally oxidized silicon film by a sputtering method so as to have a thickness of 50 nm.

After that, a silicon oxide film (hereinafter, denoted by $SiO_x$ in the drawings) was formed over the tungsten film by a PECVD method so as to have a thickness of 200 nm. As for the flow rates of the deposition gases in the formation of the silicon oxide film, the flow rates of a TEOS gas and an oxygen gas were 15 sccm and 750 sccm, respectively.

Then, an aluminum film (hereinafter, denoted by $AlO_x$ in the drawings) was formed over the silicon oxide film by a sputtering method so as to have a thickness of 30 nm. In the formation of the aluminum oxide film, an aluminum oxide target was used, the flow rates of an argon gas and an oxygen gas were each 25 sccm, the power of an RF power source was 2.5 kW, the pressure was 0.4 Pa, and the substrate temperature was 250° C.

Subsequently, a silicon oxynitride film (hereinafter, denoted by SiON in the drawings) was formed over the aluminum oxide film by a PECVD method so as to have a thickness of 100 nm. As for the flow rate of deposition gases in the formation of the silicon oxynitride film, the flow rates of $SiH_4$ and $N_2O$ gases were 5 sccm and 1000 sccm, respectively.

Next, a tungsten film serving as a hard mask material was formed over the silicon oxynitride film by a sputtering method so as to have a thickness of 30 nm.

After that, an organic coating film was applied to the tungsten film serving as a hard mask material, and a resist material is applied thereto. The resist material was subjected to lithography using an electron beam to form a resist mask. The organic coating film and the tungsten film serving as a hard mask material were dry etched using the resist mask, whereby a hard mask (hereinafter, denoted by HM-W in the drawing) was formed. The dry etching was performed using an ICP etching apparatus under the conditions where the flow rates of $Cl_2$ and $CF_4$ were 60 sccm and 40 sccm, respectively; a high-frequency power of 2000 W was applied to a coil-shaped electrode; a high-frequency power of 50 W was applied to an electrode on the substrate side: the pressure was 0.67 Pa; and the process time was 20 seconds. After the dry etching, the resist mask and the organic coating film were removed by ashing.

Then, an organic coating film was applied to the silicon oxynitride film to cover the hard mask, and a resist material is applied thereto. The resist material was subjected to lithography using an electron beam to form a resist mask (hereinafter, denoted by Resist in the drawings). This step corresponds to the step illustrated in FIGS. 1C and 1D described in the above embodiment.

Figure 55A:
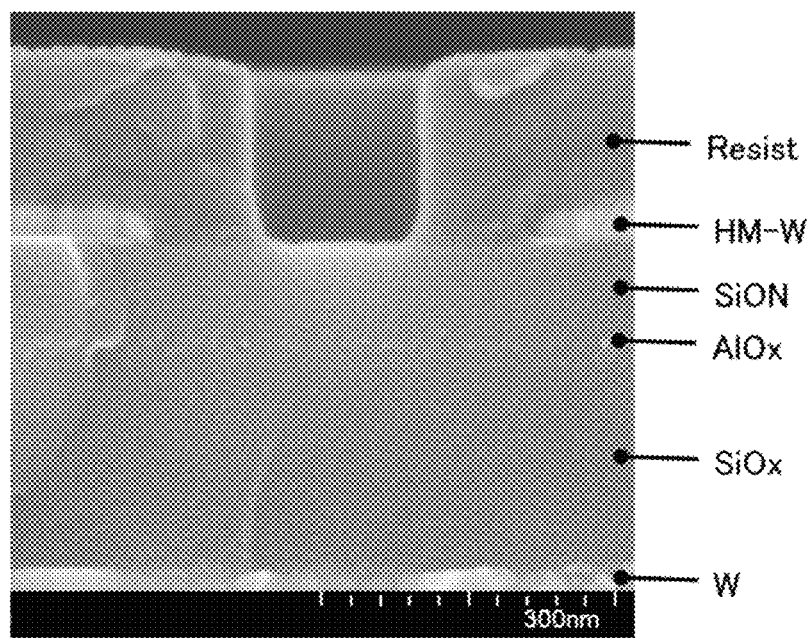
FIGS. 55A and 55B are cross-sectional SEM images in Example 1.

FIG. 55A shows a cross-sectional SEM image (magnified by 150,000 times) at the step. Note that the cross-sectional SEM image was taken by SU8030 produced by Hitachi High-Technologies Corporation. As shown FIG. 55A, an opening of the resist mask is also formed inside an opening of the hard mask in a manner similar to that in FIGS. 1C and 1D.

Next, the silicon oxynitride film was dry etched using the resist mask to form a hole-like opening in the silicon oxynitride film. This step corresponds to the step illustrated in FIGS. 2A and 2B described in the above embodiment.

In the dry etching, a CCP etching apparatus was used, and first etching conditions and second etching conditions were employed in this order. The first etching conditions were as follows: the flow rate of a $CF_4$ gas was 100 sccm, a high-frequency power of 1000 W was applied to the upper electrode, a high-frequency power of 100 W was applied to the lower electrode, the pressure was 6.5 Pa, and the process time was 15 seconds. Etching under the first etching conditions can remove the organic coating film. The second etching conditions were as follow: the flow rates of a $C_4F_6$ gas, an $O_2$ gas, and an Ar gas were 22 sccm, 30 sccm, and 800 sccm, respectively; a high-frequency power of 500 W was applied to the upper electrode; a high-frequency power of 1150 W was applied to the lower electrode; the pressure was 3.3 Pa; and the process time was 25 seconds. Etching under the second etching conditions can remove the silicon oxynitride film.

Figure 55B:
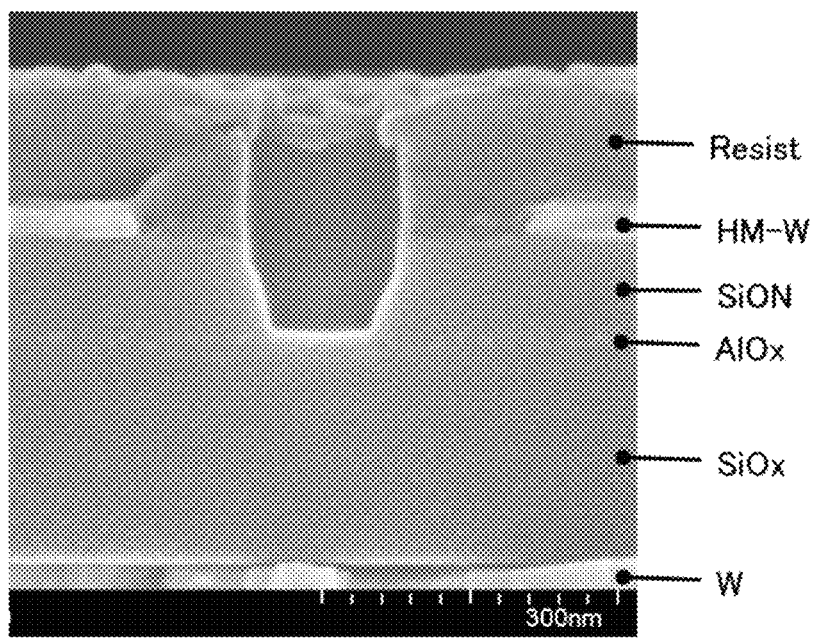

FIG. 55B shows a cross-sectional SEM image (magnified by 150,000 times) at the step. Note that the cross-sectional SEM image was taken by SU8030 produced by Hitachi High-Technologies Corporation. As shown FIG. 55B, an opening is also formed in the silicon oxynitride film in a manner similar to that in FIGS. 2A and 2B.

Next, the aluminum oxide film was dry etched using the resist mask to form a hole-like opening in the aluminum oxide film. This step corresponds to the step illustrated in FIGS. 2C and 2D described in the above embodiment.

In the dry etching, a CCP etching apparatus was used, and third etching conditions were employed. The third etching conditions were as follow: the flow rates of a $CHF_3$ gas and an Ar gas were 50 sccm and 275 sccm, respectively; a high-frequency power of 300 W was applied to the upper electrode; a high-frequency power of 1200 W was applied to the lower electrode; the pressure was 2.6 Pa; and the process time was 30 seconds. Etching under the third etching conditions can remove the aluminum oxide film.

Figure 56A:
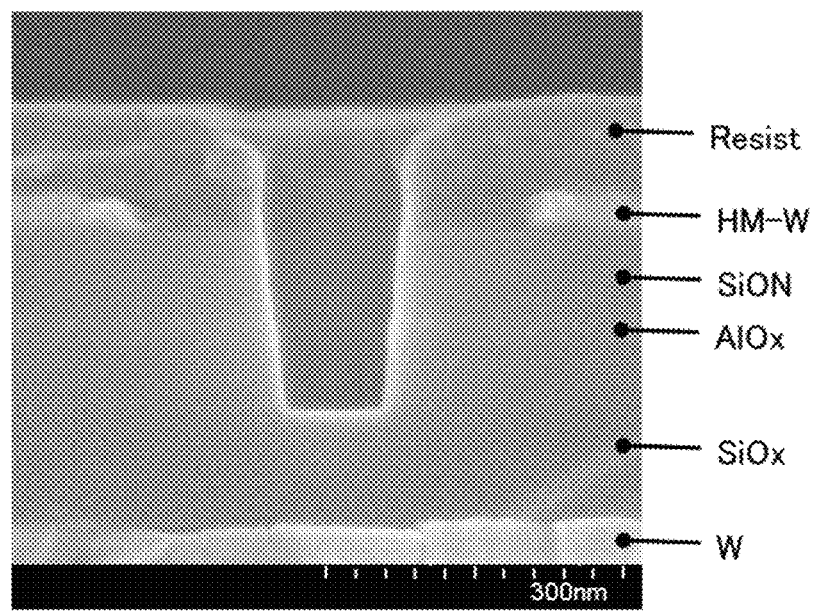
FIGS. 56A and 56B are cross-sectional SEM images in Example 1.

FIG. 56A shows a cross-sectional SEM image (magnified by 150,000 times) at the step. Note that the cross-sectional SEM image was taken by SU8030 produced by Hitachi High-Technologies Corporation. As shown FIG. 56A, an opening is formed in the aluminum oxide film. In addition, the upper part of the silicon oxide film is also etched, resulting in the state shown in FIG. 5A.

Next, the resist mask was removed by ashing. This step corresponds to the step illustrated in FIGS. 3A and 3B described in the above embodiment.

The ashing was performed using a CCP etching apparatus under the conditions where the flow rate of an oxygen gas was 200 sccm, a high-frequency power of 500 W was applied to the upper electrode, a high-frequency power of 100 W was applied to the lower electrode, the pressure was 2.0 Pa, and the process time was 20 seconds.

Figure 56B:
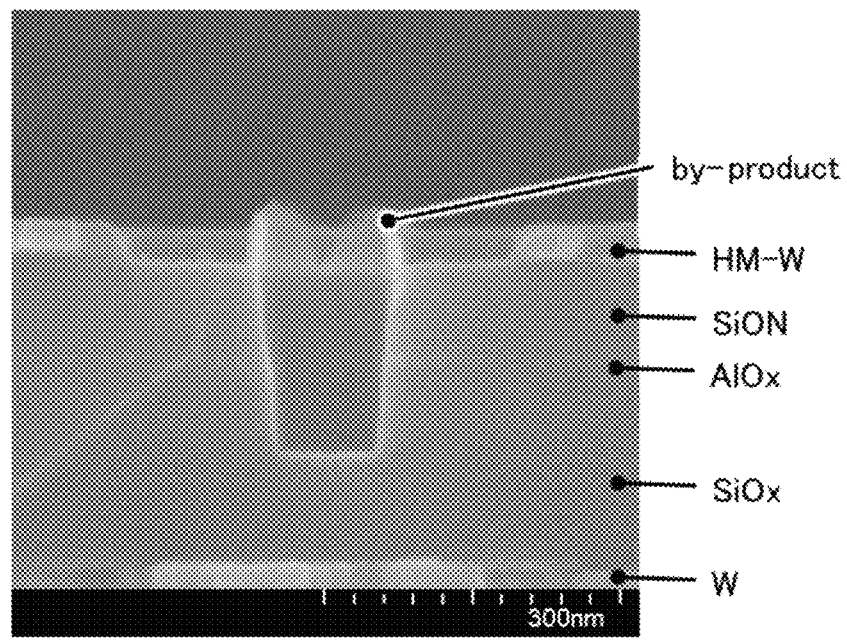

FIG. 56B shows a cross-sectional SEM image (magnified by 150,000 times) at the step. Note that the cross-sectional SEM image was taken by SU8030 produced by Hitachi High-Technologies Corporation. As observed in FIG. 56B, a by-product similar to that illustrated in FIGS. 5B and 5C was formed to surround the edge of the upper part of the opening of the silicon oxynitride film.

Next, the silicon oxynitride film, the aluminum oxide film, and the silicon oxide film were dry etched using the hard mask to form an opening in these stacked films. This step corresponds to the step illustrated in FIGS. 3C and 3D described in the above embodiment.

In the dry etching, a CCP etching apparatus was used, and fourth etching conditions were employed. The fourth etching conditions were as follow: the flow rates of a $C_4F_6$ gas, an $O_2$ gas, and an Ar gas were 22 sccm, 30 sccm, and 800 sccm, respectively; a high-frequency power of 500 W was applied to the upper electrode; a high-frequency power of 1150 W was applied to the lower electrode; the pressure was 3.3 Pa; and the process time was 25 seconds.

Note that after the dry etching was performed under the fourth etching conditions, plasma treatment was performed in an oxygen atmosphere to remove a residue generated by the etching. The plasma treatment was performed using a CCP etching apparatus under the conditions where the flow rate of an oxygen gas was 200 sccm, a high-frequency power of 500 W was applied to the upper electrode, a high-frequency power of 100 W was applied to the lower electrode, the pressure was 2.6 Pa, and the process time was 10 seconds. Note that each of Sample 1A and Sample 1B was successively processed without being exposed to the air during the period from the dry etching under the first etching conditions to the plasma treatment.

Figure 57A:
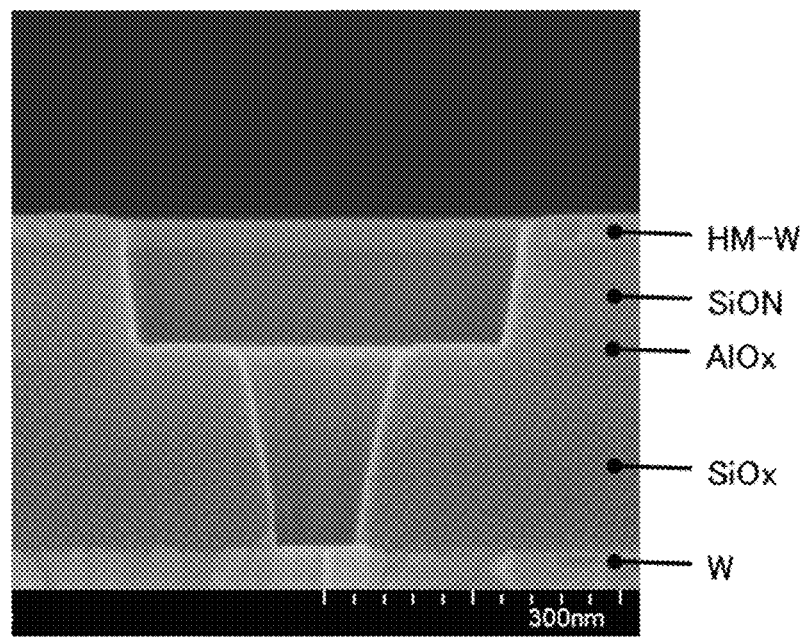
FIGS. 57A and 57B are cross-sectional SEM images in Example 1.
Figure 57B:
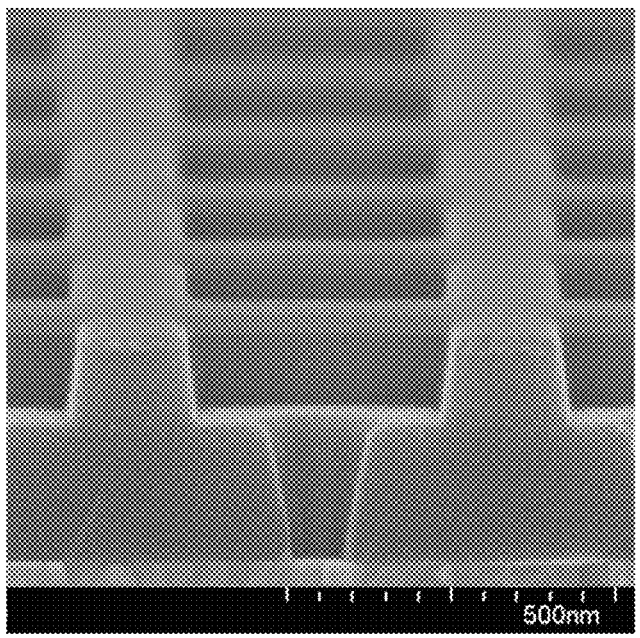

FIGS. 57A and 57B show a cross-sectional SEM image (magnified by 150,000 times) and a bird's eye-view SEM image (magnified by 100,000) at this step, respectively. Note that the cross-sectional SEM images were taken by SU8030 produced by Hitachi High-Technologies Corporation. As shown in FIG. 57A, the inner wall of the opening also had a tapered shape in a manner similar to that of FIGS. 3C and 3D, the by-product observed in FIG. 56B was removed, and an upper part of the edge of the opening was rounded.

Figure 58A:
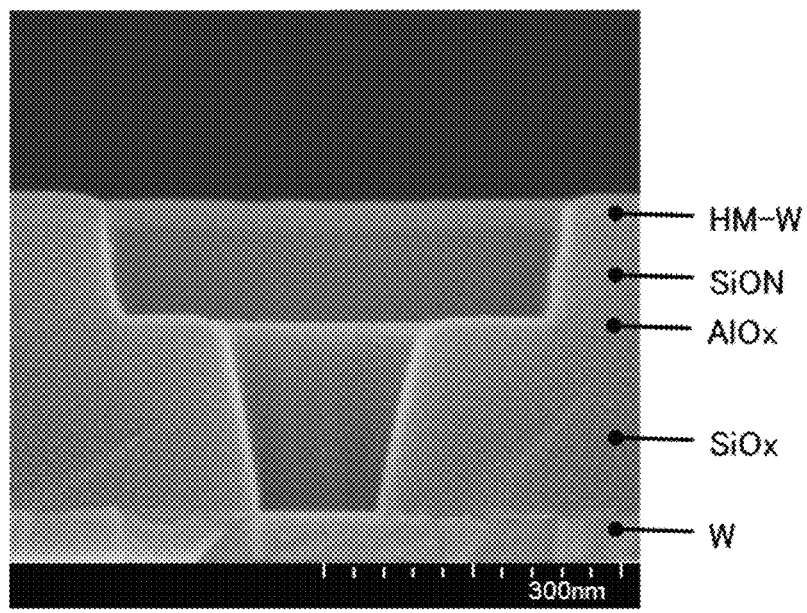
FIGS. 58A and 58B are cross-sectional SEM images in Example 1.
Figure 58B:
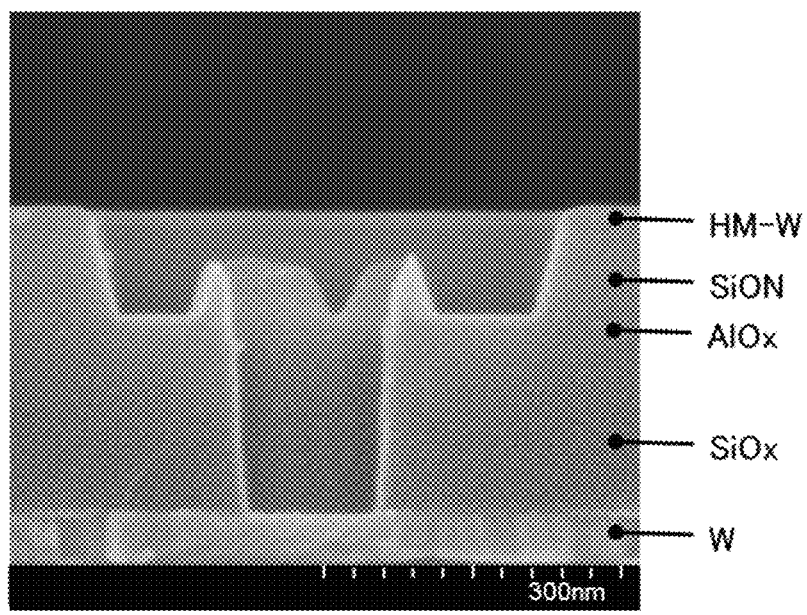

The following description shows comparison between Sample 1C in which the stacked films were processed in the same fabrication process as Sample 1A and Sample 1B, and Sample 1D which was different from Sample 1C only in the fourth etching conditions. FIG. 58A shows a cross-sectional SEM image (magnified by 150,000 times) of Sample 1C, and FIG. 58B shows a cross-sectional SEM image (magnified by 150,000 times) of Sample 1D. Note that the cross-sectional SEM images were taken by SU8030 produced by Hitachi High-Technologies Corporation.

Dry etching for Sample 1D was performed using a CCP etching apparatus under fifth etching conditions, instead of the fourth etching conditions. The fifth etching conditions were as follow: the flow rates of a $C_4F_8$ gas, a $CF_4$ gas, an $O_2$ gas, and an Ar gas were 12 sccm, 56 sccm, 3 sccm, and 75 sccm, respectively; a high-frequency power of 800 W was applied to the upper electrode; a high-frequency power of 150 W was applied to the lower electrode; the pressure was 10.6 Pa; and the process time was 35 seconds.

Here, in Sample 1C shown in FIG. 58A, the inner wall of an opening functioning as a via hole had a tapered shape, and the angle of the inner wall with respect to the tungsten film was approximately 77°. As shown in FIG. 58A, the by-product observed in FIG. 56B was removed, and an upper part of the edge of the opening was rounded.

In contrast, in Sample 1D shown in FIG. 58B, the inner wall of the opening functioning as a via hole was substantially perpendicular to the tungsten film, and the angle of the inner wall with respect to the tungsten film was approximately 88°. In addition, the by-product observed in FIG. 56B remained in FIG. 58B.

Here, in the fourth etching conditions used for Sample 1C, the ratio of the etching rate of $AlO_x$ to the etching rate of $SiO_x$ was 4.3, whereas in the fifth etching conditions used for Sample 1D, the ratio of the etching rate of $AlO_x$ to the etching rate of $SiO_x$ was 8.3.

Accordingly, in order that the inner wall of the opening functioning as a via hole has a tapered shape, and that the by-product formed at the upper part of the edge of the opening is removed, it is presumably preferable that the etching rate of $SiO_x$ not be excessively large with respect to the etching rate of $AlO_x$. For example, the etching rate of $SiO_x$ may be less than or equal to eight times, preferably less than or equal to six times, further preferably less than or equal to four times the etching rate of $AlO_x$.

Next, a tantalum nitride film was formed in the opening formed in the stacked films. Here, the tantalum nitride film was deposited by a sputtering method in Sample 1A and by a collimated sputtering method in Sample 1B.

The formation of the tantalum nitride film in Sample 1A was performed using a tantalum target under the conditions where the flow rates of an argon gas and a nitrogen gas were 50 sccm and 10 sccm, respectively; the power of a DC power source was 1.0 kW; and the pressure was 0.6 Pa.

The formation of the tantalum nitride film in Sample 1B was performed under the conditions where the flow rates of an argon gas and a nitrogen gas were 40 sccm and 10 sccm, respectively; the power of a DC power source was 2.0 kW; and the pressure was 0.7 Pa. A collimator was positioned between the target and the substrate when the film formation was performed for Sample 1B.

Next, a titanium nitride film was formed over the tantalum nitride film by an ALD method to be positioned in the opening in the stacked films. For the formation of the titanium nitride film, the substrate temperature and pressure were set to 412° C. and 667 Pa, respectively; and a cycle of the following steps was repeated: a $TiCl_4$ gas was introduced for 0.05 seconds, purging was performed with $N_2$ for 0.2 second, an $NH_3$ gas was introduced for 0.3 seconds, and purging was performed with $N_2$ for 0.3 seconds. Here, the $TiCl_4$ gas was introduced at a flow rate of 50 sccm, and the $NH_3$ gas was introduced at a flow rate of 2700 sccm. In addition, an $N_2$ gas was introduced at a flow rate of 4500 sccm from a gas pipe positioned close to a gas pipe for supplying the $TiCl_4$ gas, and an $N_2$ gas was introduced at a flow rate of 4000 sccm from a gas pipe positioned close to a gas pipe for supplying the $NH_3$ gas, during the deposition.

Next, a tungsten film was formed over the titanium nitride film by a metal CVD method so as to fill the opening formed in the stacked films. This step corresponds to that illustrated in FIGS. 4A and 4B in the above embodiment. Note that the tantalum nitride film and the titanium nitride film formed in the step correspond to the conductor 20 in FIG. 4A, and the tungsten film in the step corresponds to the conductor 21 in FIG. 4A. The formation of the tungsten film by a metal CVD method was performed by the following three steps.

For the first step, a 3-nm-thick film was deposited by three cycles under the following conditions: the flow rate of a $WF_6$ gas was 160 sccm, the flow rate of an $SiH_4$ gas was 400 sccm, the flow rate of an Ar gas was 6000 sccm, the flow rate of an $N_2$ gas was 2000 sccm, the flow rate of an Ar gas for the rear side of the stage was 4000 sccm, the pressure was 1000 Pa, and the substrate temperature was 390° C.

For the second step, a 41-nm-thick film was deposited in 15 seconds under the following conditions: the flow rate of a $WF_6$ gas was 250 sccm, the flow rates of an $H_2$ gas for two gas lines were 4000 sccm and 1700 sccm, the flow rate of an Ar gas was 2000 sccm, the flow rate of an $N_2$ gas was 2000 sccm, the flow rate of an Ar gas for the rear side of the stage was 4000 sccm, the pressure was 10666 Pa, and the substrate temperature was 390° C.

For the third step, a film was deposited so as to have a thickness of 250 nm, under the following conditions: the flow rate of a $WF_6$ gas was 250 sccm, the flow rates of an $H_2$ gas for two gas lines were 2200 sccm and 1700 sccm, the flow rate of an Ar gas was 2000 sccm, the flow rate of an $N_2$ gas was 200 sccm, the flow rate of an Ar gas for the rear side of the stage was 4000 sccm, the pressure was 10666 Pa, and the substrate temperature was 390° C.

Next, CMP treatment was performed to remove an upper part of the silicon oxynitride film, an upper part of the tantalum nitride film, an upper part of the titanium nitride film, an upper part of the tungsten film, and the hard mask. This step corresponds to the step illustrated in FIGS. 4C and 4D described in the above embodiment.

Figure 59:
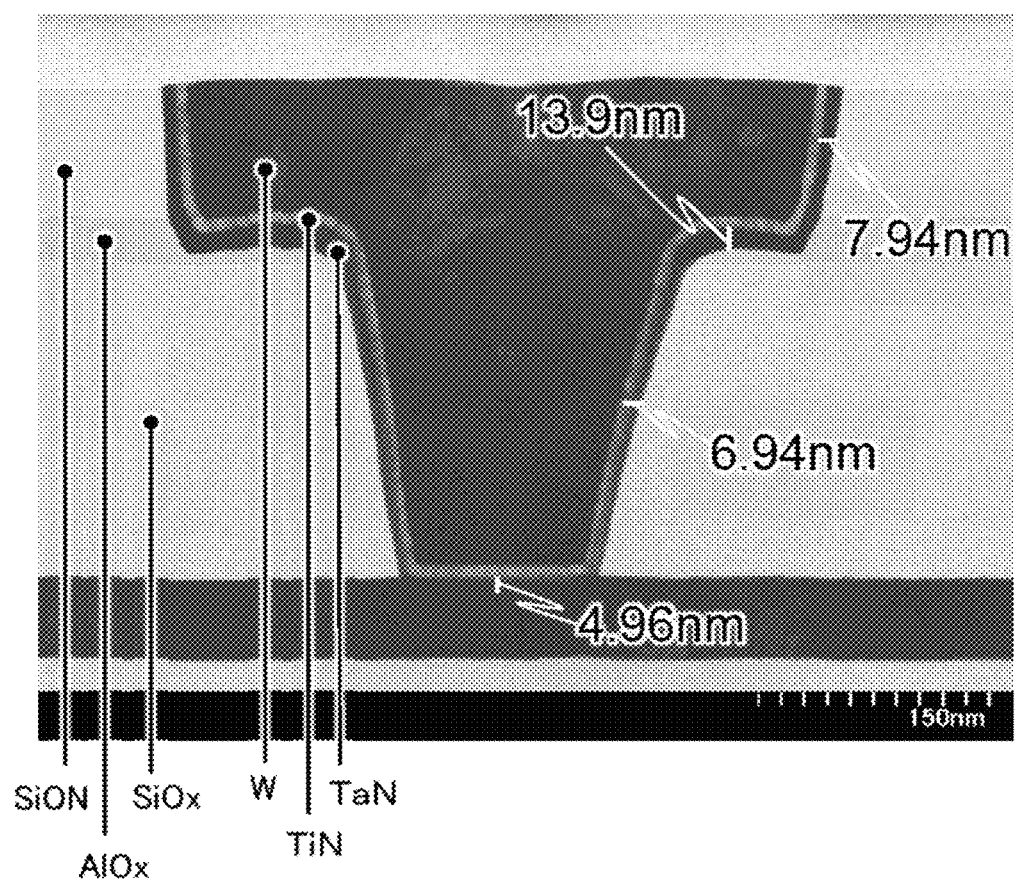
FIG. 59 is a cross-sectional STEM image in Example 1.
Figure 60:
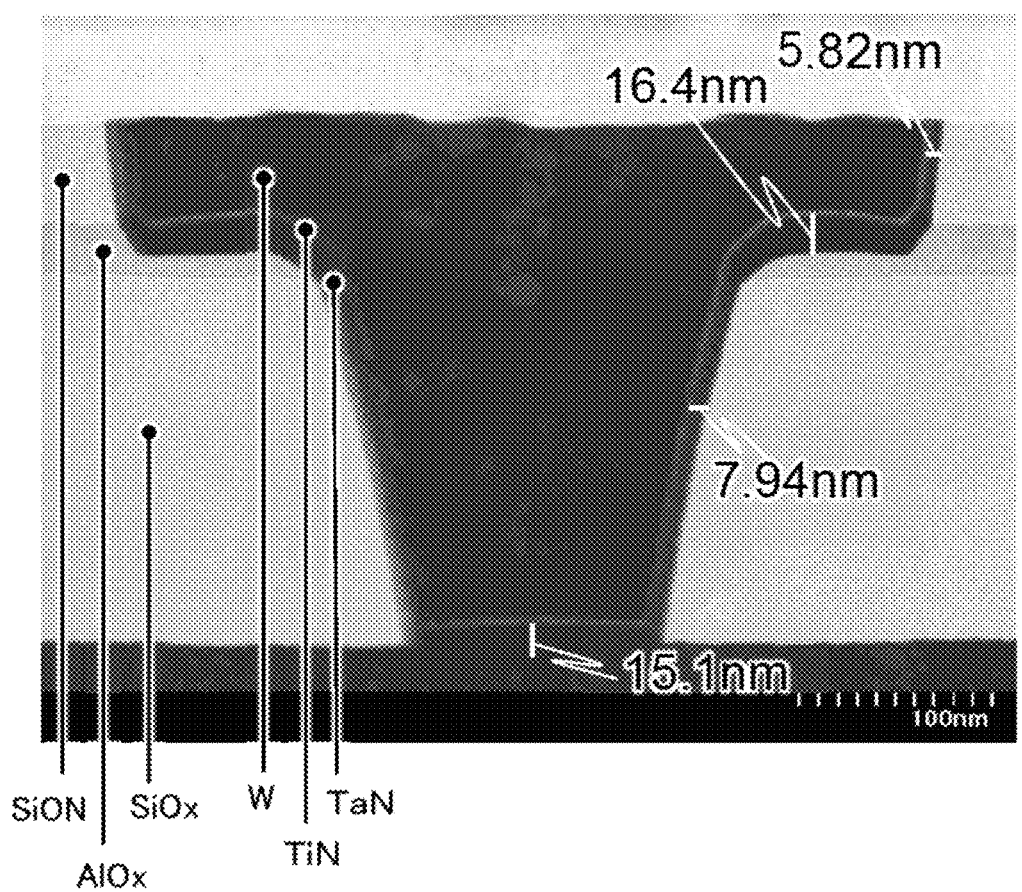
FIG. 60 is a cross-sectional STEM image in Example 1.

FIG. 59 shows a cross-sectional STEM image (magnified by 200,000 times) of Sample 1A at this step. FIG. 60 shows a cross-sectional STEM image (magnified by 250,000 times) of Sample 1B. Note that the cross-sectional STEM image was taken by HD2300 produced by Hitachi High-Technologies Corporation. FIG. 59 and FIG. 60 show the thicknesses of the tantalum nitride film on the bottom and side surfaces of a lower part of the opening which functions as a via hole, and the thicknesses of the tantalum nitride film on the bottom and side surfaces of an upper part of the opening which functions as a groove for a wiring pattern.

As shown in FIG. 59 and FIG. 60, the stacked films, i.e., the tantalum nitride film, the titanium nitride film, and the tungsten film, are formed with good coverage in the opening. In particular, there is no space between the tantalum nitride film having a high blocking property against hydrogen and each of the silicon oxide film, the aluminum oxide film, and the silicon oxynitride film. This is probably influenced by the tapered shape of the inner wall of the opening and the rounded shape of the upper part of the edge of the opening.

When the plug is provided to penetrate the aluminum oxide film having a high blocking property against hydrogen and water in this manner, the via hole formed in the aluminum oxide film can be sealed up with the tantalum nitride forming the plug. Accordingly, the upper layers and the lower layers are separated by the tantalum nitride film and the aluminum oxide film having a high blocking property against hydrogen and water, which can prevent hydrogen and water included in the lower part from diffusing into the upper layers through the plug or the via hole in which the plug is formed. Therefore, in the semiconductor device in which the transistor including an oxide semiconductor is provided over the semiconductor substrate as in the above embodiment, the oxide semiconductor can be a highly purified intrinsic or substantially highly purified intrinsic oxide semiconductor; as a result, the semiconductor device with the transistor having stable electrical characteristics can be obtained.

In addition, it is found from comparison between Sample 1A in FIG. 59 and Sample 1B in FIG. 60 that the thickness of the tantalum nitride film on the bottom surface of the lower part of the opening that functions as a via hole in Sample 1B is approximately three times as large as that in Sample 1A. This result verified that a collimated sputtering method made it possible to form the tantalum nitride film with a larger thickness in the lower part of the opening that had a high aspect ratio and functioned as via hole. In this manner, when the tantalum nitride film with a large thickness is also formed on the bottom part of the opening, diffusion of hydrogen from the lower layers to the upper layers can be further inhibited.

The structure described in this example can be combined as appropriate with any of the structures described in another example and the above embodiments.

Example 2

In this example, Samples 2A to 2R were fabricated and subjected to TDS measurement and sheet-resistance measurement.

<1. Structures of Samples>

FIGS. 61A and 61B illustrate structures of the samples. FIGS. 61A and 61B are cross-sectional views illustrating the structures of the samples in Examples.

Samples 2A to 2Q each include a substrate 6001, an insulator 6002 over the substrate 6001, an insulator 6003 over the insulator 6002, and a conductor 6004 over the insulator 6003, as illustrated in FIG. 61A. Sample 2R includes the substrate 6001, the insulator 6002 over the substrate 6001, and the insulator 6003 over the insulator 6002, as illustrated in FIG. 61B.

<2. Method for Fabricating Samples>

Next, methods for fabricating the samples are described.

First, a silicon wafer was used as the substrate 6001, and a thermal oxide film was formed as the insulator 6002 thereover. The insulator 6002 was formed to a thickness of 100 nm at 950° C. in an oxygen atmosphere containing HCl at 3 vol %.

Next, a 280-nm-thick silicon oxynitride film was formed as the insulator 6003 over the insulator 6002 by a plasma CVD method. As the deposition gases, silane ($CF_4$) at a flow rate of 40 sccm, monoxide dinitrogen ($N_2O$) at a flow rate of 800 sccm, ammonia ($NH_4$) at a flow rate of 300 sccm, and hydrogen ($H_2$) at a flow rate of 900 sccm were used. In addition, the pressure of a reaction chamber was 160 Pa, the substrate temperature was 325° C., and a high-frequency (RF) power of 250 W was applied during the deposition.

Then, the conductor 6004 was formed over the insulator 6003 in each of Samples 2A to 2Q by a sputtering method. Note that Sample 2R, in which the conductor 6004 was not provided, was used as a reference example. Tantalum nitride was formed as the conductor 6004 in each of Samples 2A to 2Q under conditions shown in Table 1. Note that, in all the deposition conditions, the pressure during deposition was 0.7 Pa, and the distance between the target and the substrate was 60 mm.

TABLE 1

| | Deposition conditions of conductor 6004 | | | |
|---|---|---|---|---|
| Sample name | Thickness [nm] | Gas flow rate [sccm] | Power (DC) [kW] | Substrate temperature [° C.] |
| Sample 2A | 20 | $N_2$ = 10, Ar = 40 | 2.0 | 200 |
| Sample 2B | 20 | $N_2$ = 20, Ar = 30 | 2.0 | 200 |
| Sample 2C | 20 | $N_2$ = 25, Ar = 25 | 2.0 | 200 |
| Sample 2D | 20 | $N_2$ = 10, Ar = 40 | 4.0 | 200 |
| Sample 2E | 20 | $N_2$ = 20, Ar = 30 | 4.0 | 200 |
| Sample 2F | 20 | $N_2$ = 25, Ar = 25 | 4.0 | 200 |
| Sample 2G | 20 | $N_2$ = 25, Ar = 25 | 4.0 | R.T |
| Sample 2H | 20 | $N_2$ = 25, Ar = 25 | 4.0 | 300 |
| Sample 2J | 20 | $N_2$ = 25, Ar = 25 | 4.0 | 400 |
| Sample 2K | 40 | $N_2$ = 25, Ar = 25 | 4.0 | 200 |
| Sample 2L | 40 | $N_2$ = 25, Ar = 25 | 4.0 | 300 |
| Sample 2M | 40 | $N_2$ = 25, Ar = 25 | 4.0 | 400 |
| Sample 2N | 20 | $N_2$ = 20, Ar = 30 | 4.0 | R.T |
| Sample 2P | 20 | $N_2$ = 20, Ar = 30 | 4.0 | 300 |
| Sample 2Q | 20 | $N_2$ = 20, Ar = 30 | 4.0 | 400 |
| Sample 2R | — | — | — | — |

Through the above process, Samples 2A to 2R of this example were fabricated.

<3. TDS Measurement Results of Samples>

Figure 62:
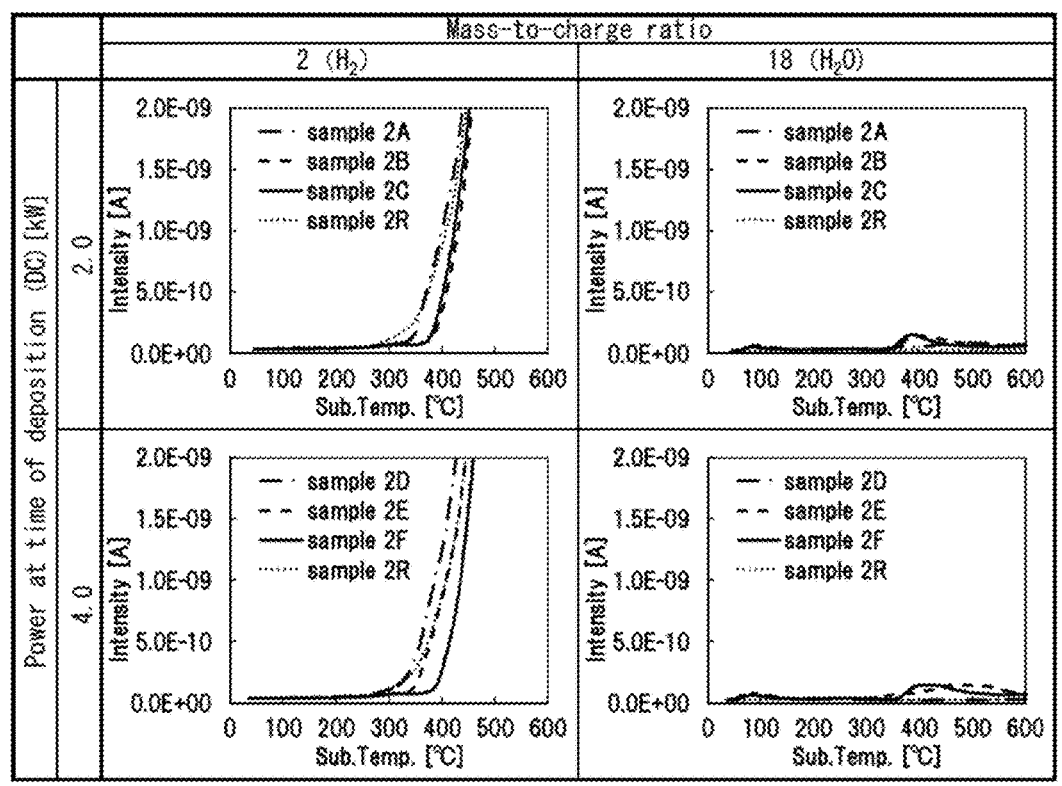
FIG. 62 shows TDS measurement results in Example 2.

FIG. 62 shows TDS measurement results of Samples 2A to 2C in each of which the conductor 6004 was formed at a deposition power (DC) of 2.0 kW, and Samples 2D to 2F and 2R in each of which the conductor 6004 was formed at a deposition power (DC) of 4.0 kW. Note that the gas flow rate during the deposition of Samples 2A to 2C was different from that of Samples 2D to 2F. The temperature range for TDS was from 50° C. to 600° C. The released amount of gases with a mass-to-charge ratio of 2 and 18, i.e., gases corresponding to hydrogen molecules ($H_2$) and water molecules ($H_2O$), were measured by TDS.

FIG. 62 indicates that when the conductor 6004 was provided, the conductor 6004 prevented diffusion of hydrogen from the layers below. In addition, the results show that the barrier property against hydrogen becomes high as the proportion of a nitrogen ($N_2$) gas in the deposition gas for depositing the conductor 6004 was increased. Furthermore, the results of Samples 2C and 2F show that in the case where a mixed gas of a nitrogen ($N_2$) gas at a flow rate of 25 sccm and an argon gas at a flow rate of 25 sccm was used as the deposition gas, and the power during the deposition was high, the barrier property against hydrogen was increased.

Figure 63:
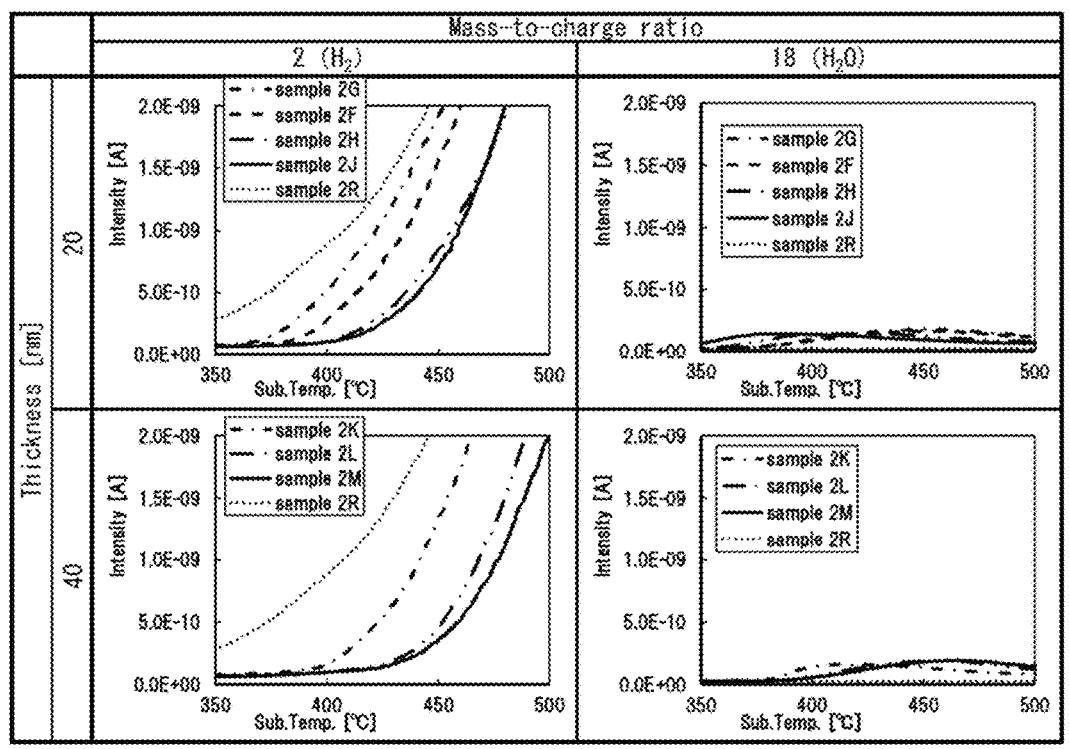
FIG. 63 shows TDS measurement results in Example 2.

FIG. 63 shows TDS measurement results of Samples 2F to 2J in each of which the thickness of the conductor 6004 was 20 nm, and Samples 2K to 2M and 2R in each of which the thickness of the conductor 6004 was 40 nm. Note that the substrate temperature during the deposition of Samples 2F to 2J was different from that of Samples 2K to 2M. The temperature range for TDS was from 50° C. to 500° C. The released amount of gases with a mass-to-charge ratio of 2 and 18, i.e., gases corresponding to hydrogen molecules ($H_2$) and water molecules ($H_2O$), were measured by TDS.

FIG. 63 indicates that formation of the conductor 6004 prevented diffusion of hydrogen from the layers below. In addition, the results show that the barrier property against hydrogen was high when the substrate temperature during the deposition of the conductor 6004 was high. In particular, hydrogen began to diffuse at a substrate temperature of approximately 350° C. to 410° C., or approximately 370° C. to 400° C. in TDS measurement. Furthermore, as the thickness of the conductor 6004 was increased, the barrier property against hydrogen was increased.

<4. Measurement Results of Sheet Resistances of Samples>

Figure 64A:
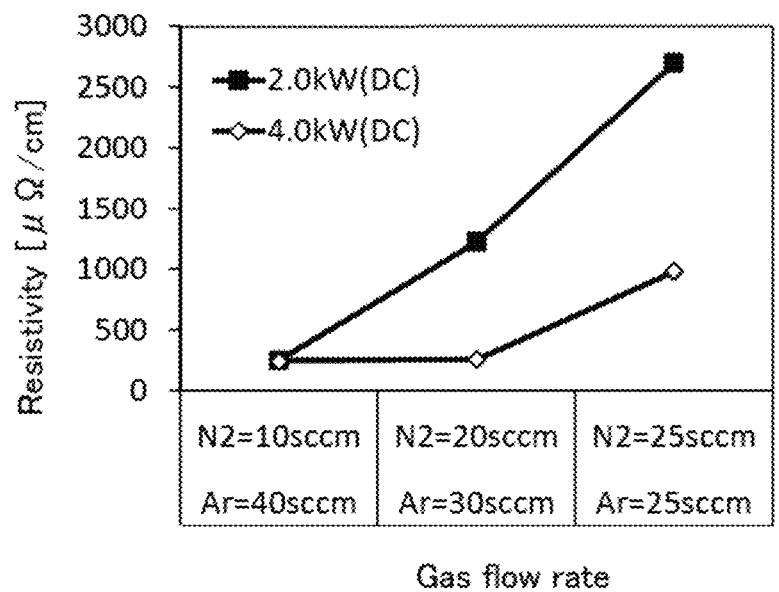
FIGS. 64A and 64B are graphs showing measurement results of sheet resistance in Example 2.

FIG. 64A shows measurement results of the sheet resistances of Samples 2A to 2C that were fabricated at a deposition power (DC) of 2.0 kW, and those of Samples 2D to 2F that were fabricated at a deposition power (DC) of 4.0 kW.

The results shown in FIG. 64A indicate that as the proportion of a nitrogen ($N_2$) gas was high during deposition of the conductor 6004, the resistance increased, and that the resistance was likely to increase when the power (DC) during deposition of the conductor 6004 was low.

Figure 64B:
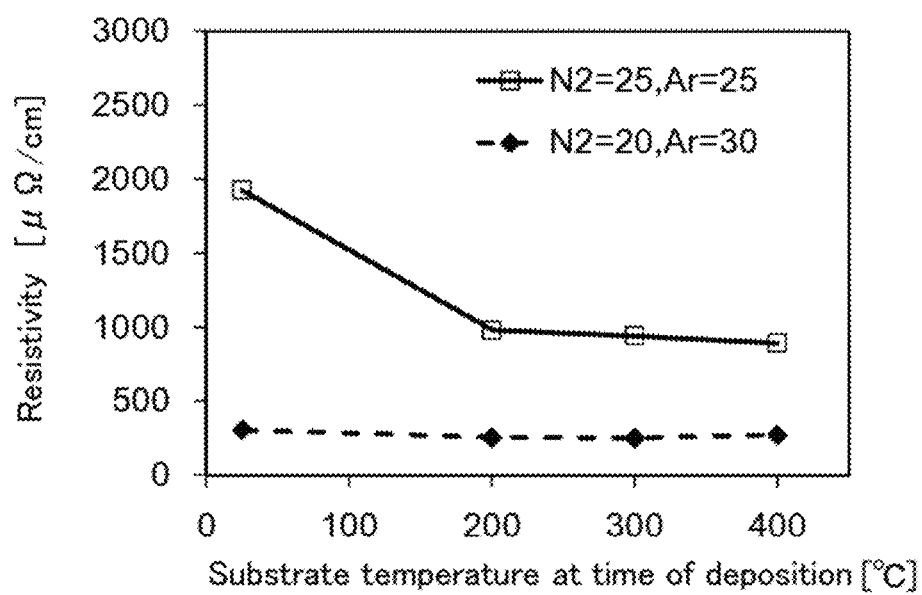

FIG. 64B shows the measurement results of sheet resistances of Samples 2F to 2J, which were fabricated using a mixed gas of a nitrogen ($N_2$) gas at a flow rate of 25 sccm and an argon gas at a flow rate of 25 sccm, respectively, as the deposition gases; and Samples 2E and 2N to 2Q, which were fabricated using a mixed gas of a nitrogen ($N_2$) gas at a flow rate of 20 sccm and an argon gas at a flow rate of 30 sccm, respectively, as the deposition gases. Note that the substrate temperature during the deposition of Samples 2A to 2C was different from that of Samples 2D to 2F.

The results shown in FIG. 64B indicate that as the substrate temperature during the deposition of the conductor 6004 was low, the resistance increased. In addition, as the proportion of a nitrogen ($N_2$) gas during the deposition of the conductor 6004 was large, the resistance was more likely to increase.

The structure described in this example can be combined as appropriate with any of the structures described in another example and the above embodiments.

This application is based on Japanese Patent Application serial no. 2015-213152 filed with Japan Patent Office on Oct. 29, 2015, the entire contents of which are hereby incorporated by reference.

What is claimed is:

1. A semiconductor device comprising:
a first insulator;
a second insulator over the first insulator;
a third insulator over the second insulator; and
a plug comprising a first conductor and a second conductor;
wherein the first insulator and the second insulator have a first opening,
wherein the third insulator has a second opening that extends through the third insulator between an upper surface of the third insulator and a lower surface of the third insulator,
wherein a width of the second opening is larger than a width of the first opening,
wherein the plug is embedded in the first opening and the second opening,
wherein the first conductor is in contact with the first to third insulators,
wherein the second conductor is in contact with the first conductor,
wherein the second insulator is less permeable to hydrogen than the first insulator, and
wherein the first conductor is less permeable to hydrogen than the second conductor.

2. The semiconductor device according to claim 1, wherein the first conductor comprises tantalum and nitrogen.

3. The semiconductor device according to claim 1, wherein the second insulator comprises aluminum and oxygen.

4. A semiconductor device comprising:
a semiconductor substrate;
a first insulator over the semiconductor substrate;
a second insulator over the first insulator;
a third insulator over the second insulator;
a plug comprising a first conductor and a second conductor; and
an oxide semiconductor over the third insulator,
wherein the first insulator and the second insulator have a first opening,
wherein the third insulator has a second opening that extends through the third insulator between an upper surface of the third insulator and a lower surface of the third insulator,
wherein a width of the second opening is larger than a width of the first opening,
wherein a top surface of the third insulator and a top surface of the plug are coplanar,
wherein a first transistor is formed in the semiconductor substrate,
wherein the first transistor is electrically connected to the plug,
wherein the first conductor is in contact with the first to third insulators,
wherein the second conductor is in contact with the first conductor,
wherein a second transistor is provided to include the oxide semiconductor,
wherein the second insulator is less permeable to hydrogen than the first insulator, and
wherein the first conductor is less permeable to hydrogen than the second conductor.

5. The semiconductor device according to claim 4, wherein the first conductor comprises tantalum and nitrogen.

6. The semiconductor device according to claim 4, wherein the second insulator comprises aluminum and oxygen.

7. The semiconductor device according to claim 4,
wherein the oxide semiconductor comprises indium, an element M, zinc, and oxygen, and
wherein the element M is Ti, Ga, Y, Zr, La, Ce, Nd, Sn, or Hf.

8. The semiconductor device according to claim 4, wherein the semiconductor substrate comprises silicon.

* * * * *